(12) United States Patent
Lai et al.

(10) Patent No.: US 12,230,670 B2
(45) Date of Patent: Feb. 18, 2025

(54) STACKED CAPACITOR STRUCTURE AND MANUFACTURING METHOD THEREOF

(71) Applicant: TAIWAN SEMICONDUCTOR MANUFACTURING COMPANY, LTD., Hsinchu (TW)

(72) Inventors: Hsin-Yu Lai, Hsinchu (TW); Katherine H. Chiang, Hsinchu (TW)

(73) Assignee: TAIWAN SEMICONDUCTOR MANUFACTURING COMPANY, LTD., Hsinchu (TW)

(\*) Notice: Subject to any disclaimer, the term of this patent is extended or adjusted under 35 U.S.C. 154(b) by 764 days.

(21) Appl. No.: 17/471,703

(22) Filed: Sep. 10, 2021

(65) Prior Publication Data

US 2022/0359645 A1 Nov. 10, 2022

Related U.S. Application Data

(60) Provisional application No. 63/184,933, filed on May 6, 2021.

(51) Int. Cl.
| | |
|---|---|
| *H01L 21/768* | (2006.01) |
| *H01G 4/30* | (2006.01) |
| *H01L 23/522* | (2006.01) |
| *H01L 49/02* | (2006.01) |

(52) U.S. Cl.
CPC ............ *H01L 28/91* (2013.01); *H01G 4/30* (2013.01); *H01L 21/76832* (2013.01); *H01L 21/76877* (2013.01); *H01L 23/5226* (2013.01)

(58) Field of Classification Search
CPC ......... H01L 28/90; H01L 28/91; H01L 28/40; H01L 21/76832; H01L 21/76877; H01L 23/5226; H01G 4/30; H01G 4/228; H01G 4/33; H10B 12/03; H10B 12/033
See application file for complete search history.

(56) References Cited

U.S. PATENT DOCUMENTS

| | | | |
|---|---|---|---|
| 2017/0271436 A1* | 9/2017 | Tsui ................... | H01L 28/00 |
| 2023/0163163 A1* | 5/2023 | Chen ................... | H01L 28/75 |
| | | | 257/532 |

\* cited by examiner

*Primary Examiner* — Dale E Page
*Assistant Examiner* — Quovaunda Jefferson
(74) *Attorney, Agent, or Firm* — Birch, Stewart, Kolasch & Birch, LLP

(57) ABSTRACT

A method for manufacturing a stacked capacitor structure includes: forming a first patterned structure over a substrate; forming a first bottom electrode over the first patterned structure; depositing a first dielectric film over the first bottom electrode; depositing a first top electrode layer over the first dielectric film; forming a first vertical interconnect structure; forming a second patterned structure over the first top electrode layer; forming a second bottom electrode over the second patterned structure and electrically connected to the first bottom electrode through the first vertical interconnect structure; depositing a second dielectric film over the second bottom electrode; depositing a second top electrode layer over the second dielectric film; and forming a second vertical interconnect structure extending from the first top electrode layer. The second top electrode layer is electrically connected to the first top electrode layer through the second vertical interconnect structure.

20 Claims, 41 Drawing Sheets

STACKED CAPACITOR STRUCTURE AND MANUFACTURING METHOD THEREOF

REFERENCE TO RELATED APPLICATION

This application claims priority of U.S. Provisional Application No. 63/184,933 filed on May 6, 2021, the contents of which is incorporated herein by reference in its entirety.

BACKGROUND

Memory devices, for example, but not limited to, dynamic random access memory (DRAM) devices, are used widely in electronics industry for storing data, and more particularly used for storing data in binary form as charge on a storage capacitor. The memory device is formed on a semiconductor substrate, and then the semiconductor substrate is diced to form memory chips. Each of the memory chips consists in part of an array of individual memory cells that store binary data as electrical charge on storage capacitors.

A capacitor area is limited to a memory cell size. As a minimum feature size of a memory cell is increasingly reduced, an aspect ratio of a height to a width of the capacitor is dramatically increased, such that an aspect ratio of a height to a width of a freestanding bottom electrode for the capacitor is also dramatically increased. Therefore, the freestanding bottom electrode is prone to being damaged during subsequent processes for manufacturing the capacitor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 29 to 43 illustrate schematic views showing intermediate stages of the method depicted in FIG. 28.

DETAILED DESCRIPTION

Figure 1:
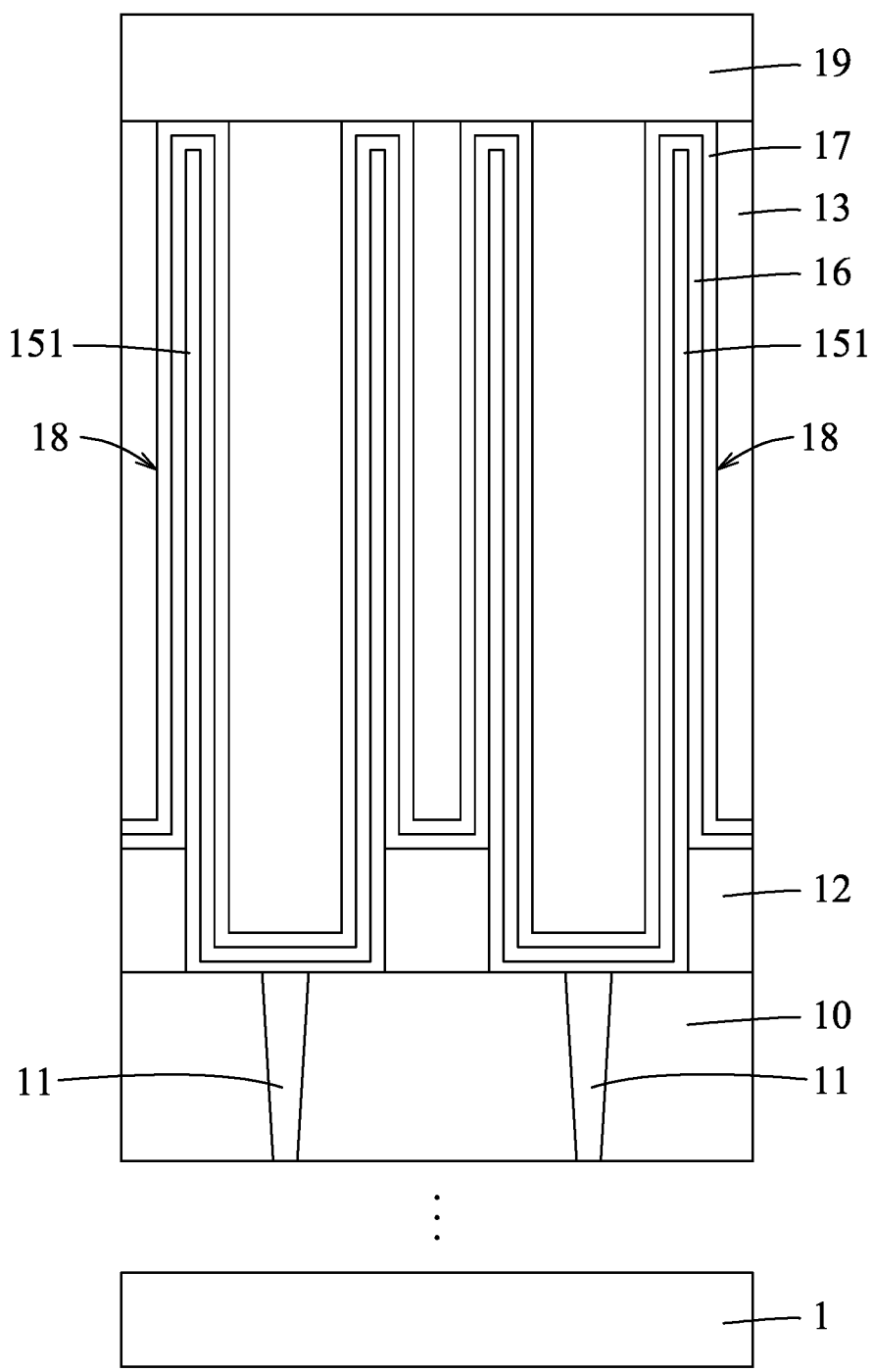
FIG. 1 illustrate a schematic view of a capacitor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "below," "bottom," "top," "downwardly", "upwardly," "vertically," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1, a method for manufacturing a capacitor structure of a memory device (for example, but not limited to, a DRAM device) in accordance with some embodiments includes: sequentially depositing an etch stop layer 12 and a dielectric layer 13 (a layer of a dielectric material, such as silicon oxide, silicon nitride, or silicon oxynitride) on an interlayer dielectric (ILD) layer 10, which is disposed over a substrate 1 and formed with via contacts 11 therein; patterning the dielectric layer 13 and the etch stop layer 12 through pattern openings of a patterned photoresist layer (not shown) by a dry etch process to form trenches (not shown) penetrating through the dielectric layer 13 and the etch stop layer 12 so as to expose the via contacts 11 through the trenches, respectively; conformally depositing a bottom electrode layer (not shown) to cover the ILD layer 10, the etch stop layer 12, and the dielectric layer 13, and to electrically connect the via contacts 11; filling the trenches with the dielectric material to reform the dielectric layer 13; removing excess of the dielectric material and top portions of the bottom electrode layer by a planarization technique, such as chemical mechanical planarization (CMP) to form a plurality of bottom electrodes 151 spaced apart from each other; removing the dielectric layer 13 by a wet etch process; conformally depositing a dielectric film 16 to cover the bottom electrodes 151 and the etch stop layer 12; conformally depositing a top electrode layer 17 on the dielectric film 16 to form a plurality of capacitors 18; depositing the dielectric material to reform the dielectric layer 13 covering the top electrode layer 17; removing excess of the dielectric material by the planarization technique, such as CMP to expose top portions of the top electrode layer 17; and forming a top plate 19 on the top portions of the top electrode layer 17 to physically and electrically connect the top electrode layer 17. The substrate 1 may be a semiconductor substrate and may include various active regions, for example, the active regions configured for an N-type metal oxide semiconductor transistor device (NMOS) or the active regions configured for a P-type metal oxide semiconductor transistor device (PMOS). A metal wiring layer (not shown) may be disposed between the ILD layer and the substrate 1.

After the dielectric layer 13 is removed by the wet etch process to form the bottom electrodes 151, each of the bottom electrodes 151 is configured as a free-standing structure with only a minor support by the etch stop layer 12 at a bottom portion of each of the bottom electrodes 151, such that the bottom electrodes 151 are prone to being damaged during subsequent processes for manufacturing the capacitor structure. For example, the bottom electrodes 151 may be deformed, collapsed, necked, leaned, or peeled due to metal film stress produced during the subsequent processes for manufacturing the capacitor structure. Therefore, the aspect ratio of the capacitors 18 is limited to a range of up to 7.

Figure 2A:
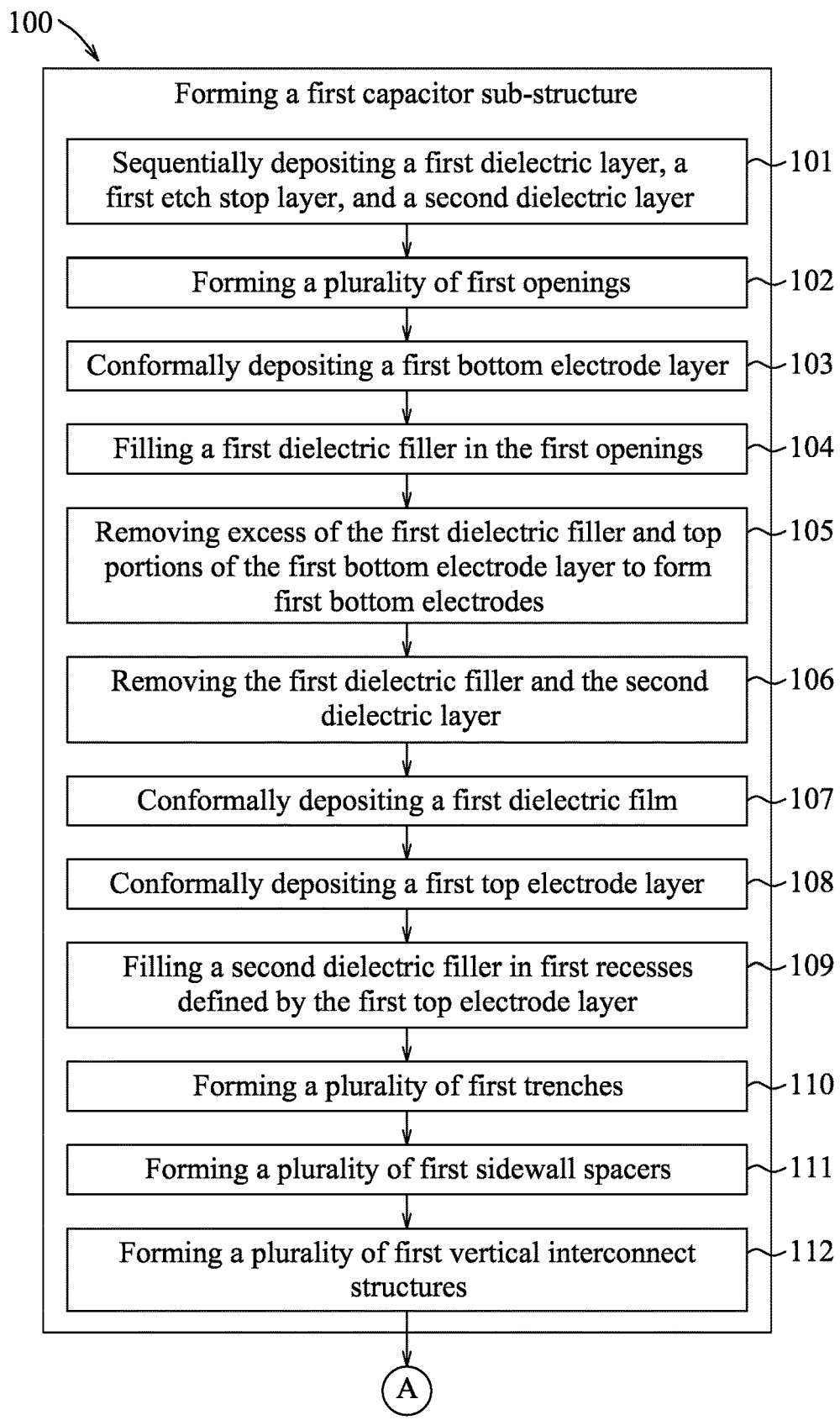
FIGS. 2A and 2B are flow diagrams illustrating a method for manufacturing a stacked capacitor structure in accordance with some embodiments.
Figure 2B:
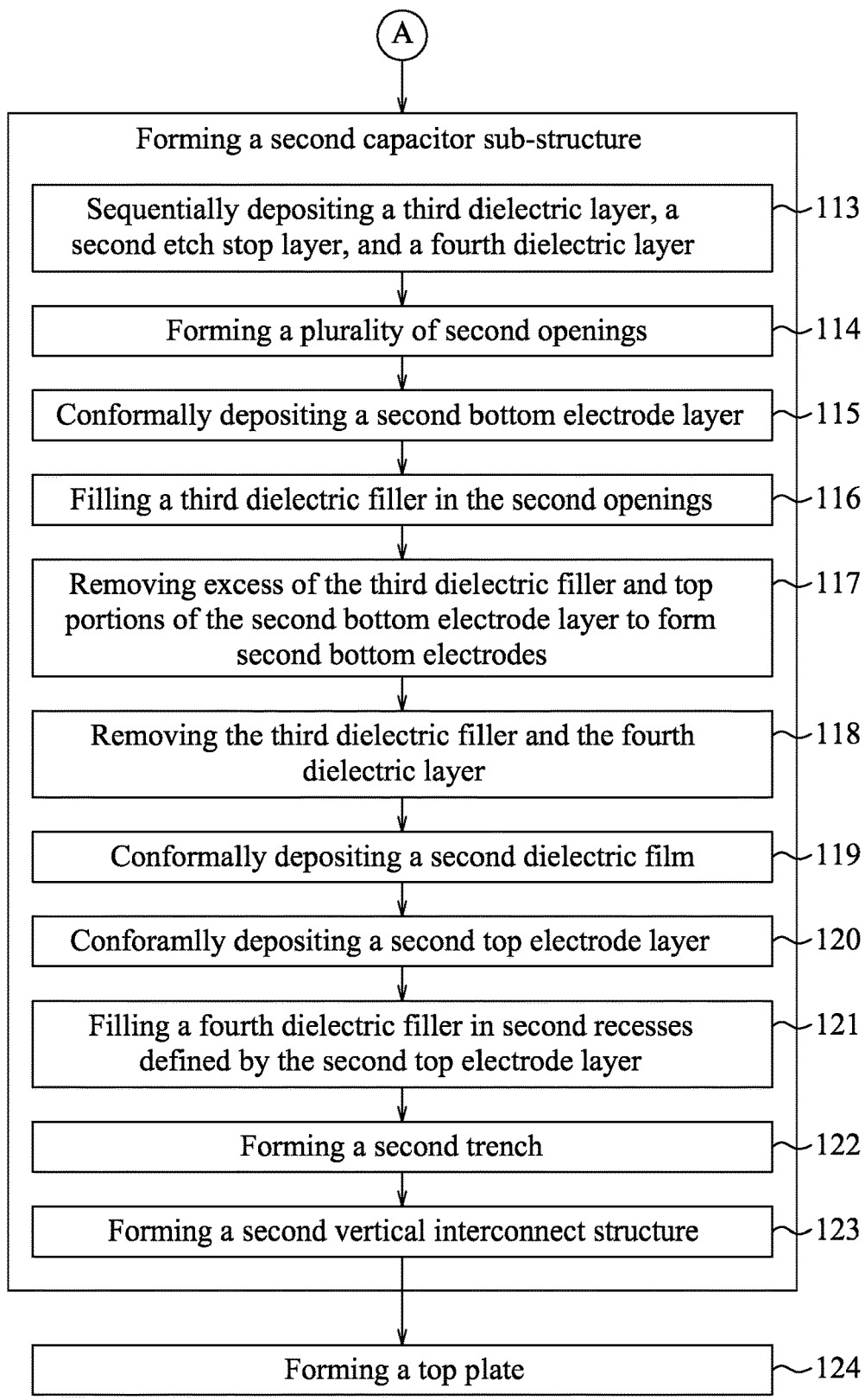
Figure 3:
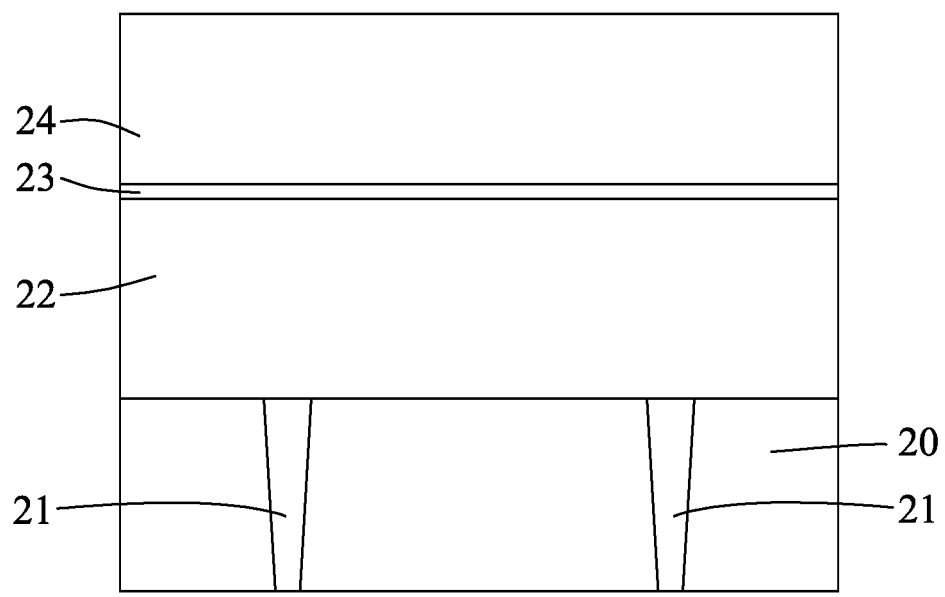
FIGS. 3 to 27 illustrate schematic views showing intermediate stages of the method depicted in FIGS. 2A and 2B.
Figure 4:
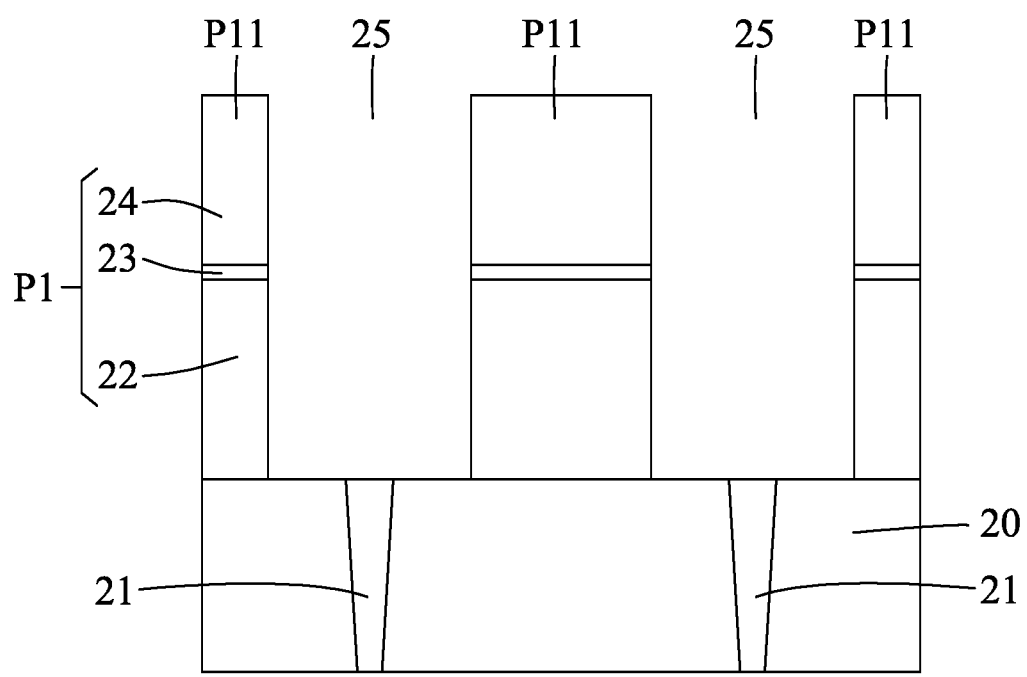
Figure 5:
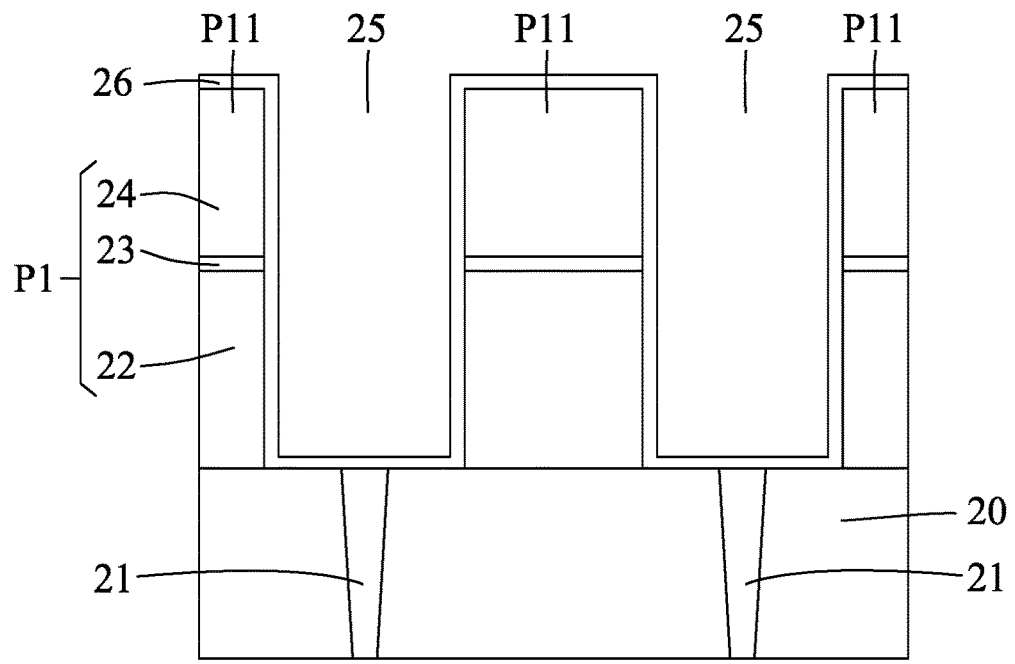
Figure 6:
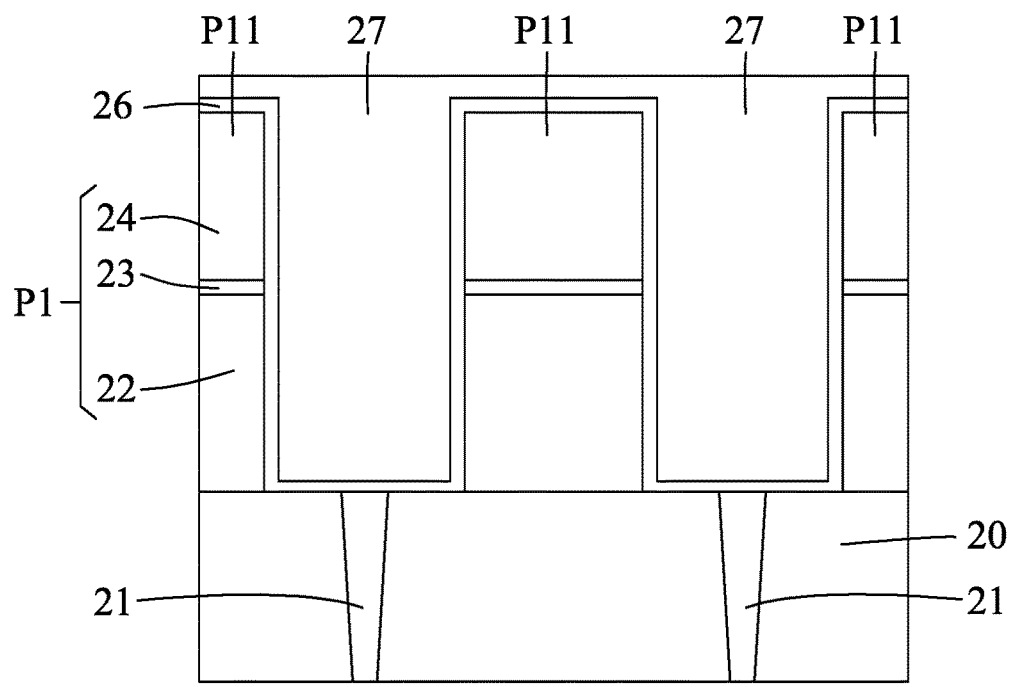
Figure 7:
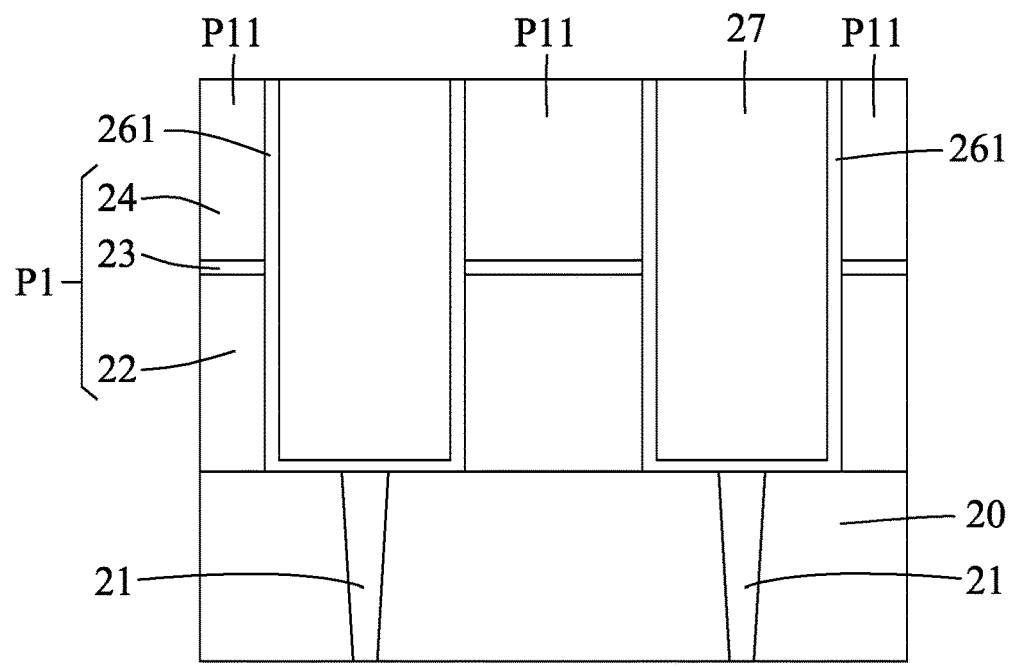
Figure 8:
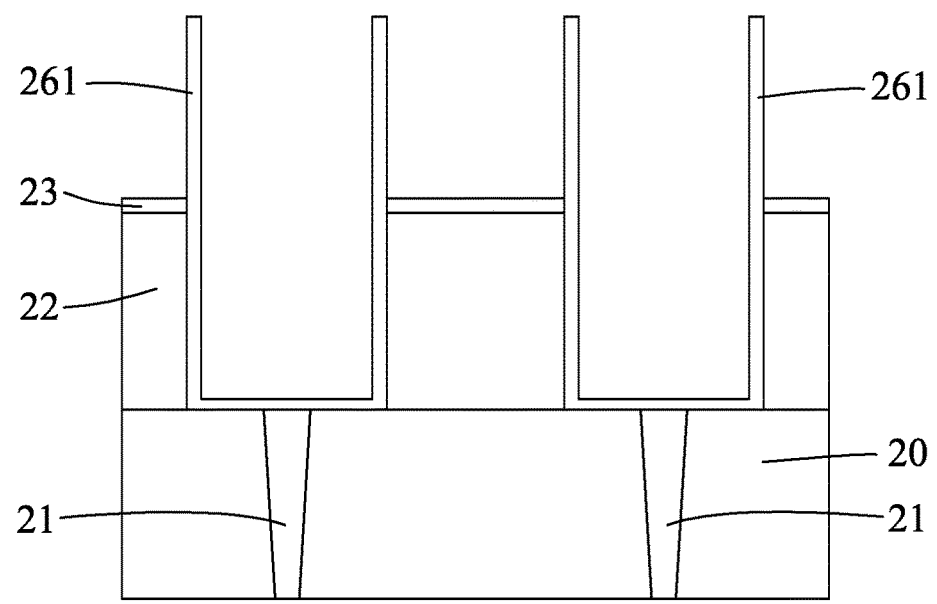
Figure 9:
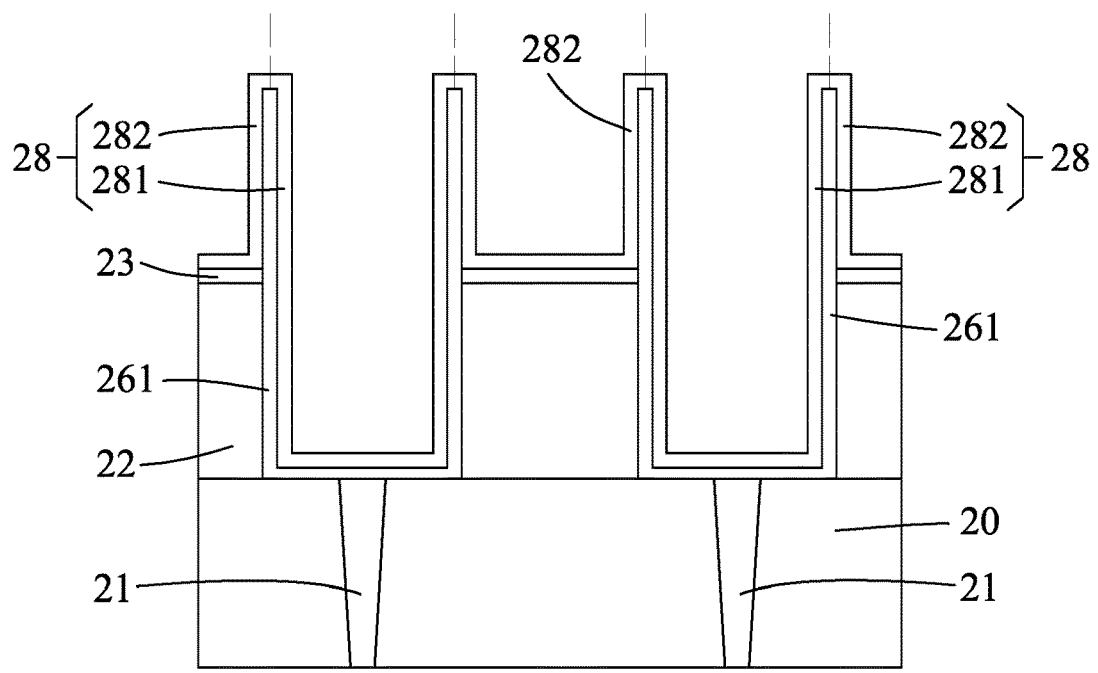
Figure 10:
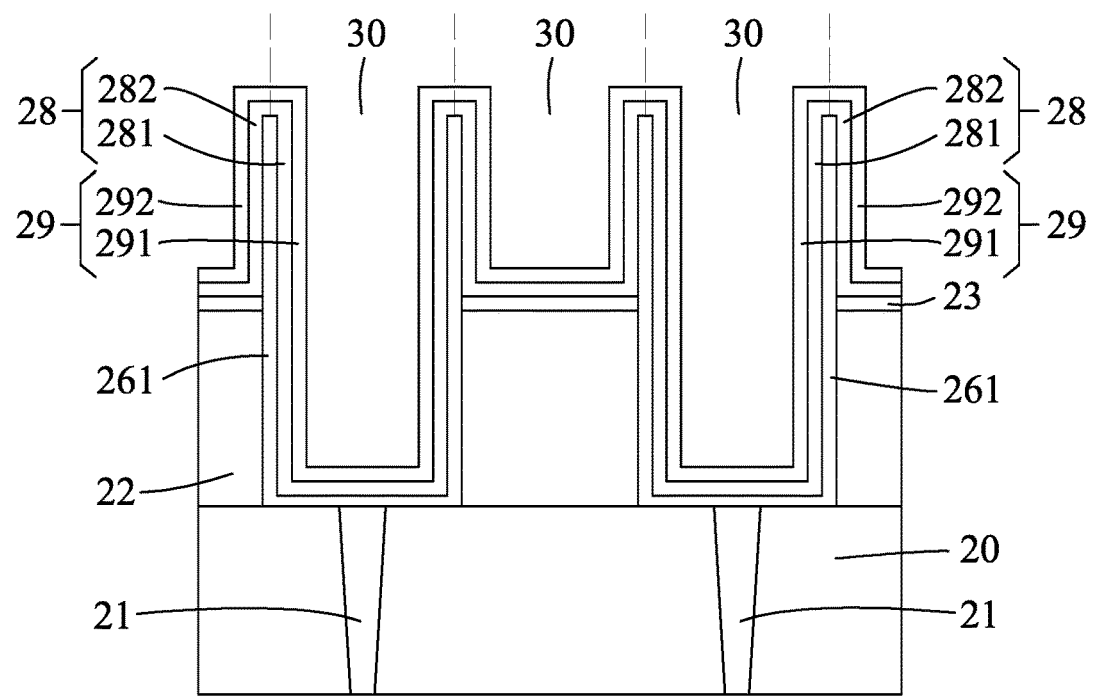
Figure 11:
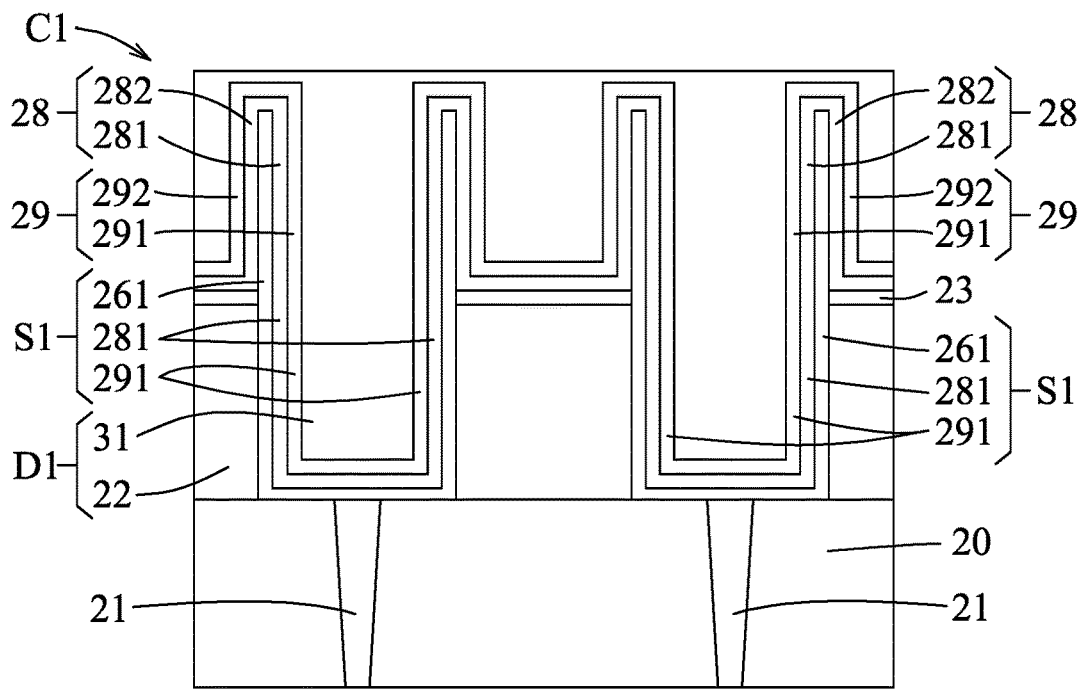
Figure 12:
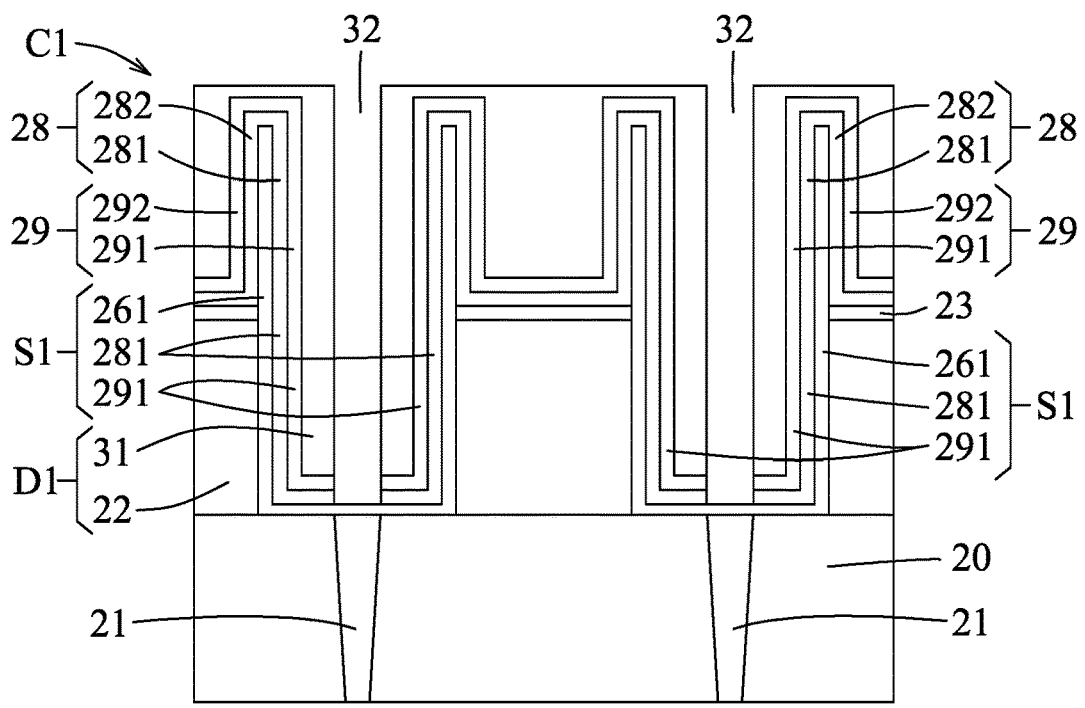
Figure 13:
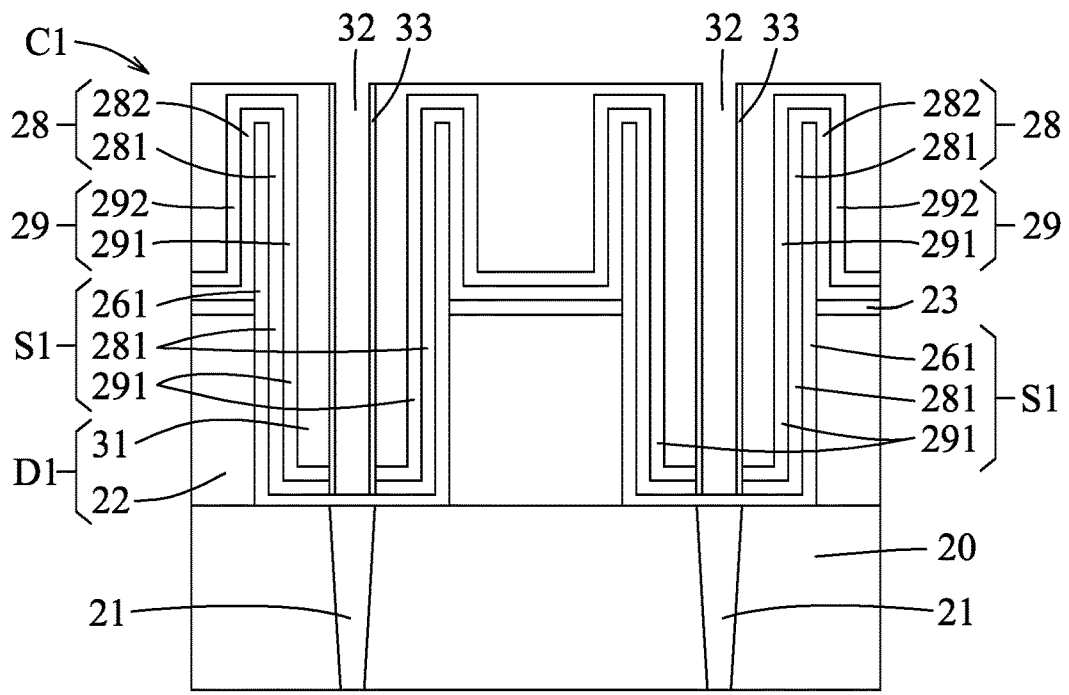
Figure 14:
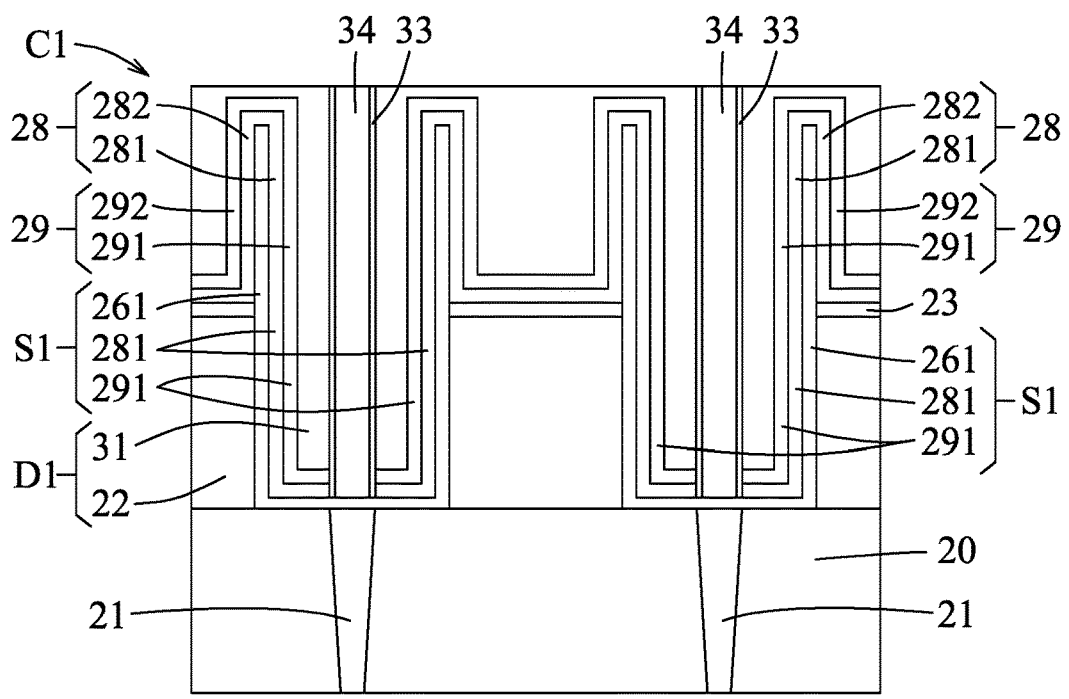
Figure 15:
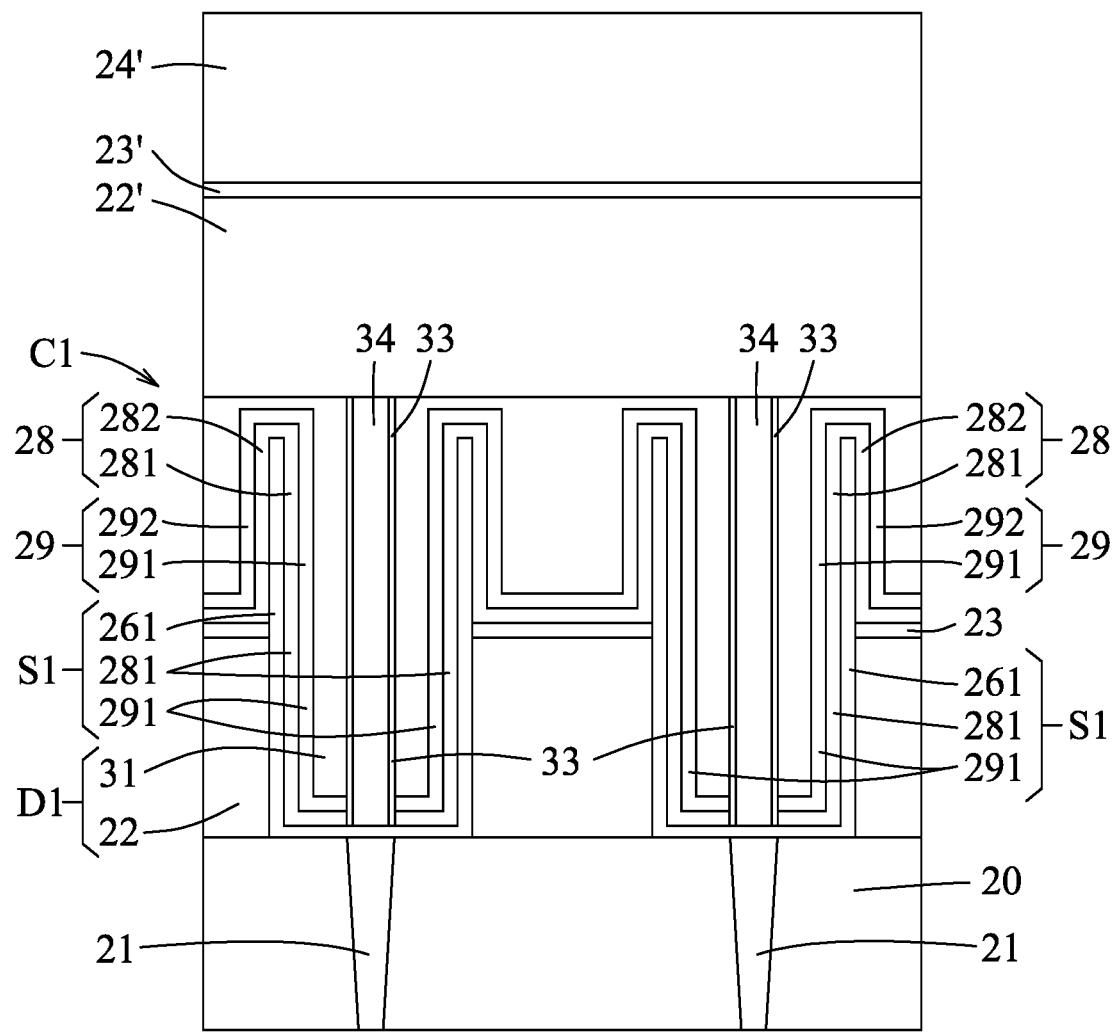
Figure 16:
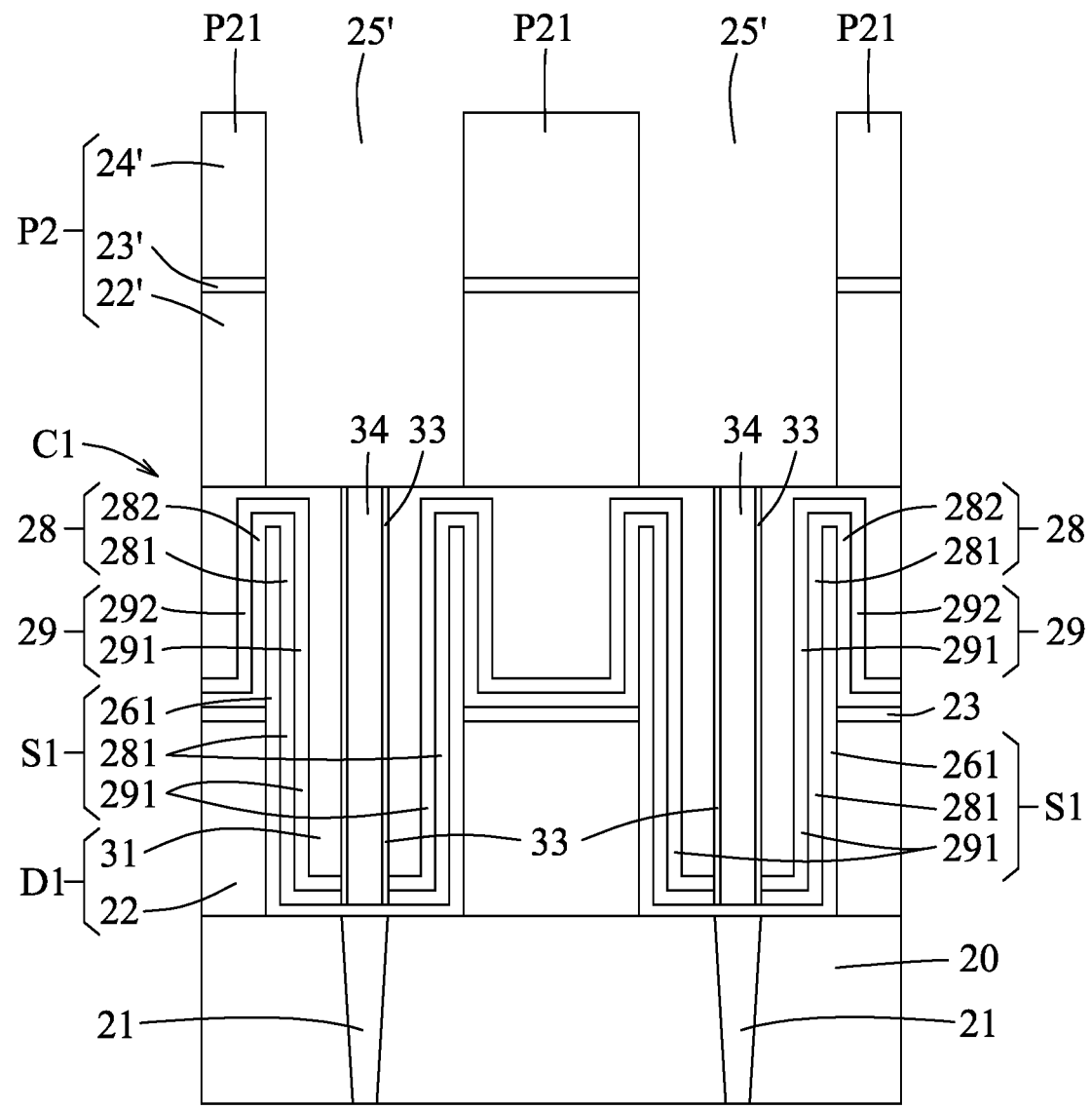
Figure 17:
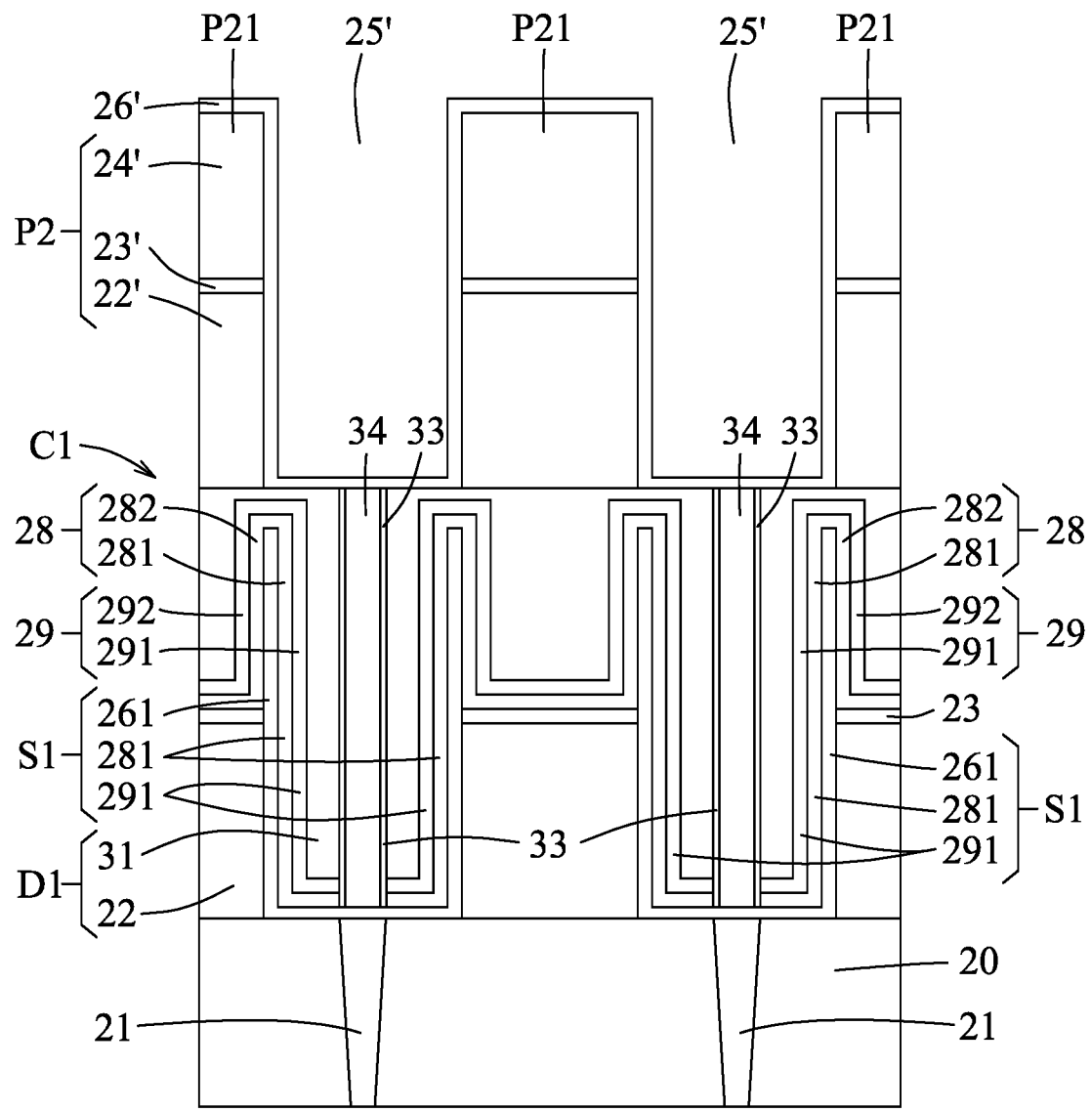
Figure 18:
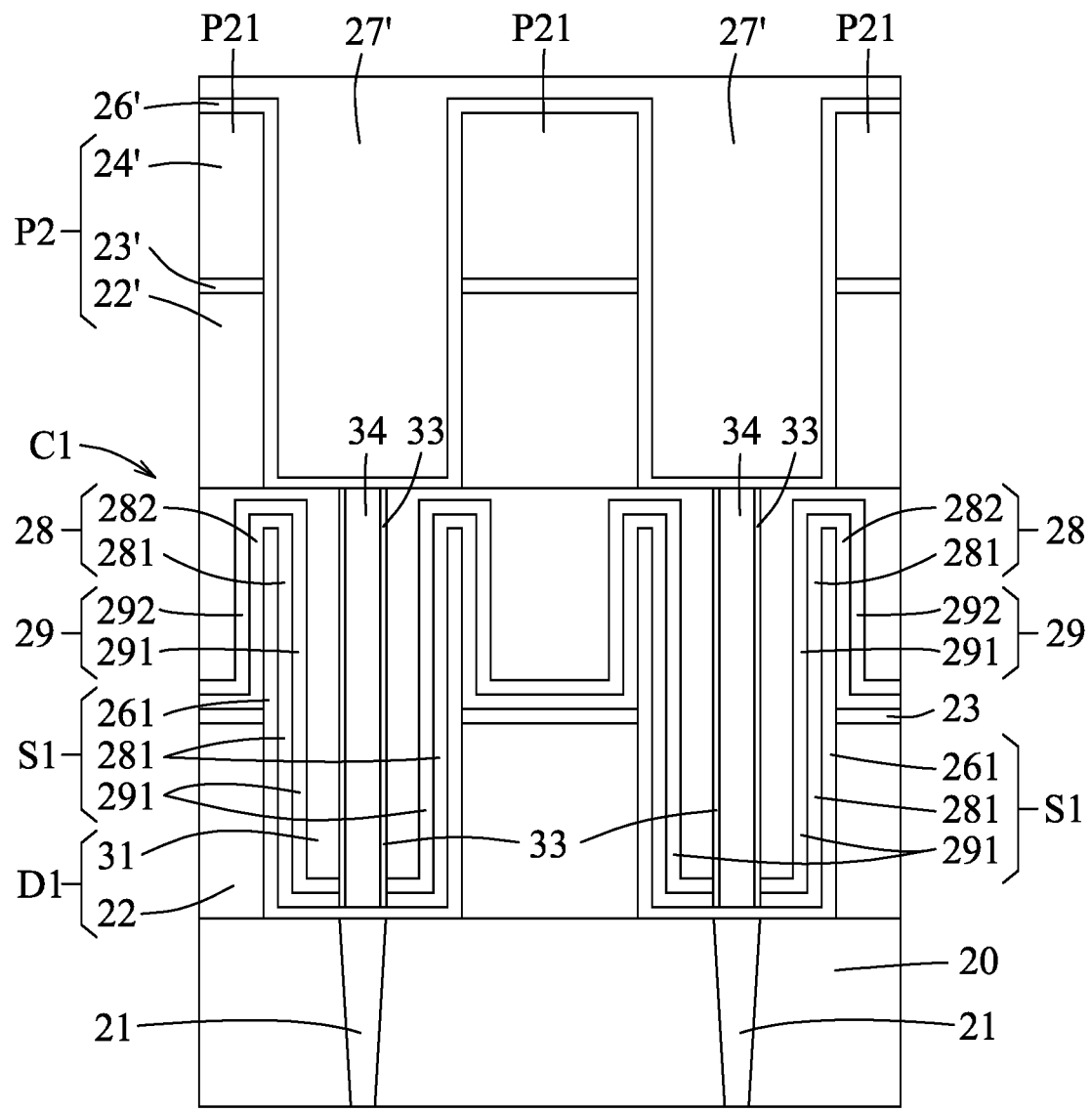
Figure 19:
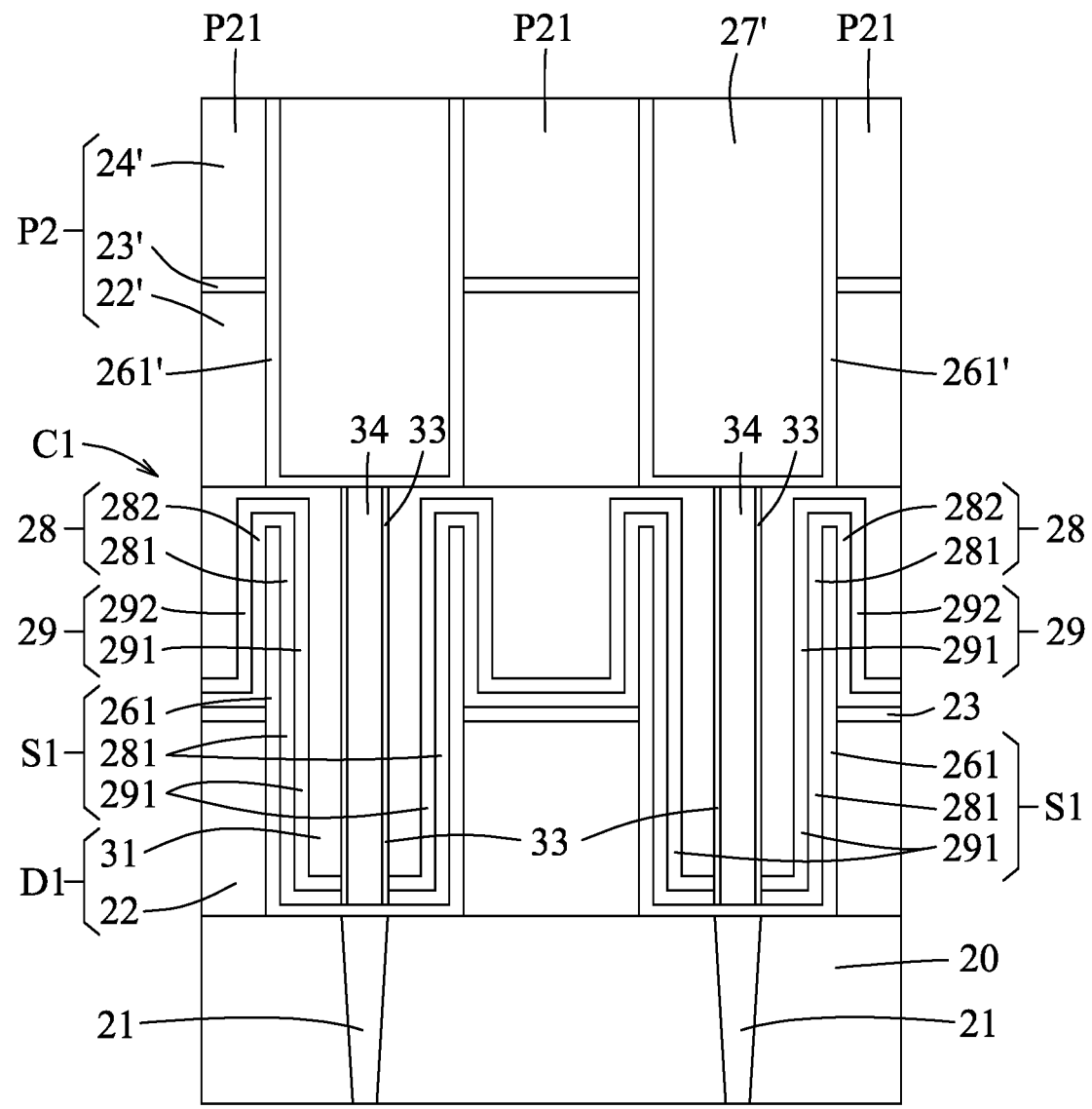
Figure 20:
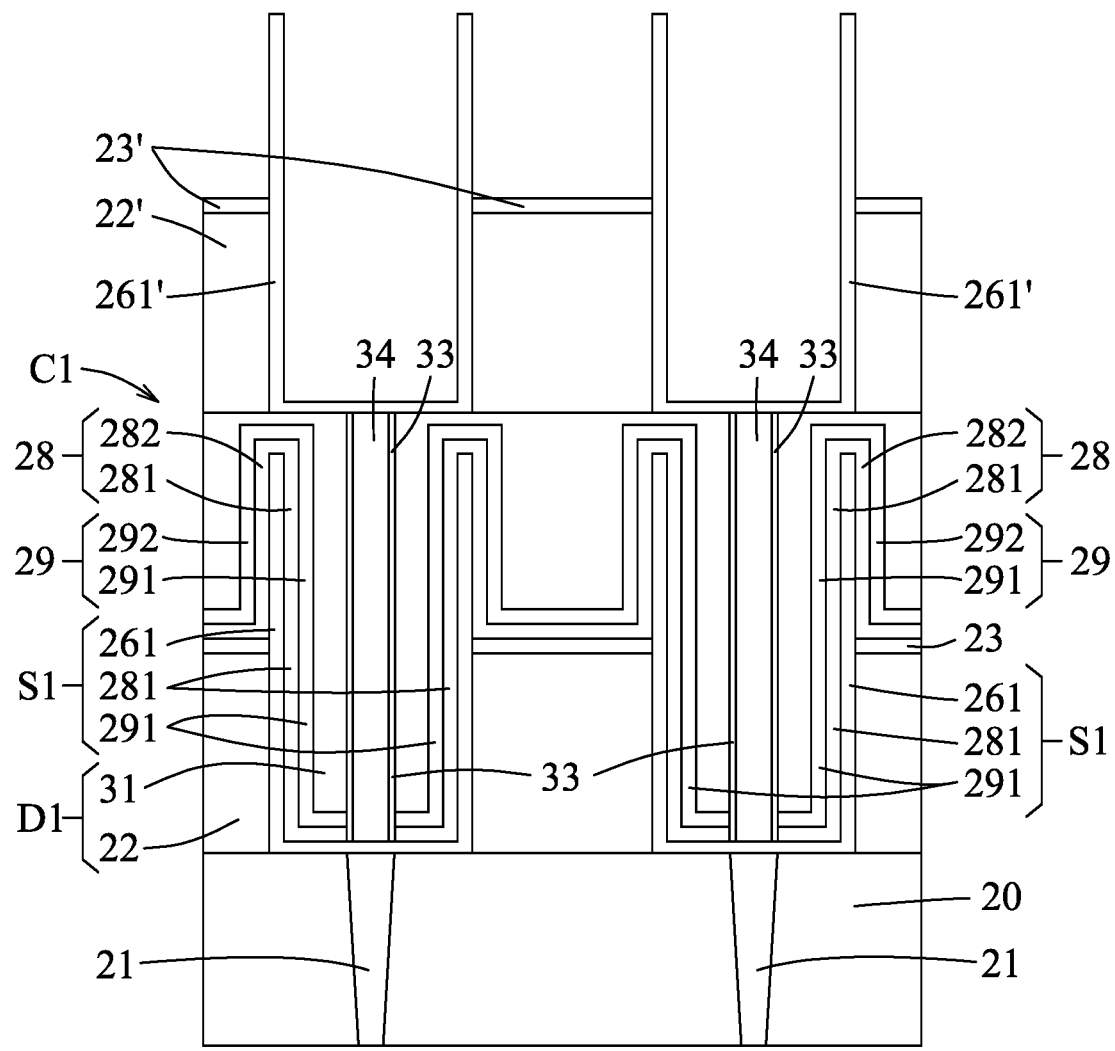
Figure 21:
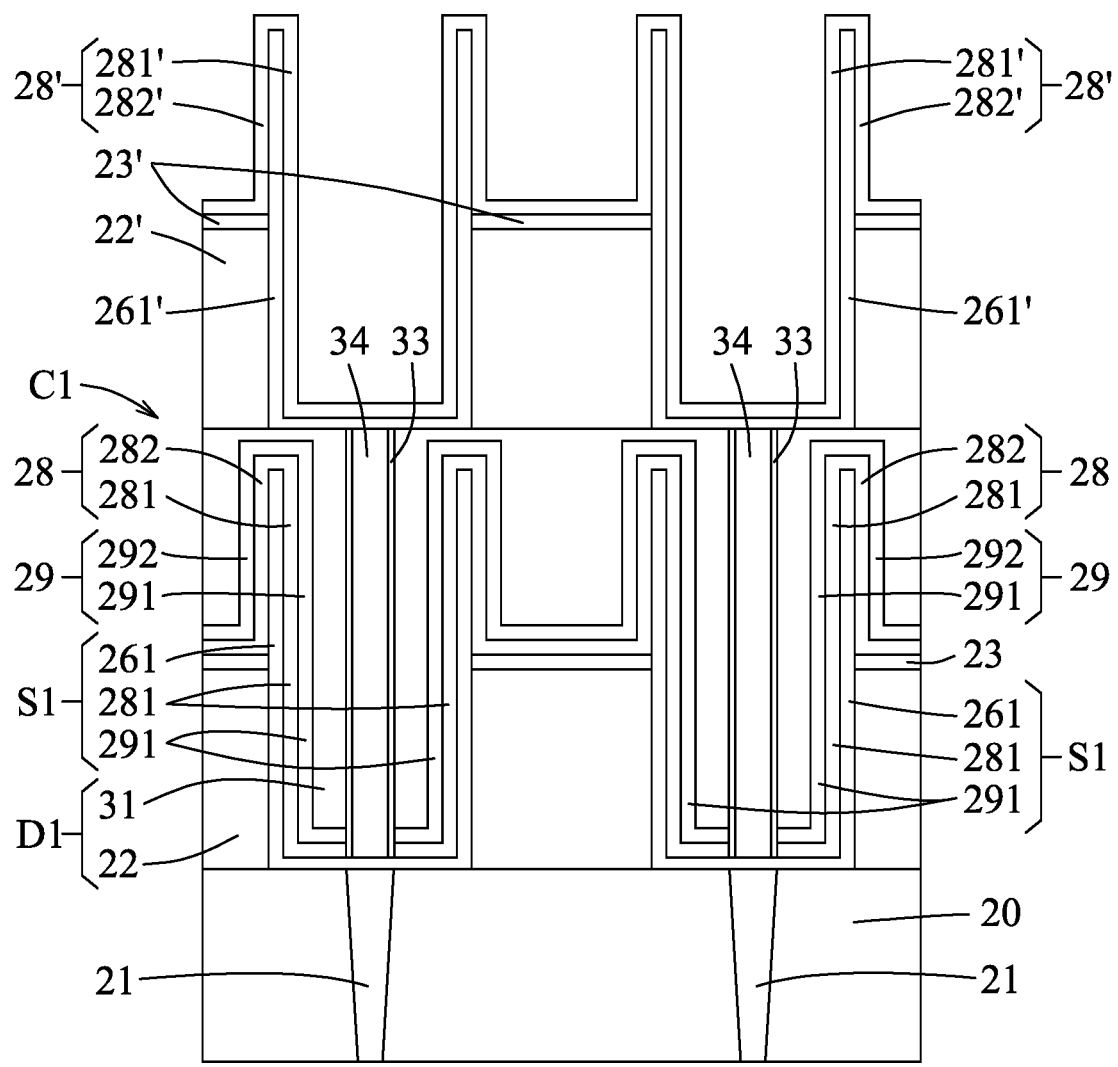
Figure 22:
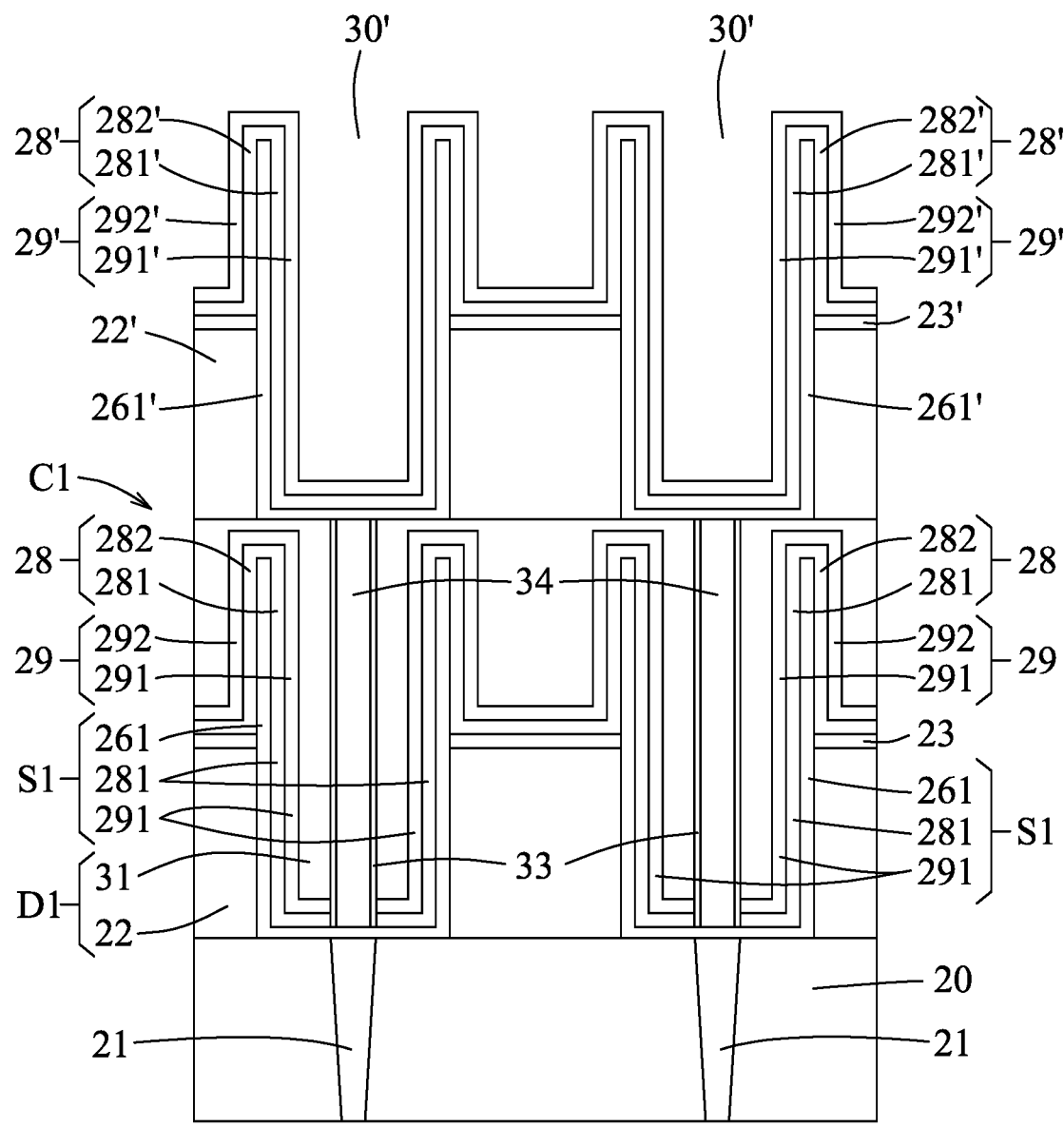
Figure 23:
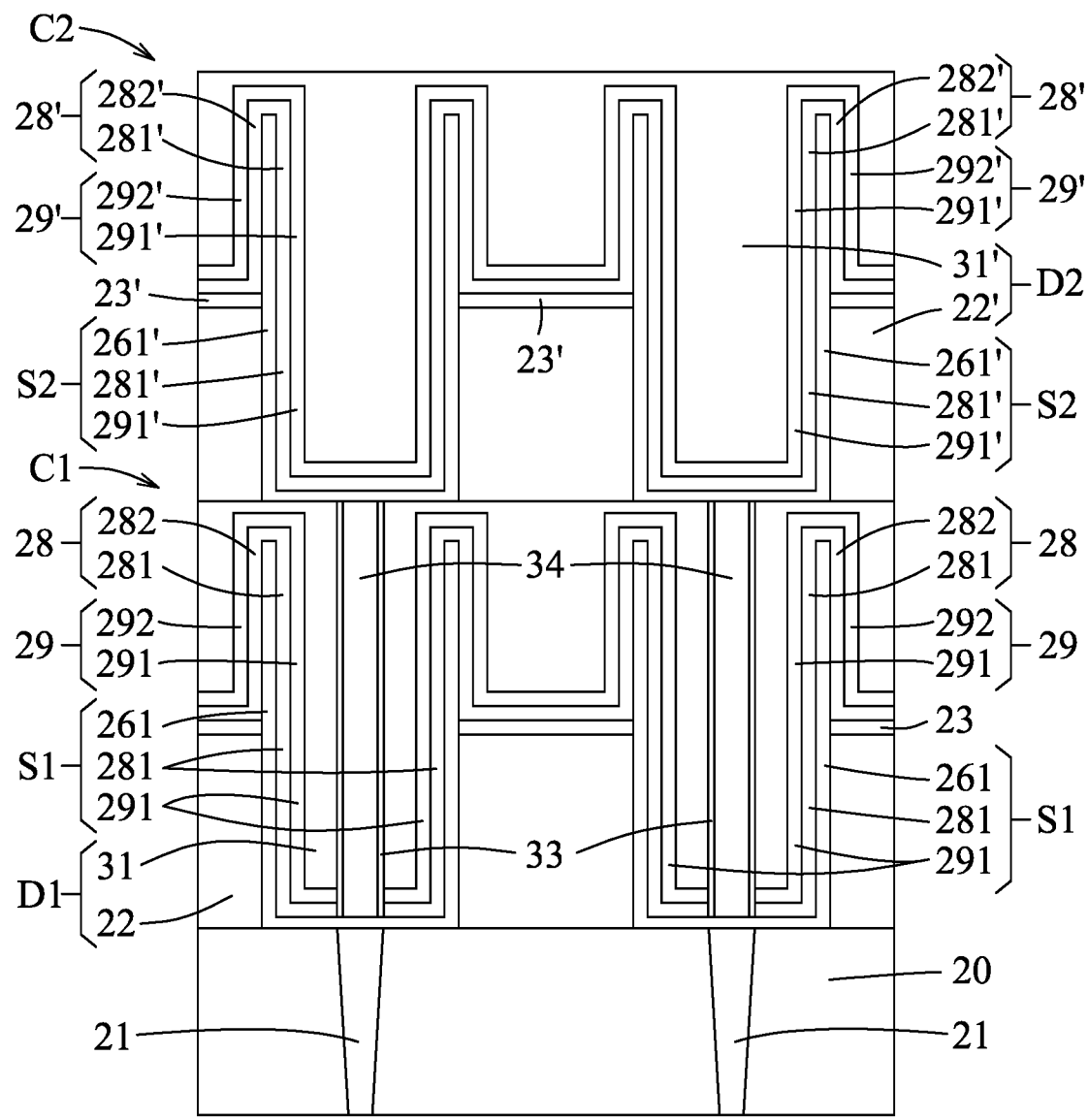
Figure 24:
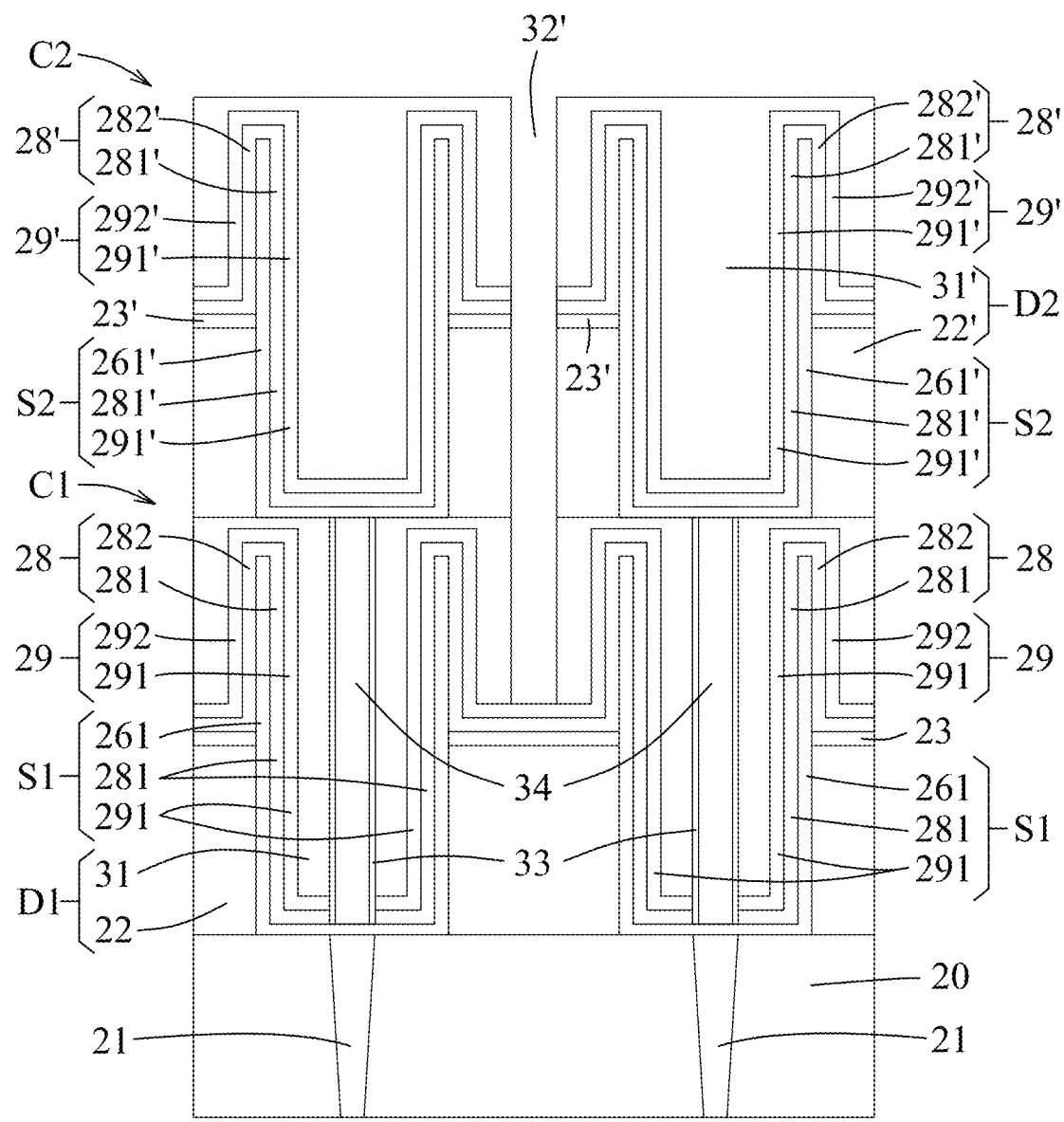
Figure 25:
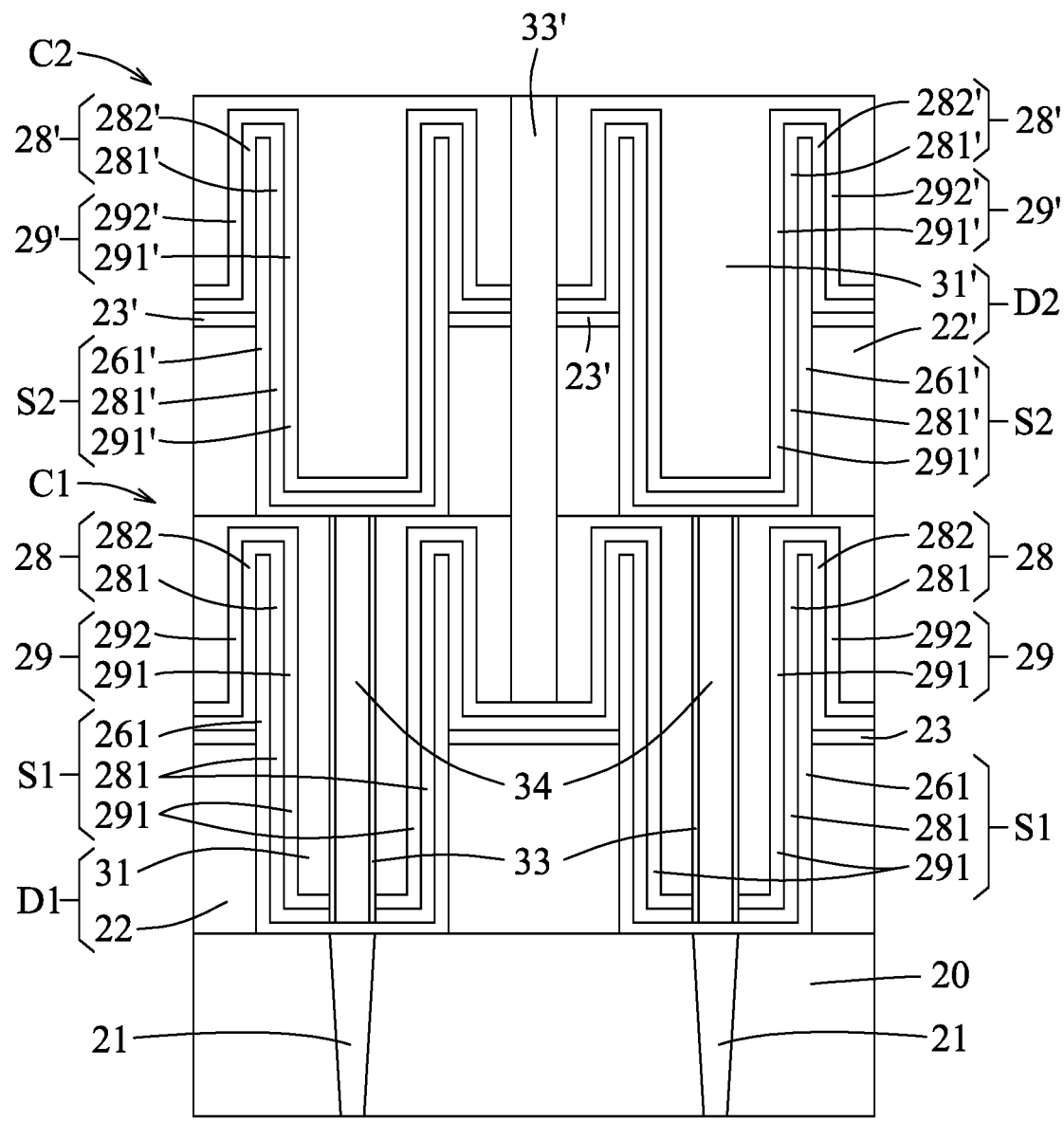
Figure 26:
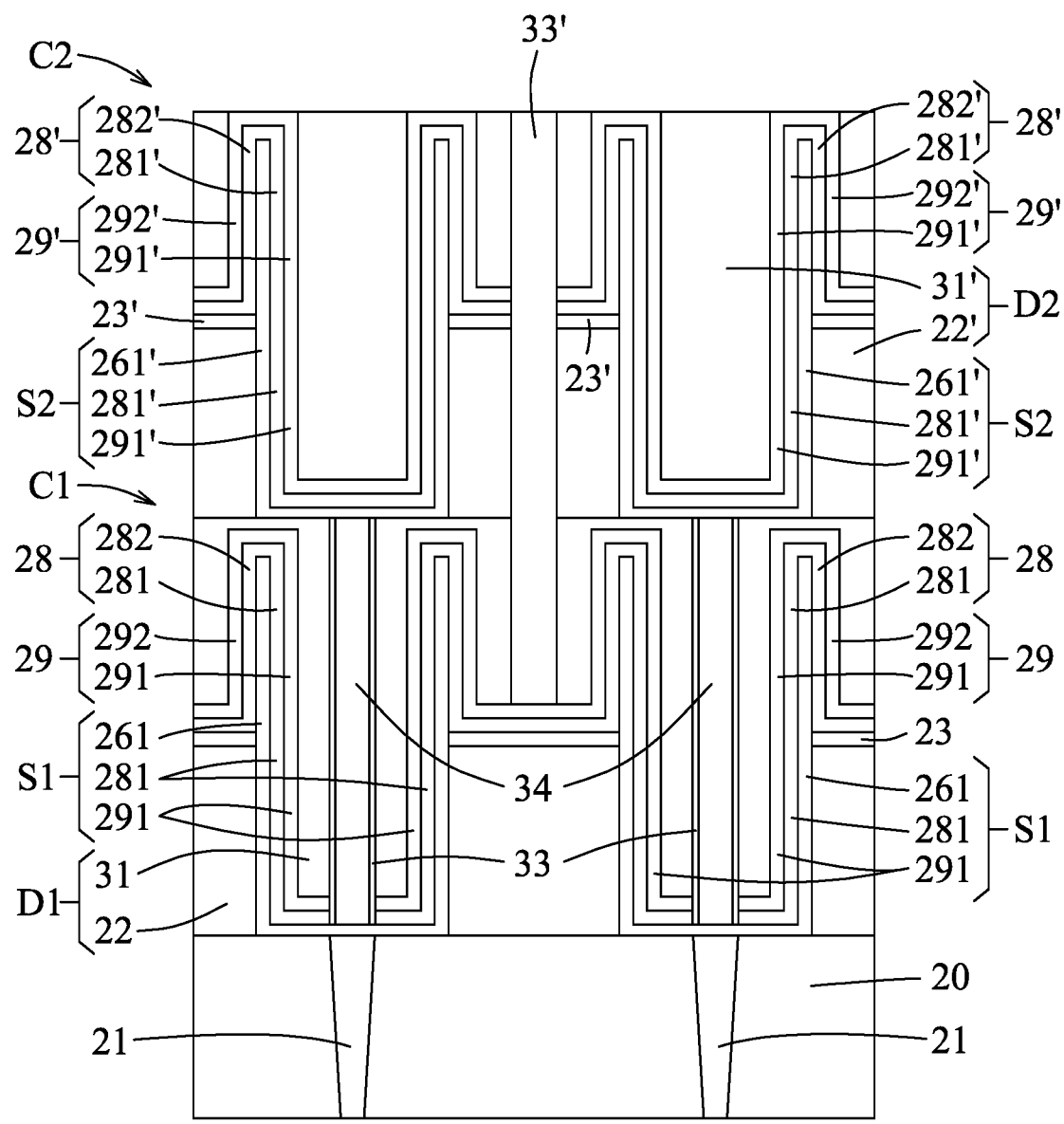
Figure 27:
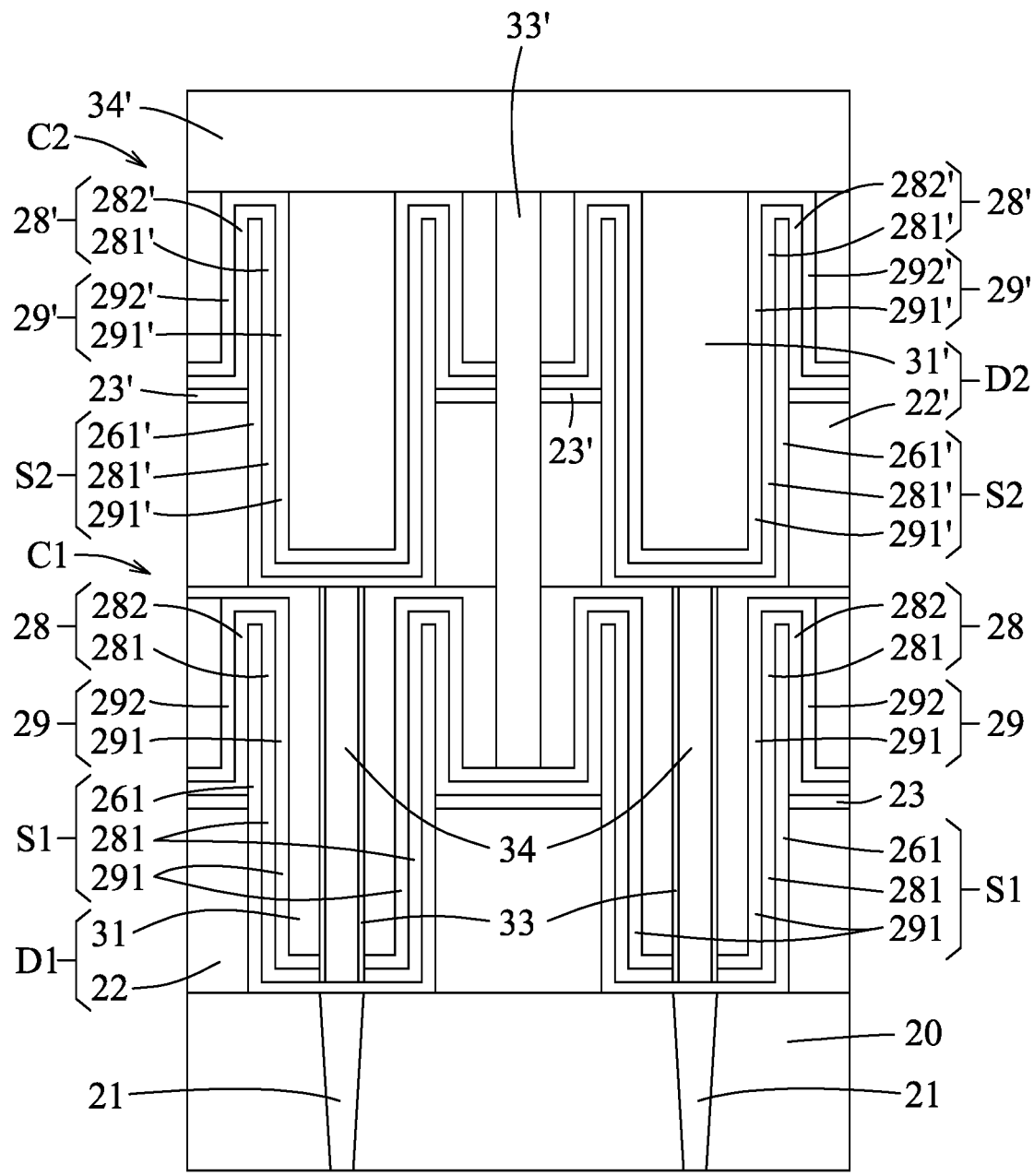

FIGS. 2A and 2B illustrate a method 100 for manufacturing a stacked capacitor structure of a memory device (for example, but not limited to, a DRAM device) in accordance with some embodiments. FIGS. 3 to 27 illustrate schematic views of a stacked capacitor structure during various stages of the method 100 shown in FIGS. 2A and 2B. The method 100 and the stacked capacitor structure are collectively described below. However, additional steps can be provided before, after or during the various stages of the method 100, and some of the steps described herein may be replaced by other steps or be eliminated. Similarly, further additional features may be present in the stacked capacitor structure, and/or features present may be replaced or eliminated in additional embodiments.

Referring to FIG. 2A, the method 100 begins at block 101, where a first dielectric layer, a first etch stop layer, and a second dielectric layer are deposited sequentially. Referring to the example illustrated in FIG. 3, a first dielectric layer 22, a first etch stop layer 23, and a second dielectric layer 24 are deposited sequentially on an interconnect layer disposed over a substrate, which is the same as or similar to the substrate 1 shown in FIG. 1. The interconnect layer includes an interlayer dielectric (ILD) layer 20 and via contacts 21 formed in the ILD layer 20.

In some embodiments, the ILD layer 20 may include dielectric materials, such as silicon oxide, silicon nitride, silicon oxynitride, spin-on glass (SOG), amorphous fluorinated carbon, fluorinated silica glass (FSG), carbon doped silicon oxide (e.g., SiCOH), Black Diamond® (Applied Materials Inc., Santa Clara, Calif.), Xerogel, Aerogel, polyimide, Parylene, BCB (bis-benzocyclobutenes), Flare, SiLK (Dow Chemical Co., Midland, Mich.), non-porous materials, porous materials, or combinations thereof. In some embodiments, the ILD layer 20 may include a high density plasma (HDP) dielectric material (e.g., HDP oxide), a high aspect ratio process (HARP) dielectric material (e.g., HARP oxide), or a combination thereof. In some embodiments, the ILD layer 20 may be a planarized dielectric film. Other suitable dielectric materials are within the contemplated scope of the present disclosure. The ILD layer 20 may be formed by a suitable deposition process known to those skilled in the art of semiconductor fabrication, for example, but not limited to, chemical vapor deposition (CVD), high density plasma CVD (HDPCVD), remote plasma CVD (RPCVD), plasma enhanced CVD (PECVD), or low-pressure CVD (LPCVD).

The via contacts 21 are formed in the ILD layer 20 by, for example, but not limited to, a single damascene process. In some embodiments, formation of the via contacts 21 includes the following steps. First, via openings are formed by patterning the ILD layer 20 using an etching process (for example, but not limited to, a dry etch process) through a patterned photoresist layer (not shown) to penetrate through the ILD layer 20. After the via openings are formed, the via contacts 21 are formed in the ILD layer 20 by depositing a metallic material to fill the via openings and then removing excess of the metallic material by a planarization technique, such as CMP. In some embodiments, the metallic material may include, for example, but not limited to, cobalt, tungsten, copper, titanium, tantalum, aluminum, zirconium, hafnium, or combinations thereof. Other suitable metallic materials are within the contemplated scope of the present disclosure. In some embodiments, deposition of the metallic material may be conducted by a suitable technique known to those skilled in the art of semiconductor fabrication, for example, but not limited to, ALD, PEALD, or other suitable deposition techniques.

The first dielectric layer 22 may include, for example, but not limited to, silicon oxide, silicon nitride, silicon oxynitride, un-doped silicate glass (USG), or combinations thereof. Other suitable dielectric materials are within the contemplated scope of the present disclosure. In some embodiments, silicon oxide may be formed from tetraethyl orthosilicate (TEOS). The thicknesses of the first dielectric layer 22 may depend on the aspect ratio of the capacitor segments to be formed. In some embodiments, deposition of the first dielectric layer 22 may be conducted by a suitable technique known to those skilled in the art of semiconductor fabrication, for example, but not limited to, CVD, HDPCVD, RPCVD, PECVD, LPCVD, or other suitable deposition processes.

In some embodiments, the first etch stop layer 23 may include, for example, but not limited to, aluminum compounds (for example, aluminum nitride, aluminum oxynitride, aluminum oxide, etc.), silicon compounds (for example, silicon oxide, silicon oxycarbide, silicon oxynitride, silicon carbonitride, silicon oxycarbonitride (SiCON), etc.), or combinations thereof. Other suitable dielectric materials are within the contemplated scope of the present disclosure. In some embodiments, deposition of the first etch stop layer 23 may be conducted by a suitable technique known to those skilled in the art of semiconductor fabrication, for example, but not limited to, CVD, HDPCVD, RPCVD, PECVD, LPCVD, or other suitable deposition processes. In some embodiments, the first etch stop layer 23 may have a thickness ranging from about 15 nanometer (nm) to about 30 nm. Other suitable thickness of the first etch stop layer 23 is within the contemplated scope of the present disclosure.

The second dielectric layer 24 may include, for example, but not limited to, silicon oxide, silicon nitride, silicon oxynitride, un-doped silicate glass (USG), or combinations thereof. Other suitable dielectric materials are within the contemplated scope of the present disclosure. In some embodiments, silicon oxide may be formed from tetraethyl orthosilicate (TEOS). The dielectric material for the second dielectric layer 24 may be the same as or different from that of the first dielectric layer 22. The thickness of the second dielectric layer 24 may depend on the aspect ratio of the capacitor segments to be formed. In some embodiments, a thickness ratio value of the first dielectric layer 22 to the second dielectric layer 24 ranges from about 3/7 to about 7/3. When the thickness ratio value is too low, for example, lower than about 3/7, the bottom electrodes to be formed may be damaged during subsequent processes for manufacturing the stacked capacitor structure. On the other hand, when the thickness ratio value is too high, for example, higher than about 7/3, the capacitor loss may be increased. In some embodiments, deposition of the second dielectric layer 24 may be conducted by a suitable technique known to those skilled in the art of semiconductor fabrication, for example, but not limited to, CVD, HDPCVD, RPCVD, PECVD, LPCVD, or other suitable deposition processes.

Referring to FIG. 2A, the method 100 then proceeds to block 102, where a plurality of first openings are formed. Referring to the examples illustrated in FIGS. 3 and 4, a plurality of first openings 25 are formed to penetrate through the second dielectric layer layer 24, the first etch stop layer 23, and the first dielectric layer 22, so that the via contacts 21 are exposed through the first openings 25, respectively. The first openings 25 may be formed by defining a first pattern on the second dielectric layer 24, and removing a portion of the second dielectric layer layer 24, a portion of the first etch stop layer 23, and a portion of the first dielectric layer 22 by patterning the second dielectric layer layer 24, the first etch stop layer 23, and the first dielectric layer 22 using an etching process (for example, but not limited to, a dry etch process) through a patterned photoresist layer (not shown), which may be formed by exposure, baking, developing, and/or other photolithography processes known in the art, A first patterned structure (P1) is formed accordingly, and includes a plurality of first pillars (P11).

Referring to FIG. 2A, the method 100 then proceeds to block 103, where a first bottom electrode layer is conformally deposited. Referring to the example illustrated in FIG. 5, a first bottom electrode layer 26 is conformally deposited over the first patterned structure (P1) to cover the second dielectric layer 24, the first etch stop layer 23, the first dielectric layer 22, and the ILD layer 20, and is physically and electrically connected to the via contacts 21. In some embodiments, the first bottom electrode layer 26 may include, for example, but not limited to, titanium (Ti), tantalum (Ta), tungsten (W), ruthenium (Ru), molybdenum (Mo), platinum (Pt), iridium (Ir), titanium nitride (TiN), tantalum nitride (TaN), tungsten nitride (WN), or other low-resistance metallic materials. Other suitable metallic materials are within the contemplated scope of the present disclosure. In some embodiments, deposition of the first bottom electrode layer 26 may be conducted by a suitable technique known to those skilled in the art of semiconductor fabrication, for example, but not limited to, (ALD, PEALD, or other suitable deposition processes. The first bottom electrode layer 26 may be a single-film or multi-film structure. In some embodiments, the first bottom electrode layer 26 may have a thickness ranging from about 50 angstrom (Å) to about 200 Å. Other suitable thickness is within the contemplated scope of the present disclosure.

Referring to FIG. 2A, the method 100 then proceeds to block 104, where a first dielectric filler is filled in the first openings. Referring to the examples illustrated in FIGS. 5 and 6, the first openings 25 defined by the first pillars (P11) are filled with a first dielectric filler 27 by a suitable technique known to those skilled in the art of semiconductor fabrication, for example, but not limited to, CVD, HDPCVD, RPCVD, PECVD, LPCVD, or other suitable deposition processes. The first dielectric filler 27 may include, for example, but not limited to, silicon oxide, silicon nitride, silicon oxynitride, un-doped silicate glass (USG), or combinations thereof. Other suitable dielectric materials are within the contemplated scope of the present disclosure.

Referring to FIG. 2A, the method 100 then proceeds to block 105, where excess of the first dielectric filler and top portions of the first bottom electrode layer are removed to form first bottom electrodes. Referring to the examples illustrated in FIGS. 6 and 7, excess of the first dielectric filler 27 and top portions of the first bottom electrode layer 26 are removed by a planarization technique, such as CMP, to form a plurality of first bottom electrodes 261 spaced apart from each other. Each of the first bottom electrodes 261 has a U-shaped profile with respect to a cross-sectional view.

Referring to FIG. 2A, the method 100 then proceeds to block 106, where the first dielectric filler and the second dielectric layer are removed. Referring to the examples illustrated in FIGS. 7 and 8, the first dielectric filler 27 and the second dielectric layer 24 are removed by a wet etch process. The wet etch process may be conducted using an etch chemistry including an inorganic acid. The inorganic acid may include, for example, but not limited to, a halogen acid, HF, or $H_2SO_4$. After the first dielectric filler 27 and the second dielectric layer 24 are removed, the first bottom electrodes 261 are supported by the first dielectric layer 22 and the first etch stop layer 23, so that the first bottom electrodes 261 may be prevented from damage during the subsequent processes for manufacturing the stacked capacitor structure.

Referring to FIG. 2A, the method 100 then proceeds to block 107, where a first dielectric film is conformally deposited. Referring to the examples illustrated in FIG. 9, a first dielectric film 28, for example, but not limited to, a high-k dielectric film, is conformally deposited over the first bottom electrodes 261 to cover the first bottom electrodes 261 and the first etch stop layer 23. The first dielectric film 28 includes a plurality of first dielectric sections 281 conformally disposed on the first bottom electrodes 261, respectively, and a plurality of second dielectric sections 282 disposed on the first etch stop layer 23. The first and second dielectric sections 281, 282 alternate with each other and are connected to each other to form the first dielectric film 28. In some embodiments, the first dielectric film 28 may include, for example, but not limited to, titanium oxide, barium strontium titanate, zirconium oxide, hafnium oxide, aluminum oxide, tantalum oxide, hafnium silicon oxide, zirconium silicon oxide, hafnium aluminum oxide, zirconium aluminum oxide, strontium titanium oxide, or combinations thereof. Other suitable dielectric materials are within the contemplated scope of the present disclosure. The first dielectric film 28 may be a single-layered or multi-layered structure. In some embodiments, deposition of the first dielectric film 28 may be conducted by a suitable technique known to those skilled in the art of semiconductor fabrication, for example, but not limited to, ALD, PEALD, or other suitable deposition processes. In some embodiments, the first dielectric film 28 may have a thickness ranging from about 50 Å to about 150 Å. Other suitable thickness is within the contemplated scope of the present disclosure.

Referring to FIG. 2A, the method 100 then proceeds to block 108, where a first top electrode layer is conformally deposited. Referring to the example illustrated in FIG. 10, a first top electrode layer 29 is conformally deposited over and covers the first dielectric film 28. The first top electrode layer 29 includes a plurality of first top electrodes 291 conformally disposed on the first dielectric sections 281, and a plurality of first connecting sections 292 conformally disposed on the second dielectric sections 282. The first top electrodes 291 and the first connecting sections 292 alternate with each other, and are connected to each other to form the first top electrode layer 29. In some embodiments, the first top electrode layer 29 may include, for example, but not limited to, titanium (Ti), tantalum (Ta), tungsten (W), ruthenium (Ru), molybdenum (Mo), platinum (Pt), iridium (Ir), titanium nitride (TiN), tantalum nitride (TaN), tungsten nitride (WN), or other low-resistance metallic materials. Other suitable metallic materials are within the contemplated scope of the present disclosure. In some embodiments, deposition of the first top electrode layer 29 may be conducted by a suitable technique known to those skilled in the art of semiconductor fabrication, for example, but not limited to, ALD, PEALD, or other suitable deposition processes. The first top electrode layer 29 may be a single-film or multi-film structure. In some embodiments, the first top electrode layer 29 may have a thickness ranging from about 50 Å to about 200 Å. Other suitable thickness is within the contemplated scope of the present disclosure.

Referring to FIG. 2A, the method 100 then proceeds to block 109, where a second dielectric filler is filled in first recesses defined by the first top electrode layer. Referring to the examples illustrated in FIGS. 10 and 11, the first recesses 30 defined by the first top electrode layer 29 are filled with a second dielectric filler 31 by a suitable technique known to those skilled in the art of semiconductor fabrication, for example, but not limited to, CVD, HDPCVD, RPCVD, PECVD, LPCVD, or other suitable deposition processes. The second dielectric filler 31 may include, for example, but not limited to, silicon nitride, silicon oxynitride, un-doped silicate glass (USG), or combinations thereof. Other suitable dielectric materials are within the contemplated scope of the present disclosure. Excess of the second dielectric filler 31 over the first top electrode layer 29 is removed by a planarization technique, such as CMP, to form a first capacitor sub-structure (C1) on the ILD layer 20. The first capacitor sub-structure (C1) includes a first insulating layer (D1) and a plurality of first capacitor segments (S1) disposed in the first insulating layer (D1). The first insulating layer (D1) is formed from the first dielectric layer 22 and the second dielectric filler 31. Each of the first capacitor segments (S1) includes one of the first bottom electrodes 261, a corresponding one of the first dielectric sections 281 conformally disposed on the one of the first bottom electrodes 261, and a corresponding one of the first top electrodes 291 that is conformally disposed on the corresponding one of the first dielectric sections 281 and that is isolated from the one of the first bottom electrodes 261 by the corresponding one of the first dielectric sections 281. In two adjacent ones of the first capacitor segments (S1), the first bottom electrodes 261 are spaced apart from each other, and the first top electrodes 291 are connected to each other through a corresponding one of the first connecting sections 292. The first etch stop layer 23 is disposed on the first dielectric layer 22 to define each of the first bottom electrodes 261 into a lower portion inserted in the first dielectric layer 22 and an upper portion extending away from the lower portion and penetrating through the first etch stop layer 23. A height ratio value of the lower portion to the upper portion of each of the first bottom electrodes 261 ranges from about 3/7 to about 7/3. As described above, after the first dielectric filler 27 and the second dielectric layer 24 are removed, the first bottom electrodes 261 are supported by the first dielectric layer 22 and the first etch stop layer 23, so that the first bottom electrodes 261 may be prevented from damage during the subsequent processes for manufacturing the stacked capacitor structure. Therefore, compared to the aspect ratio of the capacitors 18 illustrated in FIG. 1, which is limited to up to 7, the aspect ratio of the first capacitor segments (S1) can be increased to, for example, up to 12 without damage, thereby enhancing the capacitance of the first capacitor segments (S1).

Referring to FIG. 2A, the method 100 then proceeds to block 110, where a plurality of first trenches are formed. Referring to the example illustrated in FIG. 12, a plurality of first trenches 32 are formed by patterning the second dielectric filler 31, the first top electrodes 291, and the first dielectric sections 281 using an etching process (for example, but not limited to, a dry etch process) through a patterned photoresist layer (not shown), which may be formed by exposure, baking, developing, and/or other photolithography processes known in the art. Each of the first trenches 32 thus formed penetrates through the second dielectric filler 31, a corresponding one of the first top electrodes 291, and a corresponding one of the first dielectric sections 281 to expose a corresponding one of the first bottom electrodes 261.

Referring to FIG. 2A, the method 100 then proceeds to block 111, where a plurality of first sidewall spacers are formed. Referring to the example illustrated in FIG. 13, a plurality of first sidewall spacers 33 are formed to laterally cover the second dielectric filler 31 and to extend downwardly to the first bottom electrodes 261. The first sidewall spacers 33 may be formed by conformally depositing a spacer layer and etching away horizontal portions of the spacer layer using a dry etch process (for example, but not limited to, anisotropic etching). The conformal deposition may be conducted by a suitable deposition process known to those skilled in the art of semiconductor fabrication, for example, but not limited to, CVD, PECVD, ALD, PEALD, or other suitable methods. In some embodiments, the spacer layer may include, for example, but not limited to, silicon oxide, silicon nitride, silicon carbide, silicon oxycarbide, silicon oxynitride, silicon carbonitride, silicon oxycarbonitride, or combinations thereof. Other suitable dielectric materials are within the contemplated scope of the present disclosure. In some embodiments, the spacer layer may have a thickness ranging from about 50 Å to about 150 Å. Other suitable thickness is within the contemplated scope of the present disclosure.

Referring to FIG. 2A, the method 100 then proceeds to block 112, where a plurality of first vertical interconnect structures are formed. Referring to the examples illustrated in FIGS. 13 and 14, a plurality of first vertical interconnect structures 34 (for examples, but not limited, via plugs) are formed by depositing a metallic material to fill the first trenches 32 and then removing excess of the metallic material by a planarization technique, such as CMP. In some embodiments, the metallic material may include, for example, but not limited to, cobalt, tungsten, copper, titanium, tantalum, aluminum, zirconium, hafnium, or combinations thereof. Other suitable metallic materials are within the contemplated scope of the present disclosure. In some embodiments, deposition of the metallic material may be conducted by a suitable technique known to those skilled in the art of semiconductor fabrication, for example, but not limited to, ALD, PEALD, or other suitable deposition techniques.

Referring to FIG. 2B, the method 100 then proceeds to block 113, where a third dielectric layer, a second etch stop layer, and a fourth dielectric layer are deposited sequentially. Referring to the example illustrated in FIG. 15, a third dielectric layer 22', a second etch stop layer 23', and a fourth dielectric layer 24' are deposited sequentially on the first capacitor sub-structure (C1). Details regarding the formation of the third dielectric layer 22', the second etch stop layer 23', and the fourth dielectric layer 24' are the same as or similar to those described above for the formation of the first dielectric layer 22, the first etch stop layer 23, and the second dielectric layer 24 with reference to FIG. 3.

Referring to FIG. 2B, the method 100 then proceeds to block 114, where a plurality of second openings are formed. Referring to the examples illustrated in FIGS. 15 and 16, a plurality of second openings 25' are formed to penetrate through the fourth dielectric layer 24', the second etch stop layer 23', and the third dielectric layer 22', so that the first vertical interconnect structures 34 are exposed through the second openings 25', respectively. The second openings 25' may be formed by defining a second pattern on the fourth dielectric layer 24', and removing a portion of the fourth dielectric layer layer 24', a portion of the second etch stop layer 23', and a portion of the third dielectric layer 22', A second patterned structure (P2) is formed accordingly, and includes a plurality of second pillars (P21). Details regarding the formation of the second openings 25' are the same as or similar to those described above for the formation of the first openings 25 with reference to FIG. 4.

Referring to FIG. 2B, the method 100 then proceeds to block 115, where a second bottom electrode layer is conformally deposited. Referring to the example illustrated in FIG. 17, a second bottom electrode layer 26' is conformally deposited over the second patterned structure (P2) to cover the fourth dielectric layer 24', the second etch stop layer 23', the third dielectric layer 22', and the first capacitor substructure (C1), and is physically and electrically connected to the first vertical interconnect structures 34. Details regarding the formation of the second bottom electrode layer 26' are the same as or similar to those described above for the formation of the first bottom electrode layer 26 with reference to FIG. 5.

Referring to FIG. 2B, the method 100 then proceeds to block 116, where a third dielectric filler is filled in the second openings. Referring to the examples illustrated in FIGS. 17 and 18, the second openings 25' defined by the second pillars (P21) are filled with a third dielectric filler 27'. Details regarding the filling of the third dielectric filler 27' are the same as or similar to those described above for the filling of the first dielectric filler 27 with reference to FIGS. 5 and 6.

Referring to FIG. 2B, the method 100 then proceeds to block 117, where excess of the third dielectric filler and top portions of the second bottom electrode layer are removed to form second bottom electrodes. Referring to the examples illustrated in FIGS. 18 and 19, excess of the third dielectric filler 27' and top portions of the second bottom electrode layer 26' are removed by a planarization technique, such as CMP, to form a plurality of second bottom electrodes 261' spaced apart from each other. Each of the second bottom electrodes 261' has a U-shaped profile with respect to a cross-sectional view.

Referring to FIG. 2B, the method 100 then proceeds to block 118, where the third dielectric filler and the fourth dielectric layer are removed. Referring to the examples illustrated in FIGS. 19 and 20, the third dielectric filler 27' and the fourth dielectric layer 24' are removed by a wet etch process. Details regarding the removal of the third dielectric filler 27' and the fourth dielectric layer 24' are the same as or similar to those described above for the removal of the first dielectric filler 27 and the second dielectric layer 24 with reference to FIGS. 7 and 8. After the third dielectric filler 27' and the fourth dielectric layer 24' are removed, the second bottom electrodes 261' are supported by the third dielectric layer 22' and the second etch stop layer 23', so that the second bottom electrodes 261' are prevented from damage during the subsequent processes for manufacturing the capacitor structure.

Referring to FIG. 2B, the method 100 then proceeds to block 119, where a second dielectric film is conformally deposited. Referring to the examples illustrated in FIG. 21, a second dielectric film 28', for example, but not limited to, a high-k dielectric film, is conformally deposited over the second bottom electrodes 261' to cover the second bottom electrodes 261' and the second etch stop layer 23'. Details regarding the formation of the second dielectric film 28' are the same as or similar to those described above for the formation of the first dielectric film 28 with reference to FIG. 9. The second dielectric film 28' includes a plurality of third dielectric sections 281' conformally disposed on the second bottom electrodes 261', respectively, and a plurality of fourth dielectric sections 282' disposed on the second etch stop layer 23'. The third and fourth dielectric sections 281', 282' alternate with each other and are connected to each other to form the second dielectric film 28'.

Referring to FIG. 2B, the method 100 then proceeds to block 120, where a second top electrode layer is conformally deposited. Referring to the example illustrated in FIG. 22, a second top electrode layer 29' is conformally deposited over and covers the second dielectric film 28'. Details regarding the formation of the second top electrode layer 29' are the same as or similar to those described above for the formation of the first top electrode layer 29 with reference to FIG. 10. The second top electrode layer 29' includes a plurality of second top electrodes 291' conformally disposed on the third dielectric sections 281', and a plurality of second connecting sections 292' conformally disposed on the fourth dielectric sections 282'. The second top electrodes 291' and the second connecting sections 292' alternate with each other, and are connected to each other to form the second top electrode layer 29'.

Referring to FIG. 2B, the method 100 then proceeds to block 121, where a fourth dielectric filler is filled in second recesses defined by the second top electrode layer. Referring to the examples illustrated in FIGS. 22 and 23, the second recesses 30' defined by the second top electrode layer 29' are filled with a fourth dielectric filler 31'. Details regarding the filling of the fourth dielectric filler 31' are the same as or similar to those described above for the filling of the second dielectric filler 31 with reference to FIGS. 18 and 11. Excess of the fourth dielectric filler 31' over the second top electrode layer 29' is removed by a planarization technique, such as CMP, to form a second capacitor sub-structure (C2) on the first capacitor sub-structure (C1). The second capacitor sub-structure (C2) includes a second insulating layer (D2) and a plurality of second capacitor segments (S2) disposed in the second insulating layer (D2). The second insulating layer (D2) is formed from the third dielectric layer 22' and the fourth dielectric filler 31'. Each of the second capacitor segments (S2) includes one of the second bottom electrodes 261', a corresponding one of the third dielectric sections 281' conformally disposed on the one of the second bottom electrodes 261', and a corresponding one of the second top electrodes 291' that is conformally disposed on the corresponding one of the third dielectric sections 281' and that is isolated from the one of the second bottom electrodes 261' by the corresponding one of the third dielectric sections 281'. In two adjacent ones of the second capacitor segments (S2), the second bottom electrodes 261' are spaced apart from each other, and the second top electrodes 291' are connected to each other through a corresponding one of the second connecting sections 292'. The second etch stop layer 23' is disposed on the third dielectric layer 22' to define each of the second bottom electrodes 261' into a lower portion inserted in the third dielectric layer 22' and an upper portion extending away from the lower portion and penetrating through the second etch stop layer 23'. A height ratio value of the lower portion to the upper portion of each of the second bottom electrodes 261' ranges from about 3/7 to about 7/3. As described above, after the third dielectric filler 27' and the fourth dielectric layer 24' are removed, the second bottom electrodes 261' are supported by the third dielectric layer 22' and the second etch stop layer 23', so that the second bottom electrodes 261' may be prevented from damage during the subsequent processes for manufacturing the stacked capacitor structure. Therefore, compared to the aspect ratio of the capacitors 18 illustrated in FIG. 1, which is limited to up to 7, the aspect ratio of the second capacitor segments (S2) can be increased to, for example, up to 12 without damage, thereby enhancing the capacitance of the second capacitor segments (S2).

Referring to FIG. 2B, the method 100 then proceeds to block 122, where a second trench is formed. Referring to the example illustrated in FIG. 24, a second trench 32' is formed by patterning the fourth dielectric filler 31', one of the second connecting sections 292', a corresponding one of the fourth dielectric sections 282', the second etch stop layer 23', the third dielectric layer 22', and the second dielectric filler 31 using an etching process (for example, but not limited to, a dry etch process) through a patterned photoresist layer (not shown), which may be formed by exposure, baking, developing, and/or other photolithography processes known in the art. The second trench 32' thus formed penetrates through the fourth dielectric filler 31', the one of the second connecting sections 292', the corresponding one of the fourth high-k dielectric sections 282', the second etch stop layer 23', the third dielectric layer 22', and the second dielectric filler 31 to expose a corresponding one of the first connecting sections 292.

Referring to FIG. 2B, the method 100 then proceeds to block 123, where a second vertical interconnect structure is formed. Referring to the examples illustrated in FIGS. 24 to 26, a second vertical interconnect structure 33' is formed by depositing a metallic material to fill the second trench 32' and then removing excess of the metallic material by a planarization technique, such as CMP. In some embodiments, the metallic material may include, for example, but not limited to, cobalt, tungsten, copper, titanium, tantalum, aluminum, zirconium, hafnium, or combinations thereof. Other suitable metallic materials are within the contemplated scope of the present disclosure. In some embodiments, deposition of the metallic material may be conducted by a suitable technique known to those skilled in the art of semiconductor fabrication, for example, but not limited to, ALD, PEALD, or other suitable deposition techniques. In some embodiments, the second vertical interconnect structure 33' extends in a central portion of each of the first and second capacitor sub-structures (C1, C2). The first top electrode 291 and the second top electrode 291' are electrically connected to each other through the second vertical interconnect structure 33'. Specifically, the first top electrode layer 29 and the second top electrode layer 29' are electrically connected to each other through the second vertical interconnect structure 33'. In addition, each of the first bottom electrodes 261 and a corresponding one of the second bottom electrodes 261' are electrically connected to each other through a corresponding one of the first vertical interconnect structures 34.

Referring to FIG. 2B, the method 100 then proceeds to block 124, where a top plate is formed. Referring to the example illustrated in FIG. 27, a top plate 34' is formed on and physically and electrically connected to the second top electrode layer 29' by depositing a photoresist layer on the second top electrode layer 29', patterning the photoresist layer by exposure, baking, developing, and/or other photolithography processes known in the art to form a patterned photoresist layer with pattern openings, depositing a metallic material to fill the pattern openings of the patterned photoresist layer, and removing excess of the metallic material by a planarization technique, such as CMP. The top plate 34' is also physically and electrically connected to the second vertical interconnect structure 33'.

Figure 28:
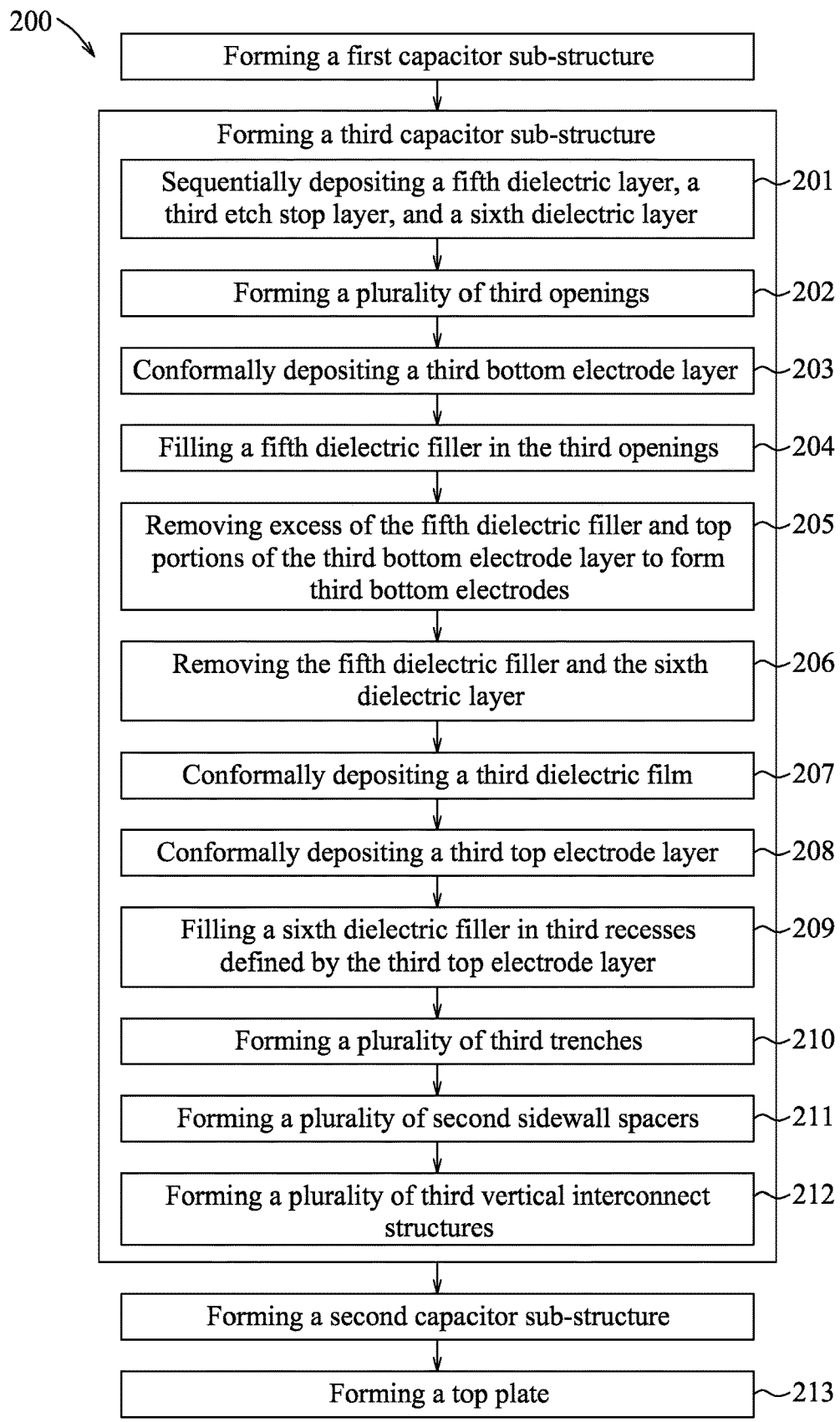
FIG. 28 is a flow diagram illustrating a method for manufacturing a stacked capacitor structure in accordance with some embodiments.
Figure 29:
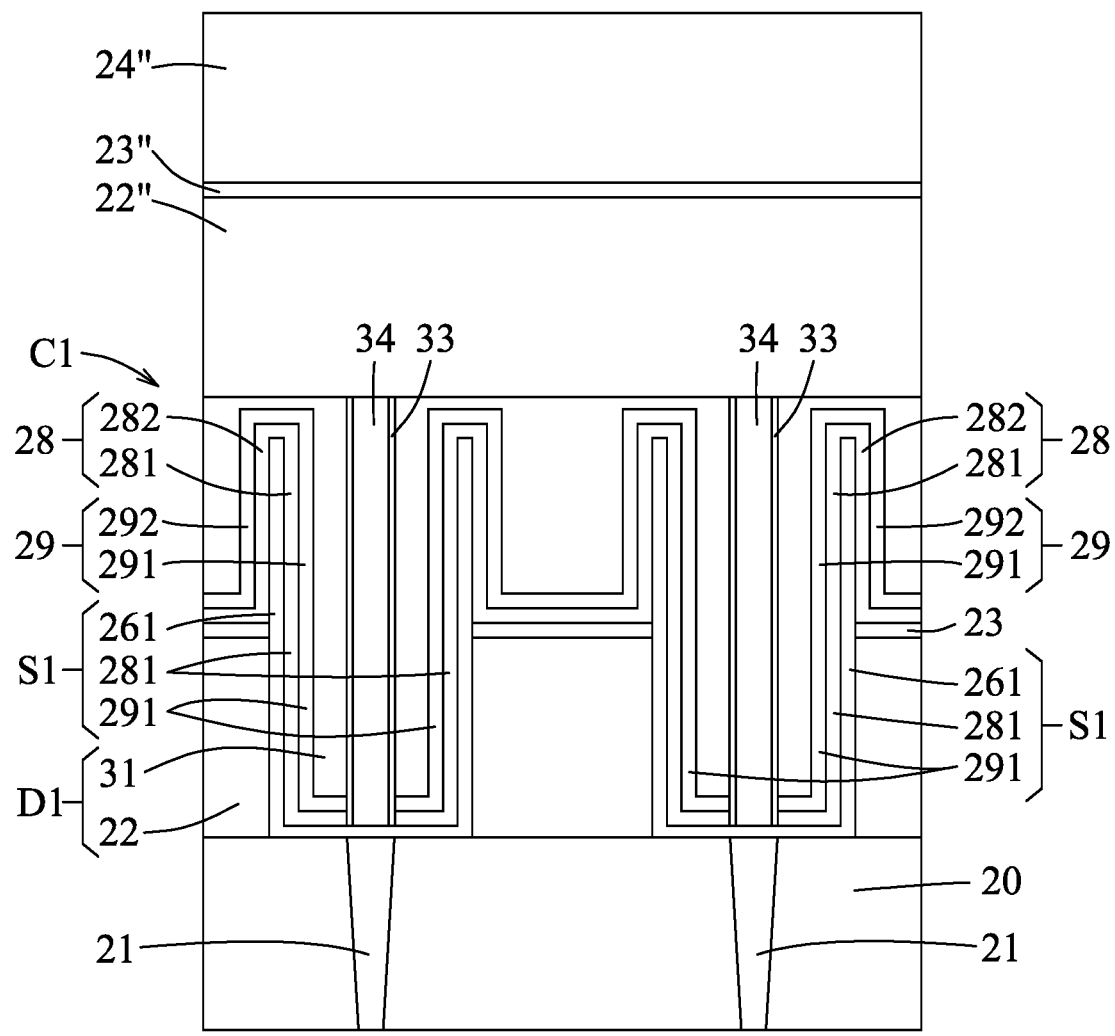
Figure 30:
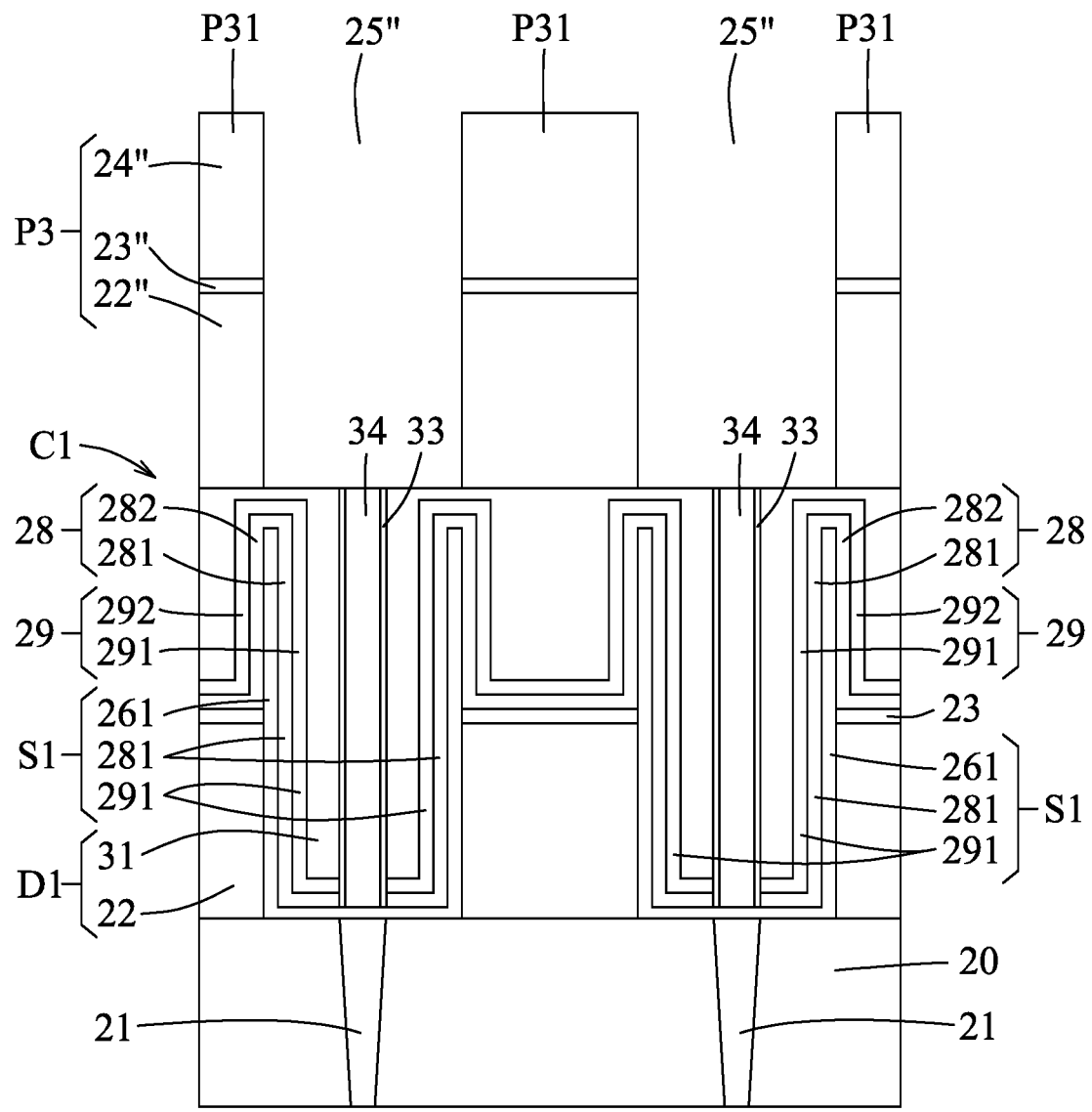
Figure 31:
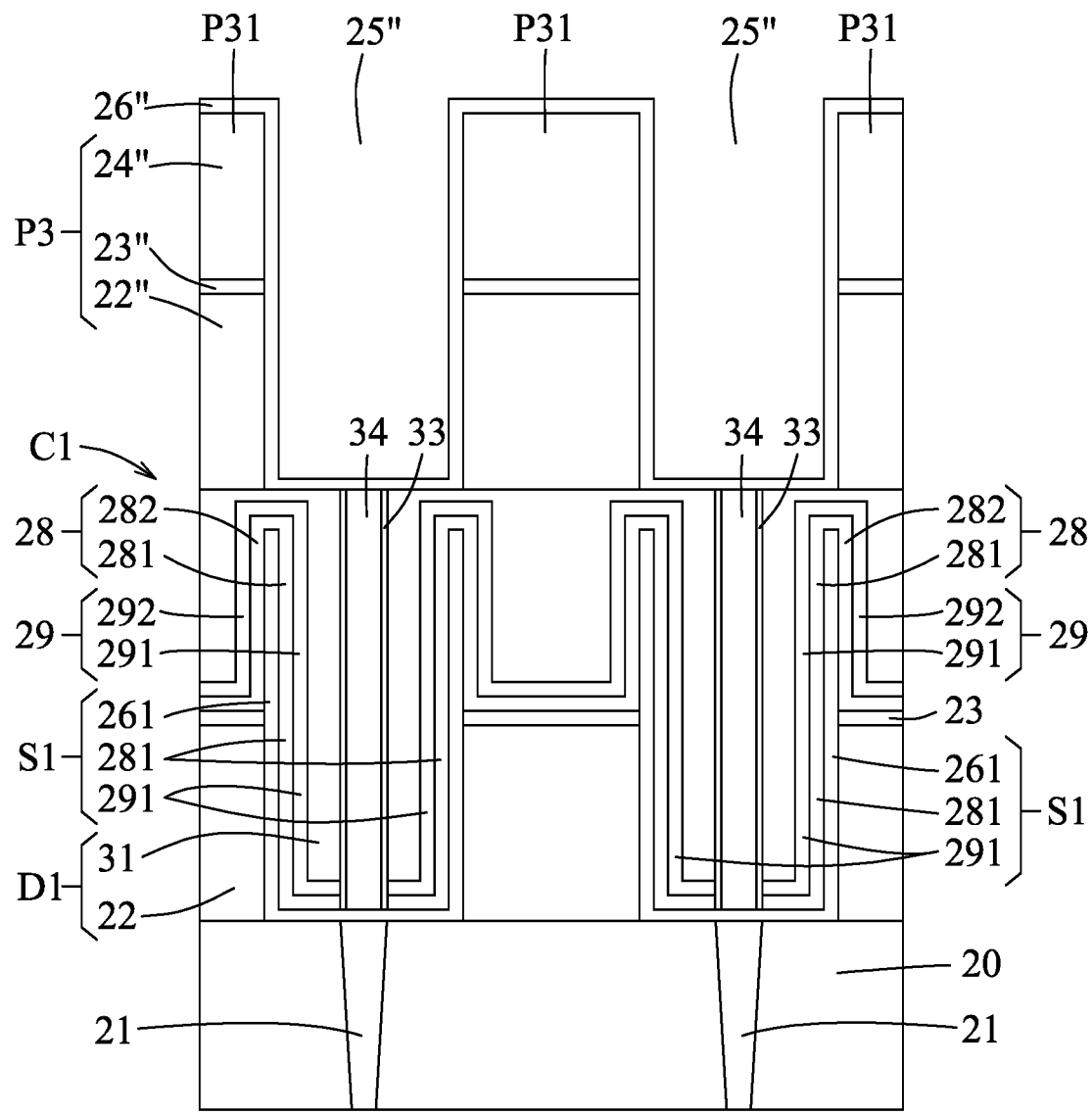
Figure 32:
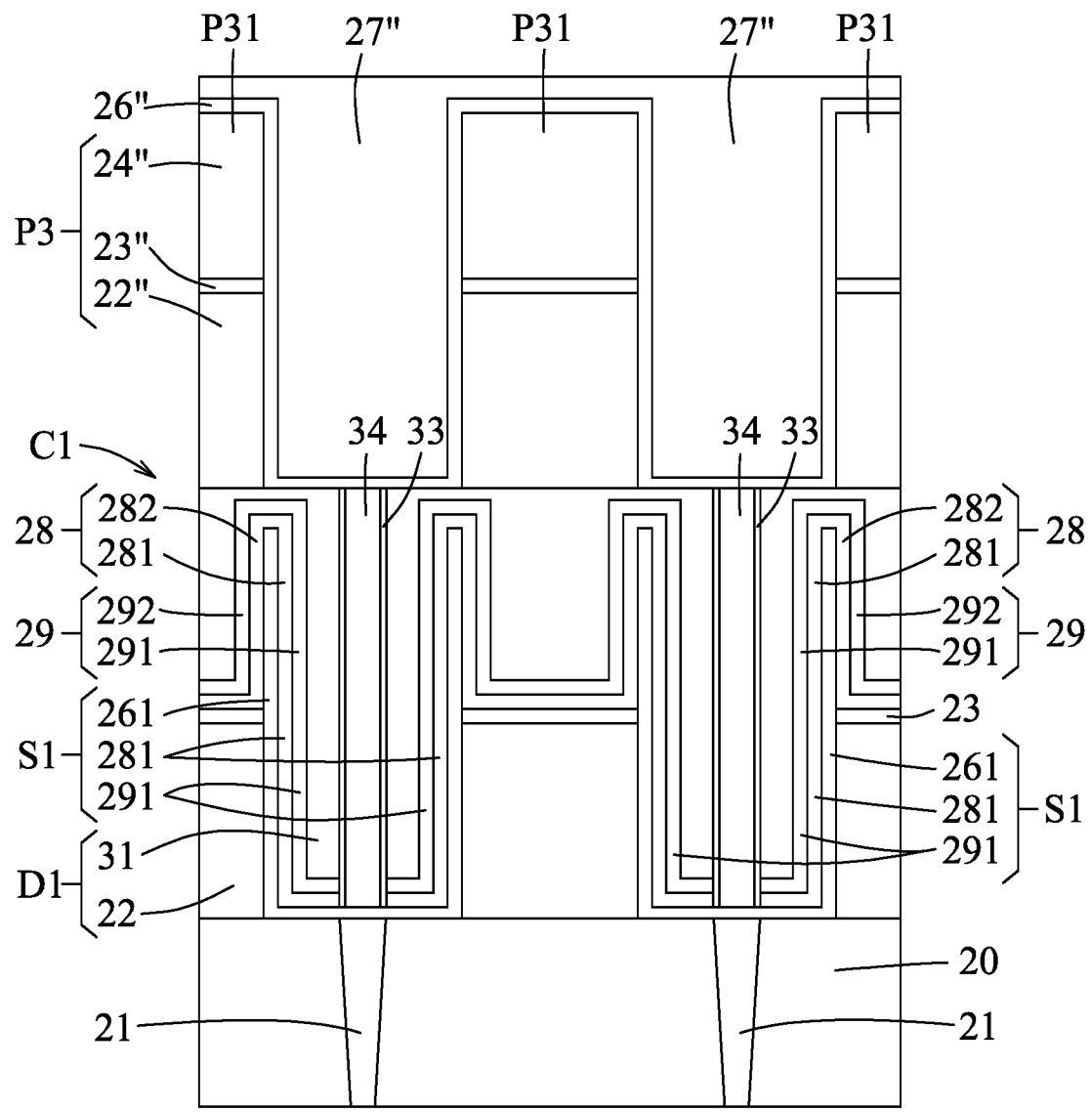
Figure 33:
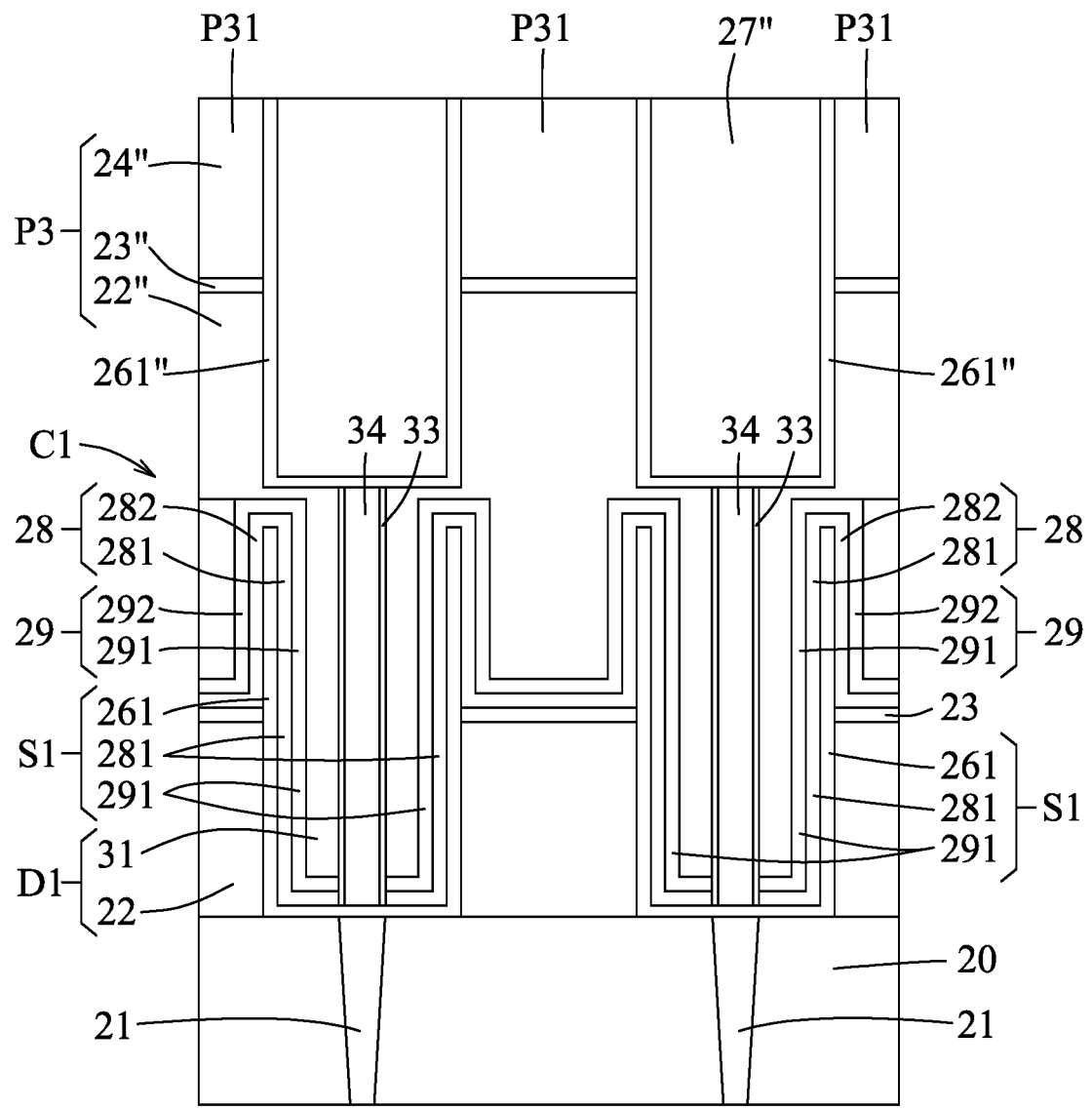
Figure 34:
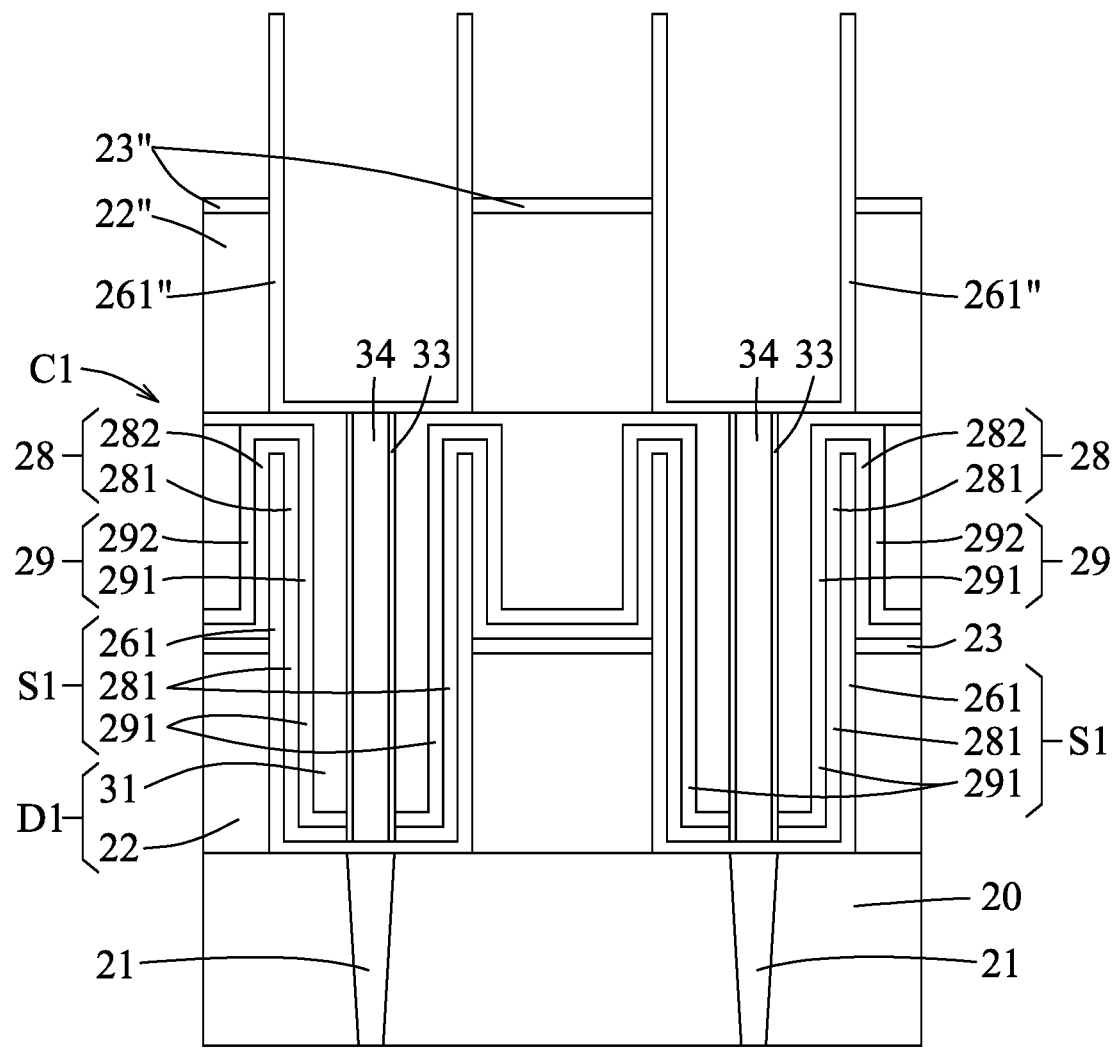
Figure 35:
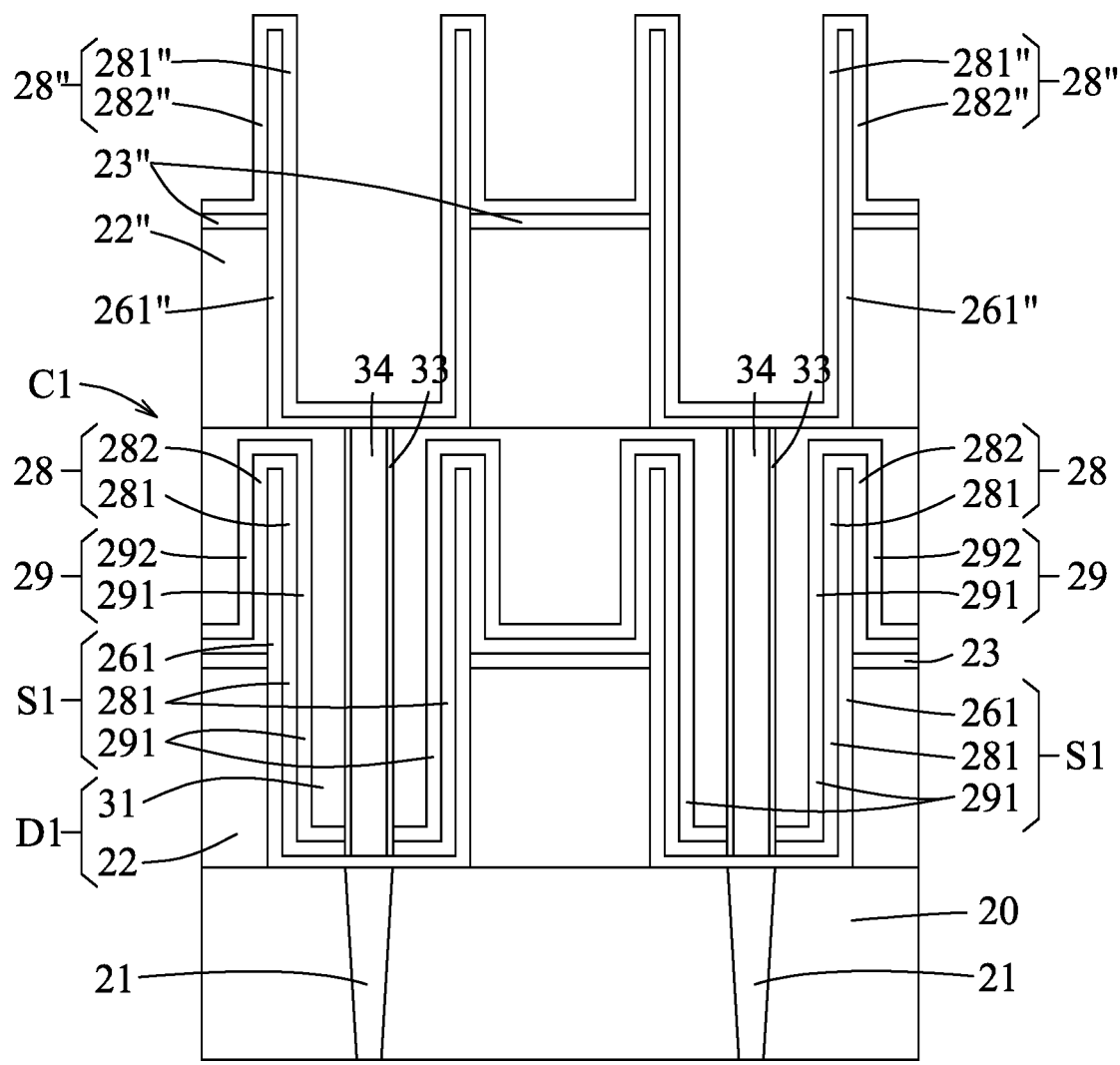
Figure 36:
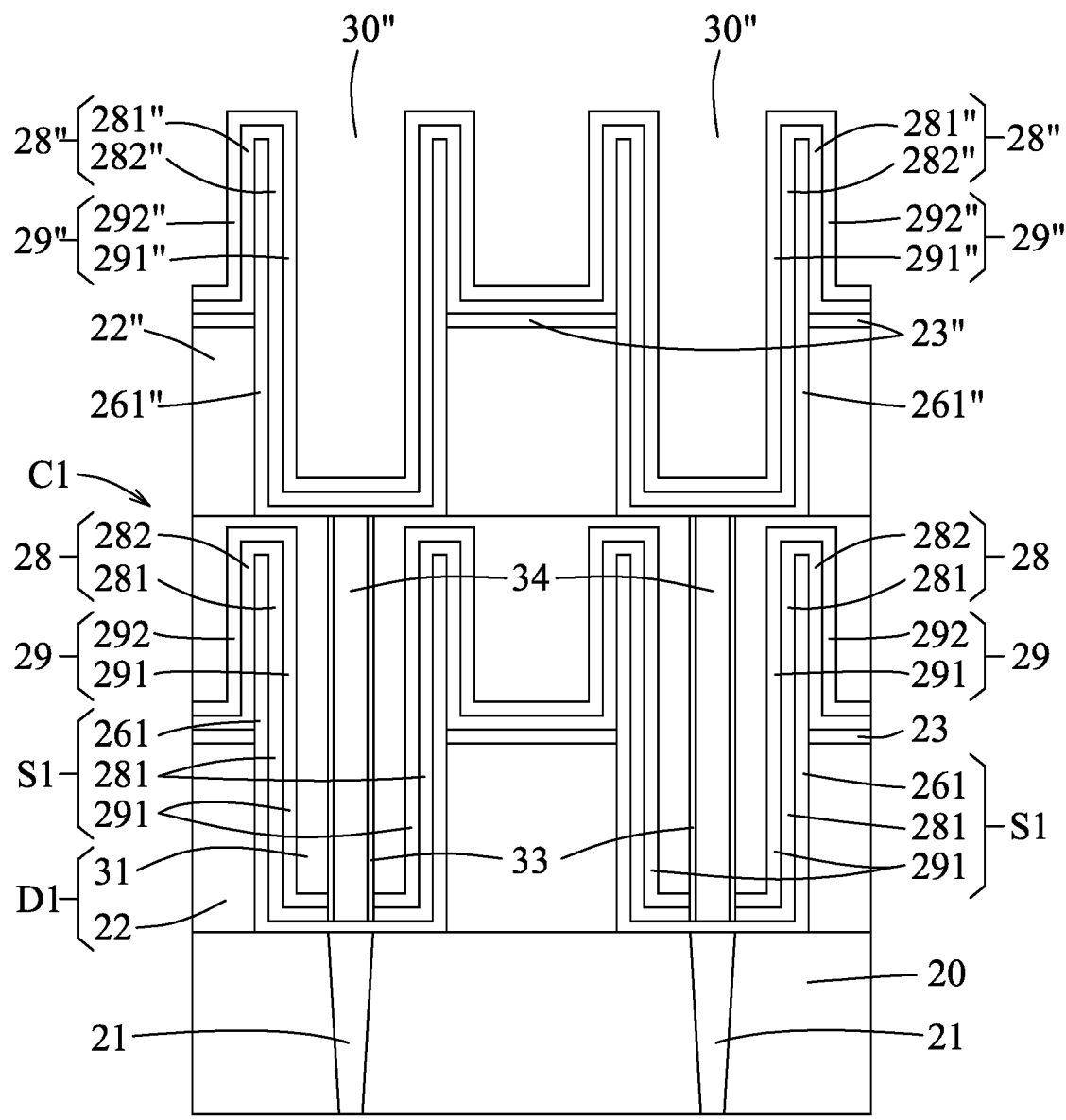
Figure 37:
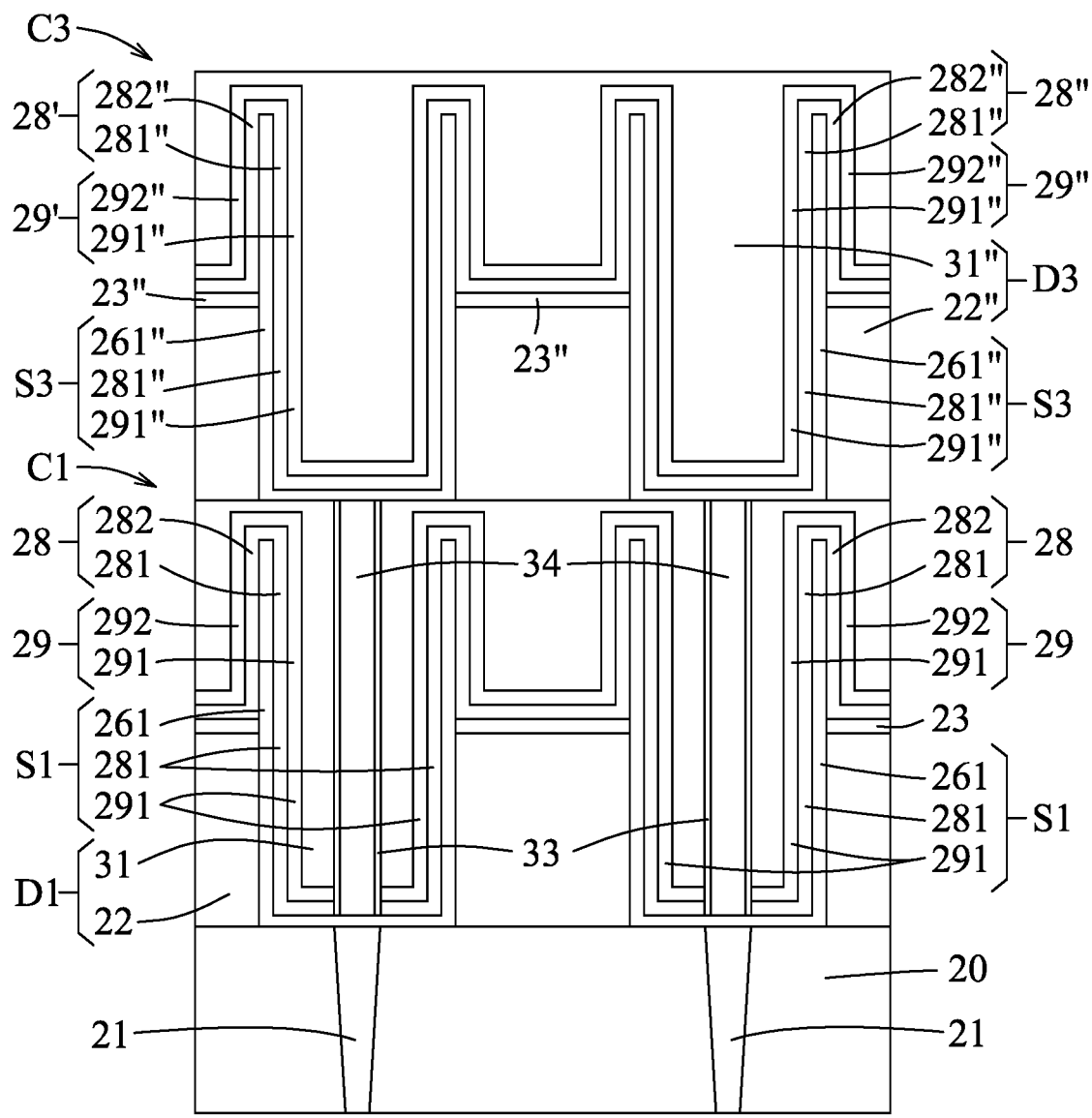
Figure 38:
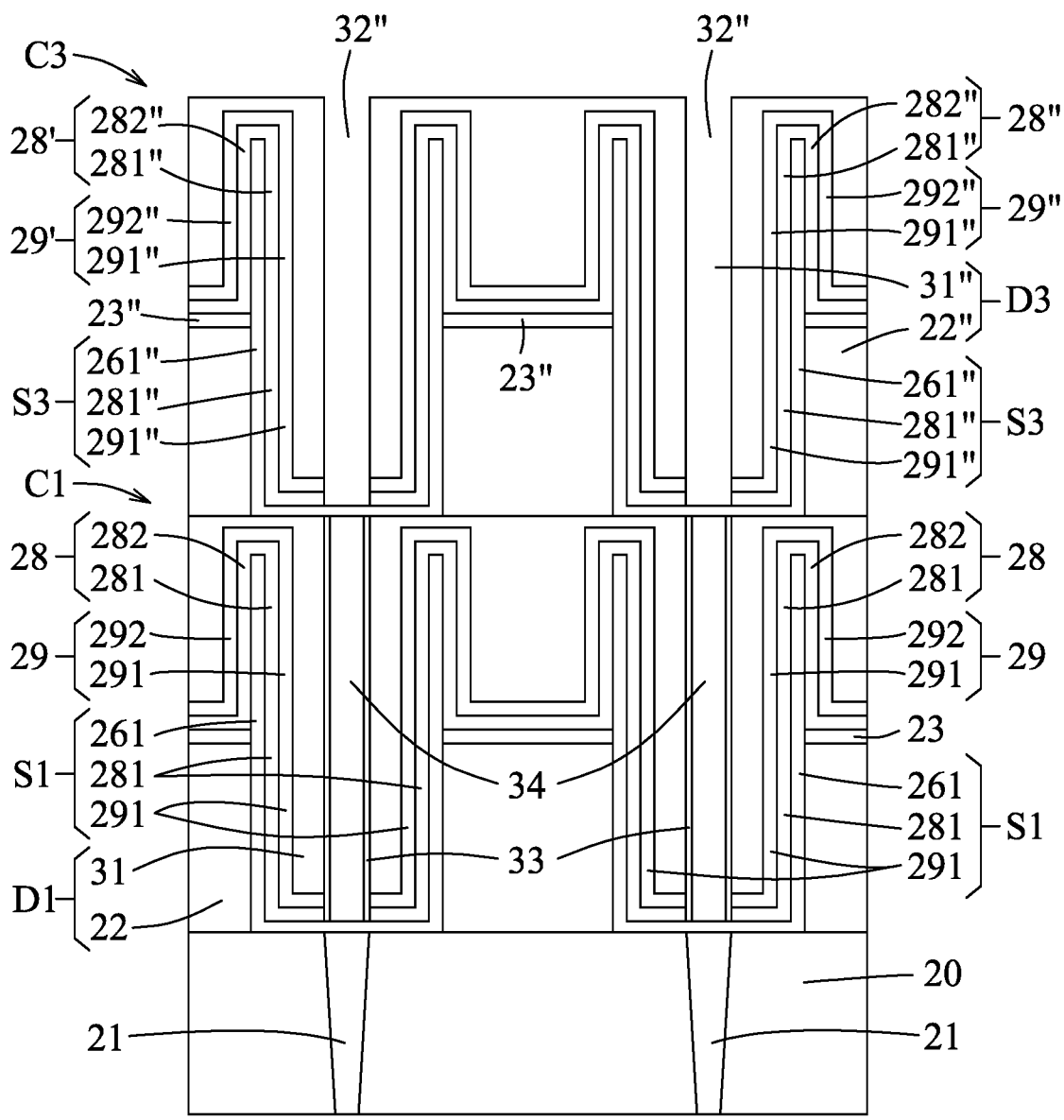
Figure 39:
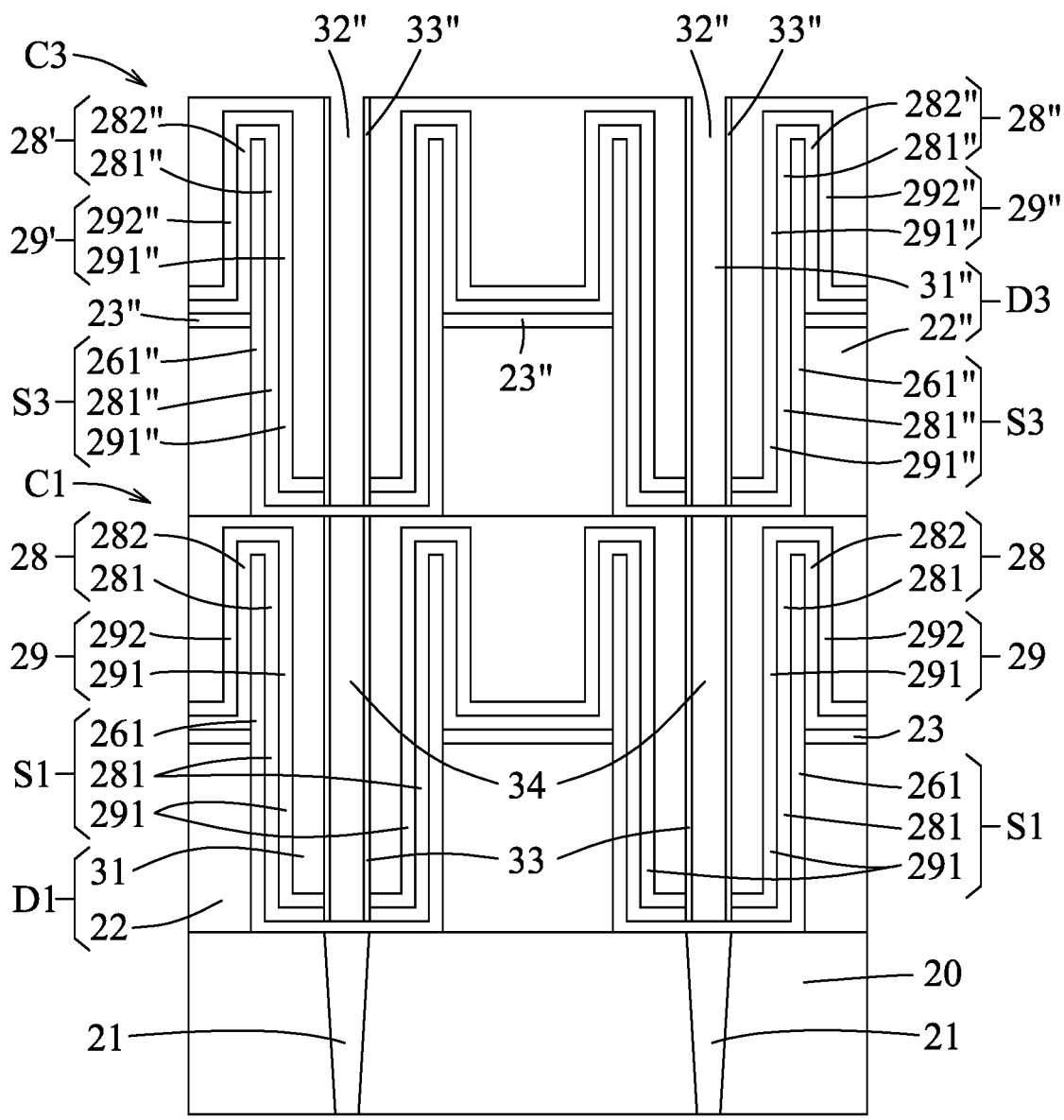
Figure 40:
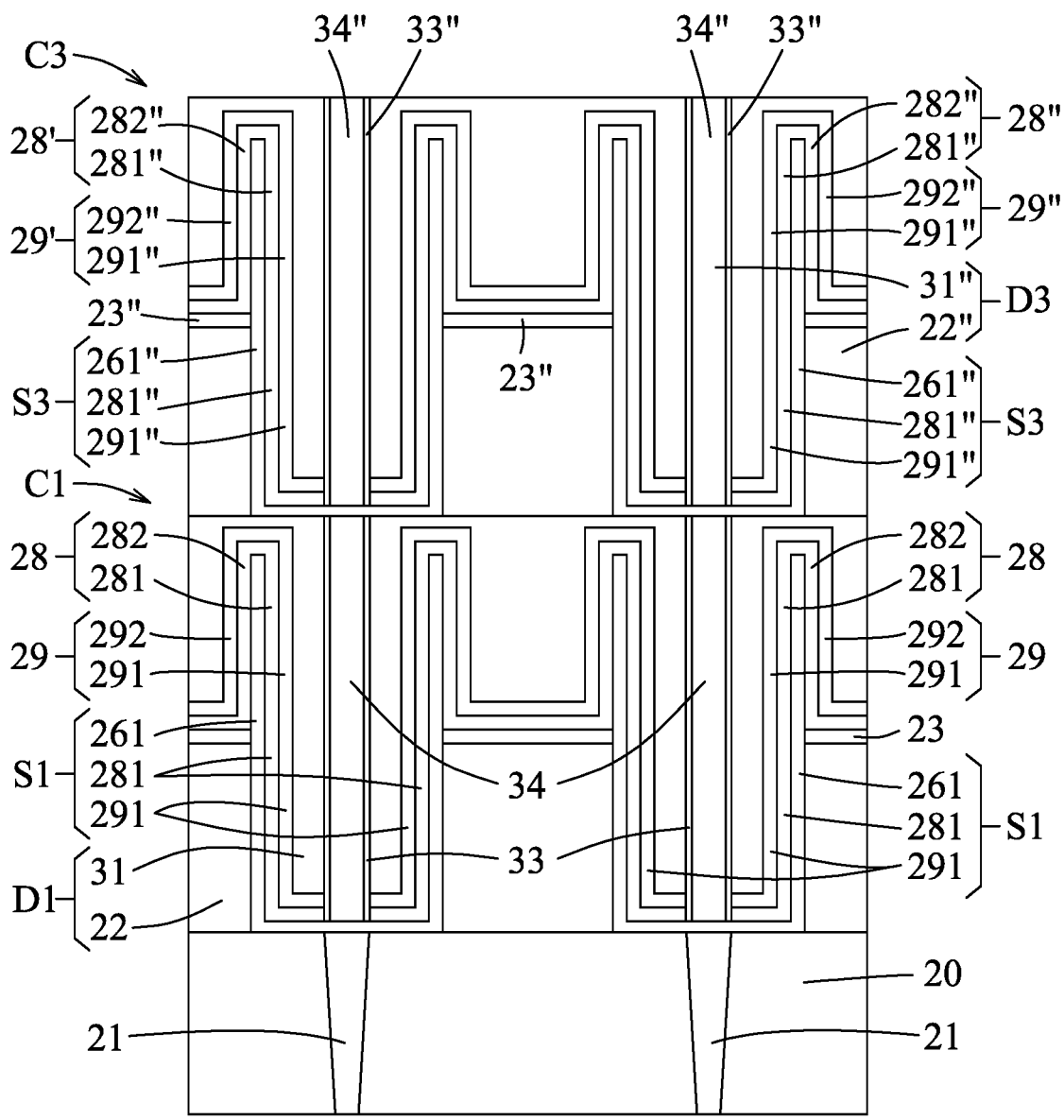

FIG. 28 illustrates a method 200 for manufacturing a stacked capacitor structure in accordance with some embodiments. FIGS. 29 to 43 illustrate schematic views of a stacked capacitor structure during various stages of the method 200 shown in FIG. 28. The method 200 and the stacked capacitor structure are collectively described below. However, additional steps can be provided before, after or during the various stages of the method 200, and some of the steps described herein may be replaced by other steps or be eliminated. Similarly, further additional features may be present in the stacked capacitor structure, and/or features present may be replaced or eliminated in additional embodiments.

Referring to FIG. 28, the method 200 is similar to the method 100 described above with reference to FIG. 2, except a third capacitor sub-structure is formed on the first capacitor sub-structure before the second capacitor sub-structure is formed. The formation of the third capacitor sub-structure begins at block 201, where a fifth dielectric layer, a third etch stop layer, and a sixth dielectric layer are deposited sequentially. Referring to the example illustrated in FIG. 29, a fifth dielectric layer 22", a third etch stop layer 23", and a sixth dielectric layer 24" are deposited sequentially on the first capacitor sub-structure (C1). Details regarding the formation of the fifth dielectric layer 22", the third etch stop layer 23", and the sixth dielectric layer 24" are the same as or similar to those described above for the formation of the first dielectric layer 22, the first etch stop layer 23, and the second dielectric layer 24 with reference to FIG. 3.

Referring to FIG. 28, the formation of the third capacitor sub-structure then proceeds to block 202, where a plurality of third openings are formed. Referring to the examples illustrated in FIGS. 29 and 20, a plurality of third openings 25" are formed to penetrate through the sixth dielectric layer 24", the third etch stop layer 23", and the fifth dielectric layer 22" so that the first vertical interconnect structures 34 are exposed through the third openings 25", respectively. The third openings 25" may be formed by defining a third pattern on the sixth dielectric layer 24", and removing a portion of the sixth dielectric layer layer 24 ", a portion of the third etch stop layer 23", and a portion of the fifth dielectric layer 22", A third patterned structure (P3) is formed accordingly, and includes a plurality of third pillars (P31). Details regarding the formation of the third openings 25" are the same as or similar to those described above for the formation of the first openings 25 with reference to FIG. 12.

Referring to FIG. 28, the formation of the third capacitor sub-structure then proceeds to block 203, where a third bottom electrode layer is conformally deposited. Referring to the example illustrated in FIG. 31, a third bottom electrode layer 26" is conformally deposited over the third patterned structure (P3) to cover the sixth dielectric layer 24", the third etch stop layer 23", the fifth dielectric layer 22", and the first capacitor sub-structure (C1), and is physically and electrically connected to the first vertical interconnect structures 34. Details regarding the formation of the third bottom electrode layer 26" are the same as or similar to those described above for the formation of the first bottom electrode layer 26 with reference to FIG. 5.

Referring to FIG. 28, the formation of the third capacitor sub-structure then proceeds to block 204, where a fifth dielectric filler is filled in the third openings. Referring to the examples illustrated in FIGS. 31 and 32, the third openings 25" defined by the third pillars (P31) are filled with a fifth dielectric filler 27". Details regarding the filling of the fifth dielectric filler 27" are the same as or similar to those described above for the filling of the first dielectric filler 27 with reference to FIGS. 5 and 6.

Referring to FIG. 28, the formation of the third capacitor sub-structure then proceeds to block 205, where excess of the fifth dielectric filler and top portions of the third bottom electrode layer are removed to form third bottom electrodes. Referring to the examples illustrated in FIGS. 32 and 33, excess of the fifth dielectric filler 27" and top portions of the third bottom electrode layer 26" are removed by a planarization technique, such as CMP, to form a plurality of third bottom electrodes 261" spaced apart from each other. Each of the third bottom electrodes 261" has a U-shaped profile with respect to a cross-sectional view.

Referring to FIG. 28, the formation of the third capacitor sub-structure then proceeds to block 206, where the fifth dielectric filler and the sixth dielectric layer are removed. Referring to the examples illustrated in FIGS. 33 and 34, the fifth dielectric filler 27" and the sixth dielectric layer 24" are removed by a wet etch process. Details regarding the removal of the fifth dielectric filler 27" and the sixth dielectric layer 24" are the same as or similar to those described above for the removal of the first dielectric filler 27 and the second dielectric layer 24 with reference to FIGS. 7 and 8. After the fifth dielectric filler 27" and the sixth dielectric layer 24" are removed, the third bottom electrodes 261" are supported by the fifth dielectric layer 22" and the third etch stop layer 23", so that the third bottom electrodes 261" may be prevented from damage during the subsequent processes for manufacturing the stacked capacitor structure.

Referring to FIG. 28, the formation of the third capacitor sub-structure then proceeds to block 207, where a third dielectric film is conformally deposited. Referring to the examples illustrated in FIG. 35, a third dielectric film 28", for example, but not limited to, a high-k dielectric film, is conformally deposited over the third bottom electrodes 261" to cover the third bottom electrodes 261" and the third etch stop layer 23". Details regarding the formation of the third dielectric film 28" are the same as or similar to those described above for the formation of the first dielectric film 28 with reference to FIG. 9. The third dielectric film 28" includes a plurality of fifth dielectric sections 281" conformally disposed on the third bottom electrodes 261", respectively, and a plurality of sixth dielectric sections 282" disposed on the third etch stop layer 23". The fifth and sixth dielectric sections 281", 282" alternate with each other and are connected to each other to form the third dielectric film 28".

Referring to FIG. 28, the formation of the third capacitor sub-structure then proceeds to block 208, where a third top electrode layer is conformally deposited. Referring to the example illustrated in FIG. 36, a third top electrode layer 29" is conformally deposited over and covers the third high-k dielectric layer 28". Details regarding the formation of the third top electrode layer 29" are the same as or similar to those described above for the formation of the first top electrode layer 29 with reference to FIG. 10. The third top electrode layer 29" includes a plurality of third top electrodes 291" conformally disposed on the fifth dielectric sections 281", and a plurality of third connecting sections 292" conformally disposed on the sixth dielectric sections 282". The third top electrodes 291" and the third connecting sections 292" alternate with each other, and are connected to each other to form the third top electrode layer 29".

Referring to FIG. 28, the formation of the third capacitor sub-structure then proceeds to block 209, where a sixth dielectric filler is filled in third recesses defined by the third top electrode layer. Referring to the examples illustrated in FIGS. 36 and 37, the third recesses 30" defined by the third top electrode layer 29" are filled with a sixth dielectric filler 31". Details regarding the filling of the sixth dielectric filler 31" are the same as or similar to those described above for the filling of the second dielectric filler 31 with reference to FIG. 11. Excess of the sixth dielectric filler 31" over the third top electrode layer 29" is removed by a planarization technique, such as CMP, to form a third capacitor sub-structure (C3) on the first capacitor sub-structure (C1). The third capacitor sub-structure (C3) includes a third insulating layer (D3) and a plurality of third capacitor segments (S3) disposed in the third insulating layer (D3). The third insulating layer (D3) is formed from the fifth dielectric layer 22" and the sixth dielectric filler 31". Each of the third capacitor segments (S3) includes one of the third bottom electrodes 261", a corresponding one of the fifth dielectric sections 281" conformally disposed on the one of the third bottom electrodes 261", and a corresponding one of the third top electrodes 291" that is conformally disposed on the corresponding one of the fifth dielectric sections 281" and that is isolated from the one of the third bottom electrodes 261" by the corresponding one of the fifth dielectric sections 281". In two adjacent ones of the third capacitor segments (S2), the third bottom electrodes 261" are spaced apart from each other, and the third top electrodes 291" are connected to each other through a corresponding one of the third connecting sections 292". The third etch stop layer 23" is disposed on the fifth dielectric layer 22" to define each of the third bottom electrodes 261" into a lower portion inserted in the fifth dielectric layer 22" and an upper portion extending away from the lower portion and penetrating through the third etch stop layer 23". A height ratio value of the lower portion to the upper portion of each of the third bottom electrodes 261" ranges from about 3/7 to about 7/3. As described above, after the fifth dielectric filler 27" and the sixth dielectric layer 24" are removed, the third bottom electrodes 261" are supported by the fifth dielectric layer 22" and the third etch stop layer 23", so that the third bottom electrodes 261" may be prevented from damage during the subsequent processes for manufacturing the stacked capacitor structure. Therefore, compared to the aspect ratio of the capacitors 18 illustrated in FIG. 1, which is limited to up to 7, the aspect ratio of the third capacitor segments (S3) can be increased to, for example, up to 12 without damage, thereby enhancing the capacitance of the third capacitor segments (S3).

Referring to FIG. 28, the formation of the third capacitor sub-structure then proceeds to block 210, where a plurality of third trenches are formed. Referring to the example illustrated in FIG. 38, a plurality of third trenches 32" are formed by patterning the sixth dielectric filler 31", the third top electrodes 291", and the fifth dielectric sections 281" using an etching process (for example, but not limited to, a dry etch process) through a patterned photoresist layer (not shown), which may be formed by exposure, baking, developing, and/or other photolithography processes known in the art. Each of the third trenches 32" thus formed penetrates through the sixth dielectric filler 31", a corresponding one of the third top electrodes 291", and a corresponding one of the fifth dielectric sections 281" to expose a corresponding one of the third bottom electrodes 261".

Referring to FIG. 28, the formation of the third capacitor sub-structure then proceeds to block 211, where a plurality of second sidewall spacers are formed. Referring to the example illustrated in FIG. 39, a plurality of second sidewall spacers 33" are formed to laterally cover the sixth dielectric filler 31" and to extend downwardly to the third bottom electrodes 261". Details regarding the formation of the second sidewall spacers 33" are the same as or similar to those described above for the formation of the first sidewall spacers 33 with reference to FIG. 13.

Referring to FIG. 28, the formation of the third capacitor sub-structure then proceeds to block 212, where a plurality of third vertical interconnect structures are formed. Referring to the examples illustrated in FIGS. 39 and 40, a plurality of third vertical interconnect structures 34" are formed by depositing a metallic material to fill the third trenches 32" and then removing excess of the metallic material by a planarization technique, such as CMP. Details regarding the formation of the third vertical interconnect structures 34" are the same as or similar to those described above for the formation of the first vertical interconnect structures 34 with reference to FIG. 14.

Referring to FIG. 28 after formation of the third capacitor sub-structure, the second capacitor sub-structure is formed on the third capacitor sub-structure. Details regarding the formation of the second capacitor sub-structure (C2) are the same as or similar to those described above for the formation of the second capacitor sub-structure (C2) with reference to FIGS. 15 to 26 except the followings.

Figure 41:
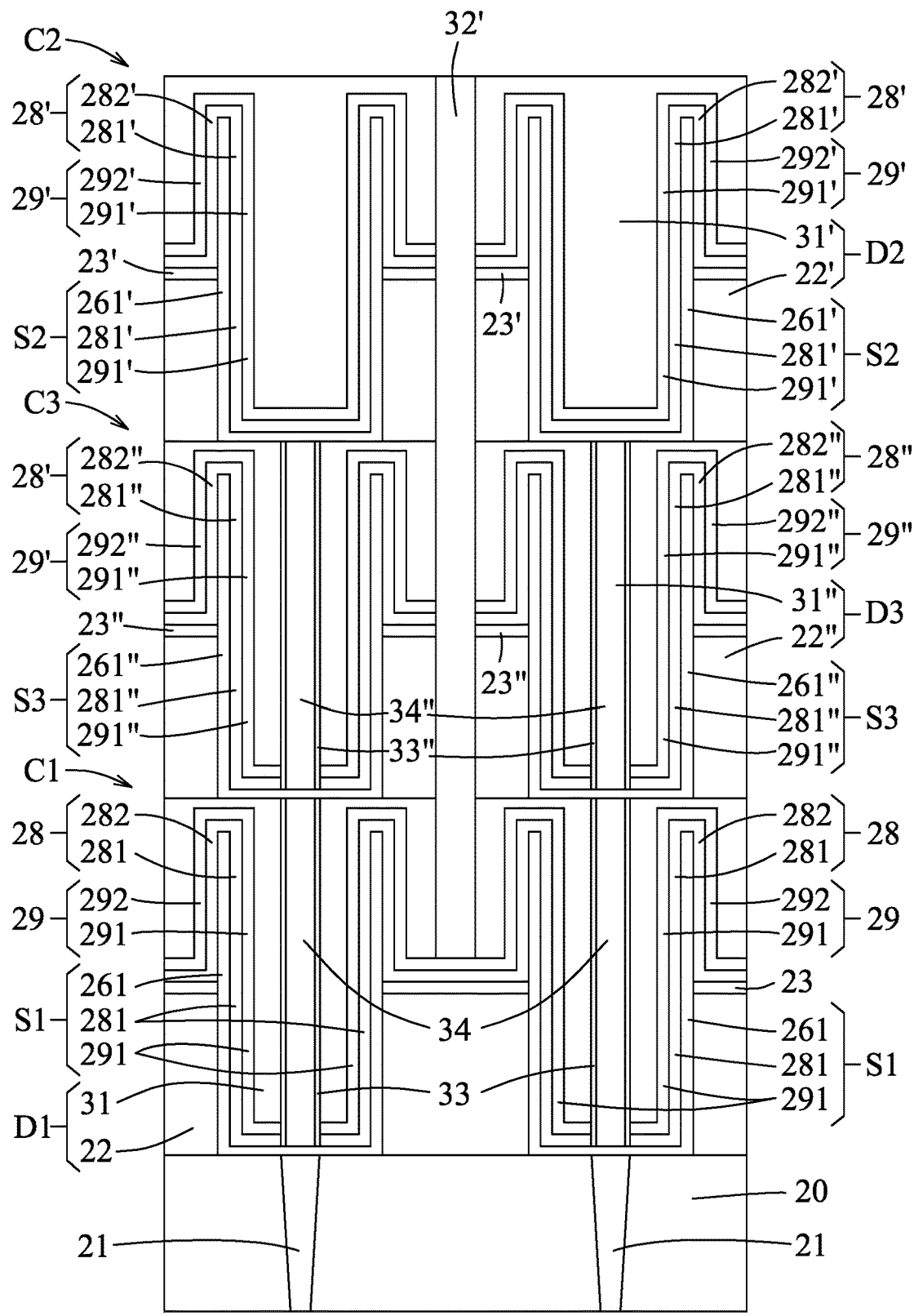
Figure 41:
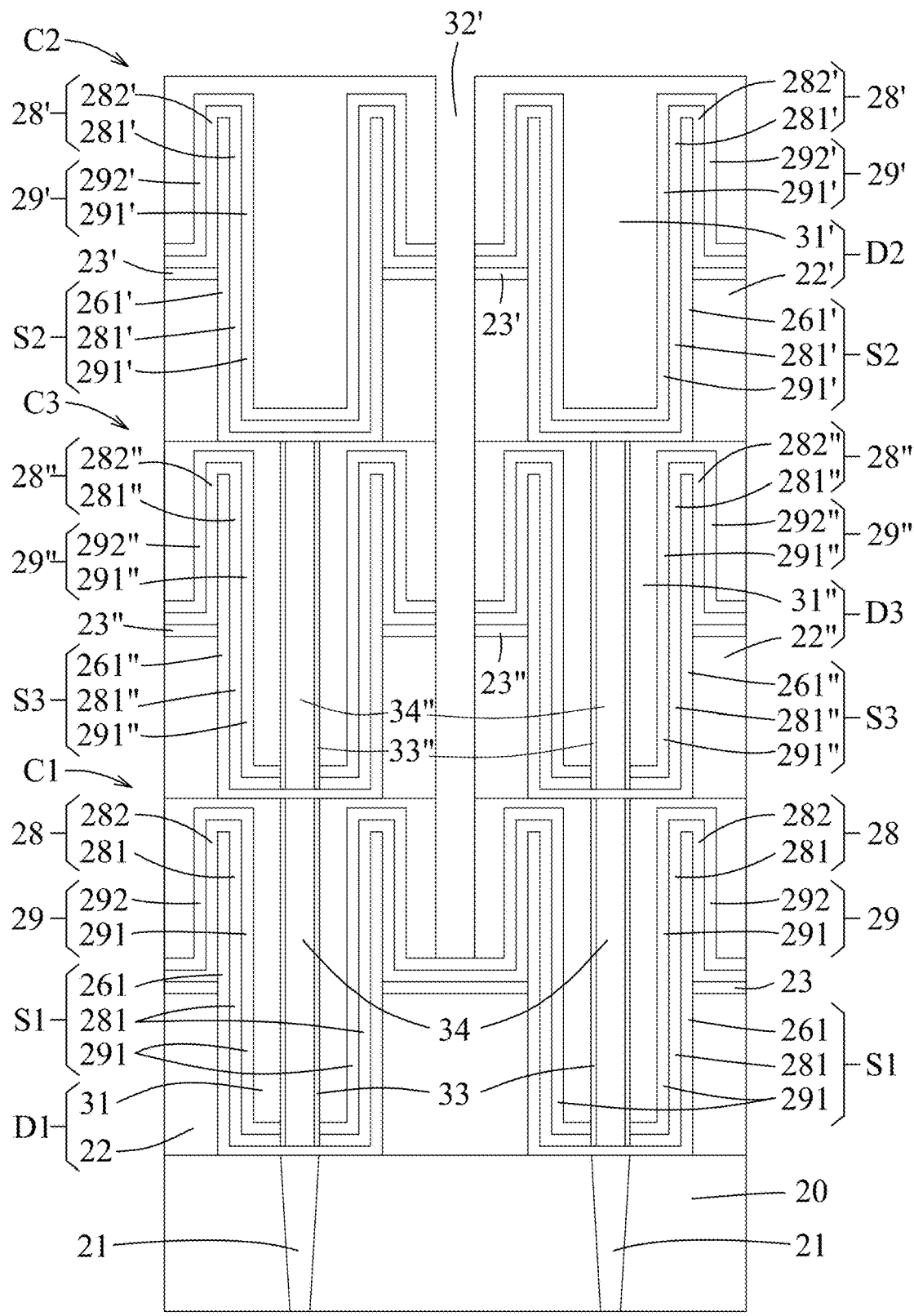

Referring to the example illustrated in FIG. 41, the second trench 32' is formed by patterning the fourth dielectric filler 31', one of the second connecting sections 292', a corresponding one of the fourth dielectric sections 282', the second etch stop layer 23', the third dielectric layer 22', the sixth dielectric filler 31", a corresponding one of the third connecting sections 292", a corresponding one of the sixth dielectric sections 282", the third etch stop layer 23", the fifth dielectric layer 22", and the second dielectric filler 31 using an etching process (for example, but not limited to, a dry etch process) through a patterned photoresist layer (not shown), which may be formed by exposure, baking, developing, and/or other photolithography processes known in the art. The second trench 32' thus formed penetrates through the fourth dielectric filler 31', the one of the second connecting sections 292', the corresponding one of the fourth dielectric sections 282', the second etch stop layer 23', the third dielectric layer 22', the sixth dielectric filler 31", the corresponding one of the third connecting sections 292", the corresponding one of the sixth dielectric sections 282", the third etch stop layer 23", the fifth dielectric layer 22", and the second dielectric filler 31 to expose a corresponding one of the first connecting sections 292.

Figure 43:
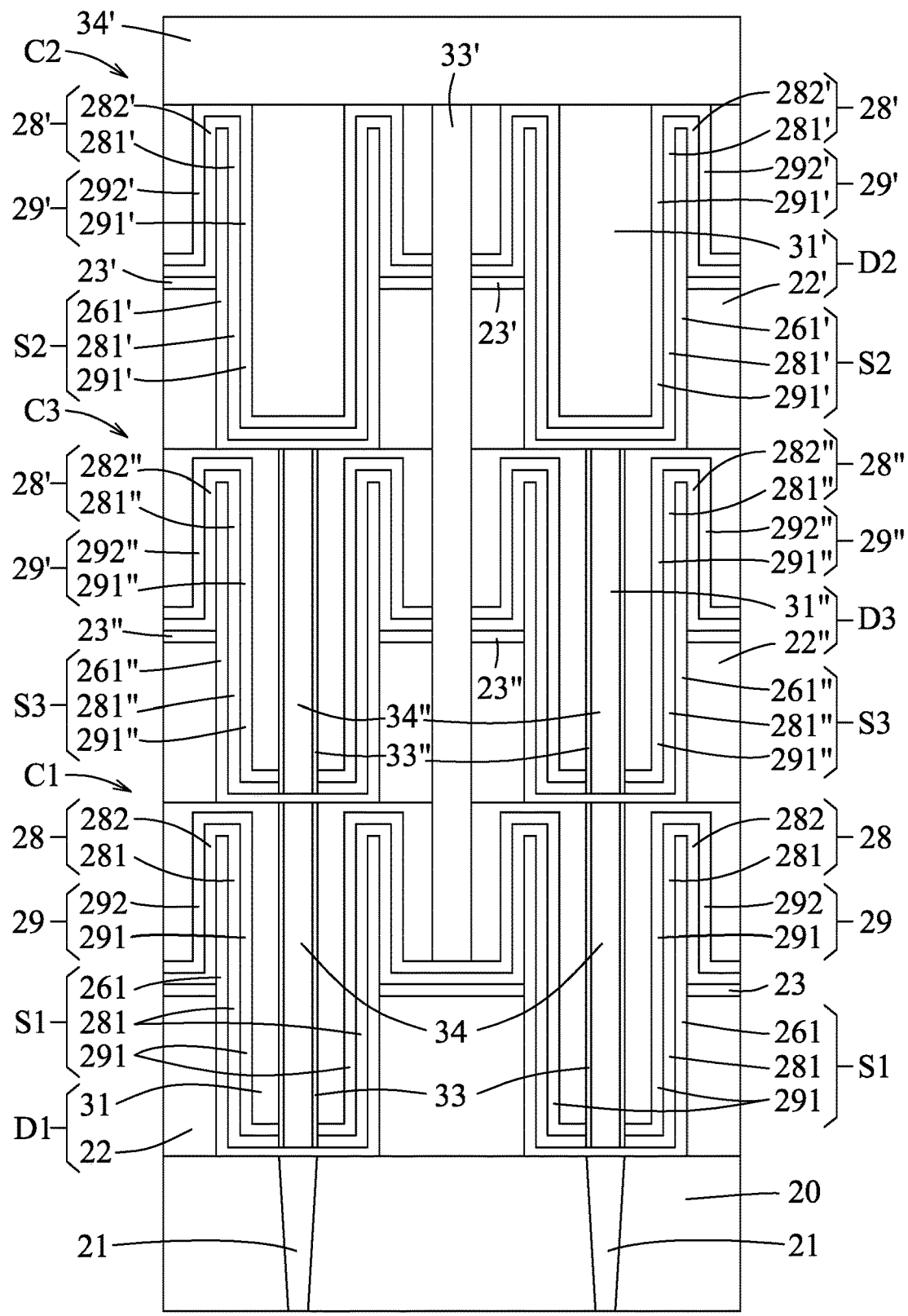
Figure 44:
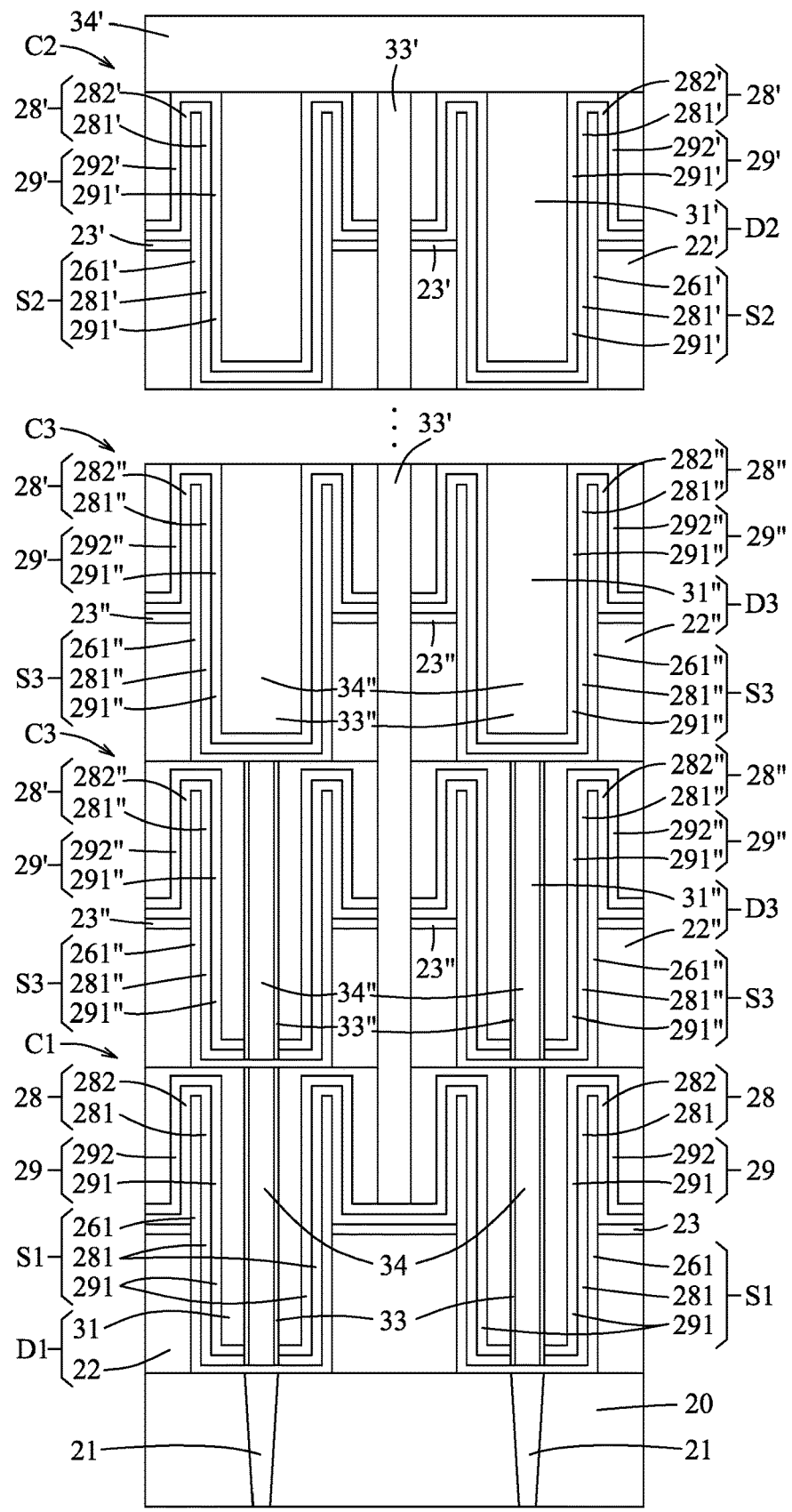
FIG. 44 illustrates a schematic view of a stacked capacitor structure in accordance with some embodiments.

Referring to the examples illustrated in FIGS. 42 to 44, the second vertical interconnect structure 33' is formed by depositing a metallic material to fill the trenches 32' and then removing excess of the metallic material by a planarization technique, such as CMP, so that the first top electrode layer 29, the second top electrode layer 29', and the third top electrode layer 29" are electrically connected to each other through the second vertical interconnect structure 33'. In addition, each of the first bottom electrodes 261, a corresponding one of the third bottom electrodes 261", and a corresponding one of the second bottom electrodes 261' are electrically connected to each other through a corresponding one of the first vertical interconnect structures 34 and a corresponding one of the third vertical interconnect structures 34".

Referring to the example illustrated in FIG. 43, the top plate 34' is then formed on and physically and electrically connected to the second top electrode layer 29'. Details regarding the formation of the top plate 34' are the same as or similar to those described above for the formation of the top plate 34' with reference to FIG. 27.

Figure 45:
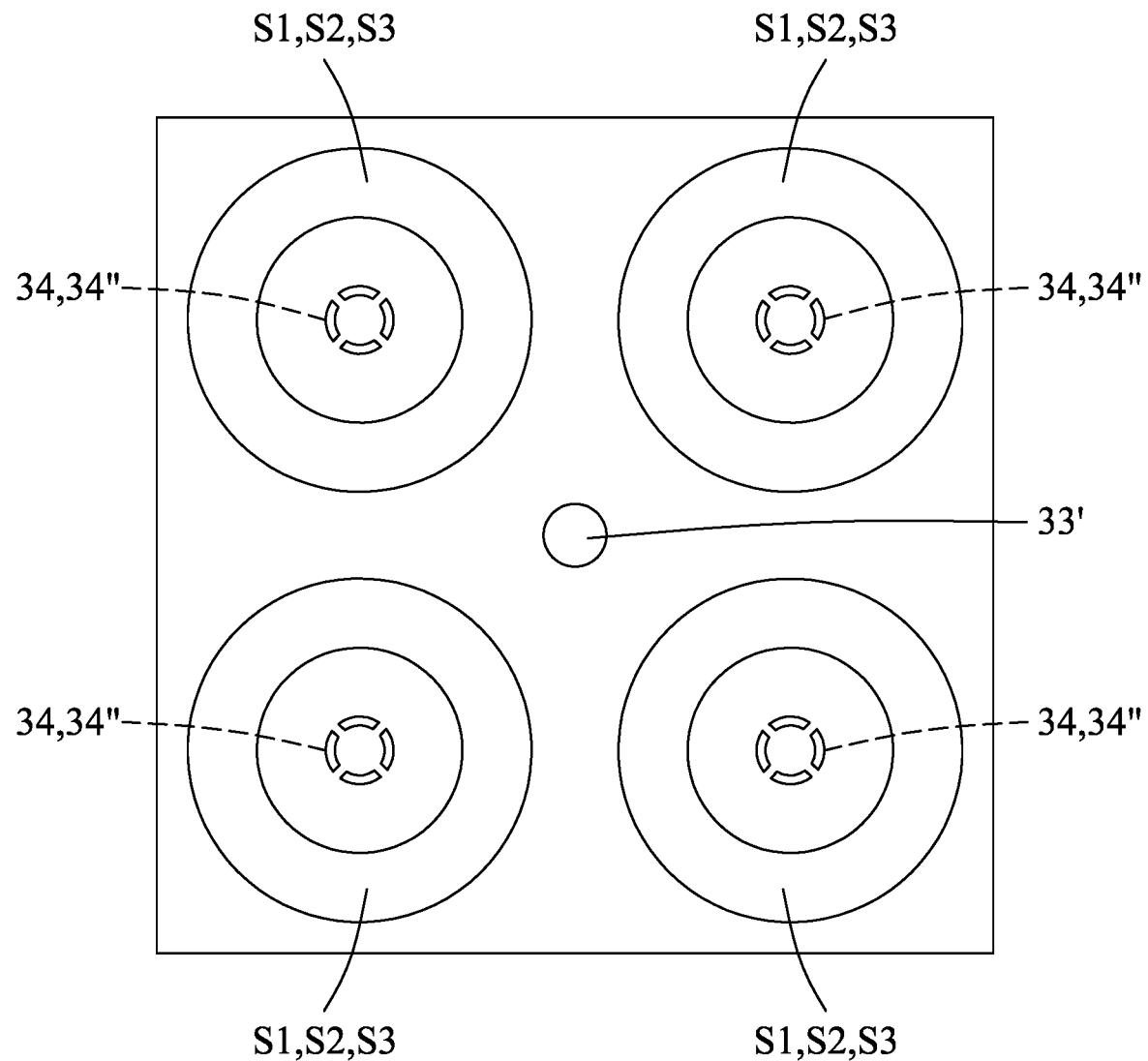
FIG. 45 illustrates a schematic plan view of a stacked capacitor structure in accordance with some embodiments.
Figure 46:
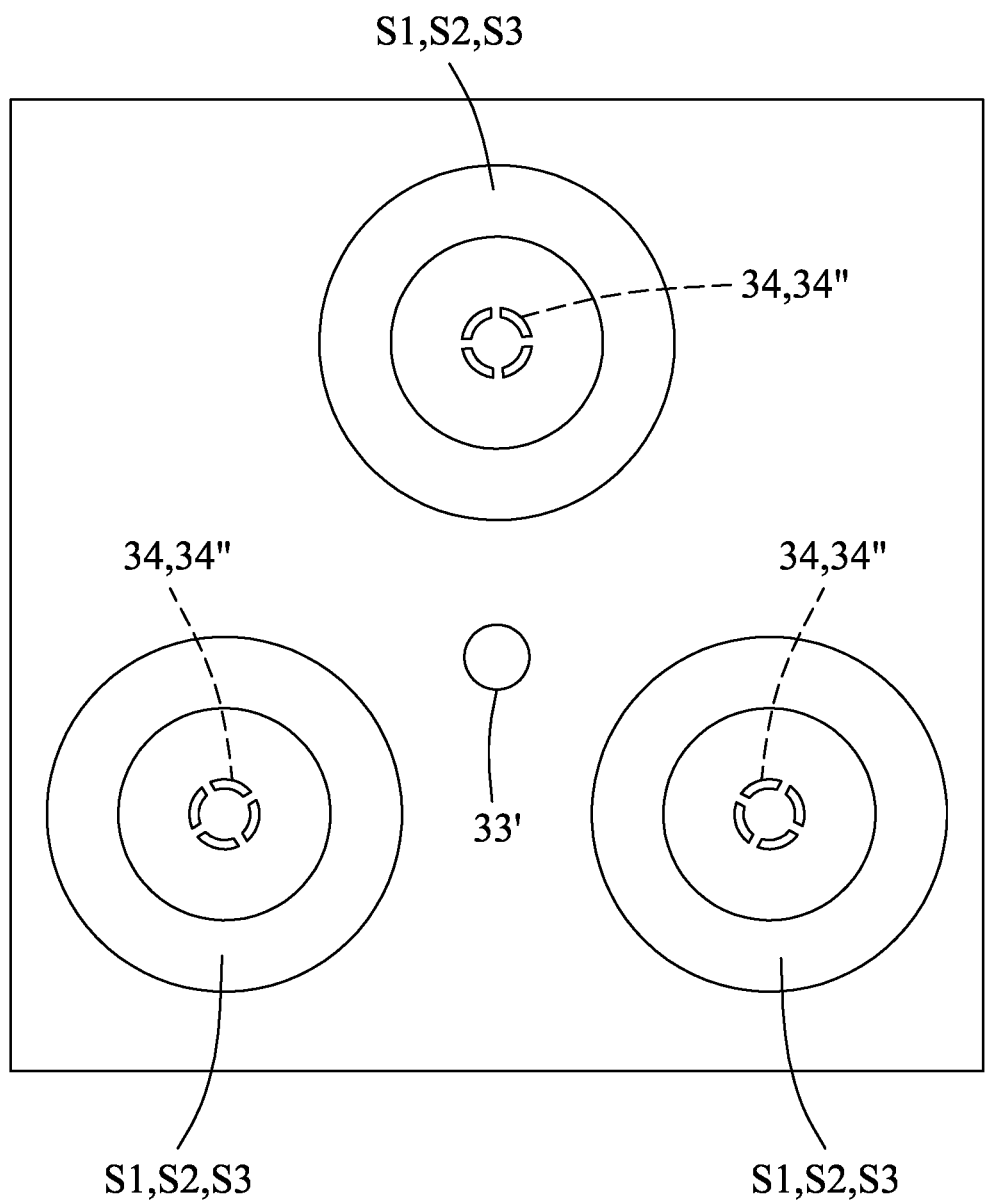
FIG. 46 illustrates a schematic plan view of a stacked capacitor structure in accordance with some embodiments.

Referring to the examples illustrated in FIGS. 42, 45 and 46, in some embodiments, the second vertical interconnect structure 33' extends in a central portion of each of the first, second, and third capacitor sub-structures (C1, C2, C3), and various arrangements of the first, second, and third capacitor segments (S1, S2, S3) may be designed according to specific requirement for the stacked capacitor structure. For example, the second vertical interconnect structure 33' may be surrounded by three (as illustrated in FIG. 46), four (as illustrated in FIG. 45), or more of the first, second, and third capacitor sub-structures (C1, C2, C3).

Referring to the example illustrated in FIG. 44, in some embodiments, two or more of the third capacitor sub-structures (C3) may be formed between the first and second capacitor sub-structures (C1, C2).

As described above, in the present disclosure, after a dielectric filler and a dielectric layer are removed during a method for manufacturing a stacked capacitor structure in accordance with some embodiments, bottom electrodes thus formed are supported by another dielectric layer and an etch stop layer disposed below the dielectric layer, so that the bottom electrodes may be prevented from damage during the subsequent processes of the method for manufacturing the stacked capacitor structure. Therefore, the aspect ratio of each of the capacitor segments in the capacitor sub-structures of the stacked capacitor structure can be increased, thereby enhancing the capacitance of the stacked capacitor structure.

In accordance with some embodiments of the present disclosure, a method for manufacturing a stacked capacitor structure includes: forming a first patterned structure over a substrate; forming a first bottom electrode over the first patterned structure; depositing a first dielectric film over the first bottom electrode; depositing a first top electrode layer over the first dielectric film; forming a first vertical interconnect structure extending from the first bottom electrode; forming a second patterned structure over the first top electrode layer; forming a second bottom electrode over the second patterned structure, wherein the second bottom electrode is electrically connected to the first bottom electrode through the first vertical interconnect structure; depositing a second dielectric film over the second bottom electrode; depositing a second top electrode layer over the second dielectric film; and forming a second vertical interconnect structure extending from the first top electrode layer, wherein the second top electrode layer is electrically connected to the first top electrode layer through the second vertical interconnect structure.

In accordance with some embodiments of the present disclosure, forming the first patterned structure includes: sequentially depositing a first dielectric layer, a first etch stop layer, and a second dielectric layer over the substrate; defining a first pattern on the second dielectric layer; and removing a portion of the second dielectric layer, a portion of the first etch stop layer, and a portion of the first dielectric layer to form a plurality of first pillars.

In accordance with some embodiments of the present disclosure, forming the first bottom electrode includes: depositing a first bottom electrode layer over the first patterned structure; filling a first dielectric filler in a first opening defined by two adjacent ones of the first pillars; and removing excess of the first dielectric filler and top portions of the first bottom electrode layer over the first pillars.

In accordance with some embodiments of the present disclosure, forming the first vertical interconnect structure including: filling a second dielectric filler in a first recess defined by the first top electrode layer; forming a first trench penetrating through the second dielectric filler, the first top electrode layer, and the first dielectric film to expose the first bottom electrode; and filling a metallic material in the first trench.

In accordance with some embodiments of the present disclosure, forming the second patterned structure includes: sequentially depositing a third dielectric layer, a second etch stop layer, and a fourth dielectric layer over the first top electrode layer; defining a second pattern on the fourth dielectric layer; and removing a portion of the fourth dielectric layer, a portion of the second etch stop layer, and a portion of the third dielectric layer to form a plurality of second pillars.

In accordance with some embodiments of the present disclosure, forming the second bottom electrode includes: depositing a second bottom electrode layer over the second patterned structure; filling a third dielectric filler in a second opening defined by two adjacent ones of the second pillars; and removing excess of the third dielectric filler and top portions of the second bottom electrode layer over the second pillars.

In accordance with some embodiments of the present disclosure, forming the second vertical interconnect structure includes: filling a fourth dielectric filler in a second recess defined by the second top electrode layer; forming a second trench penetrating through the fourth dielectric filler, the second top electrode layer, the second dielectric film, the second etch stop layer, the third dielectric layer, and the second dielectric filler to expose the first top electrode layer; and filling a metallic material in the second trench.

In accordance with some embodiments of the present disclosure, the method for manufacturing a stacked capacitor structure further includes, prior to forming the second patterned structure over the first top electrode layer: forming a third patterned structure over the first top electrode layer; forming a third bottom electrode over the third patterned structure; depositing a third dielectric film over the third bottom electrode; depositing a third top electrode layer over the third dielectric film, wherein the first, second, and third top electrode layers are electrically connected to each other through the second vertical interconnect structure; and forming a third vertical interconnect structure extending from the third bottom electrode, wherein the first, second, and third bottom electrodes are electrically connected to each other through the first and third vertical interconnect structures.

In accordance with some embodiments of the present disclosure, forming the third patterned structure includes: sequentially depositing a fifth dielectric layer, a third etch stop layer, and a sixth dielectric layer over the first top electrode layer; defining a third pattern on the sixth dielectric layer; and removing a portion of the sixth dielectric layer, a portion of the third etch stop layer, and a portion of the fifth dielectric layer to form a plurality of third pillars.

In accordance with some embodiments of the present disclosure, forming the third bottom electrode includes: depositing a third bottom electrode layer over the third patterned structure; filling a fifth dielectric filler in a third opening defined by two adjacent ones of the third pillars; and removing excess of the fifth dielectric filler and top portions of the third bottom electrode layer over the third pillars.

In accordance with some embodiments of the present disclosure, forming the third vertical interconnect structure including: filling a sixth dielectric filler in a third recess defined by the third top electrode layer; forming a third trench penetrating through the sixth dielectric filler, the third top electrode layer, and the third dielectric film to expose the third bottom electrode; and filling a metallic material in the third trench.

In accordance with some embodiments of the present disclosure, a stacked capacitor structure includes a first capacitor sub-structure over a substrate, wherein the first capacitor sub-structure includes a first bottom electrode, a first dielectric film over the first bottom electrode, a first top electrode layer over the first dielectric film, and a first vertical interconnect structure extending from the first bottom electrode; a second capacitor sub-structure over the first capacitor sub-structure, wherein the second capacitor sub-structure includes a second bottom electrode electrically connected to the first bottom electrode through the first vertical interconnect structure, a second dielectric film over the second bottom electrode, and a second top electrode layer over the second dielectric film; and a second vertical interconnect structure, wherein the second top electrode layer is electrically connected to the first top electrode layer through the second vertical interconnect structure.

In accordance with some embodiments of the present disclosure, the first dielectric film includes a first dielectric section over the first bottom electrode and a second dielectric section connected to the first dielectric section; the first top electrode layer includes a first top electrode over the first dielectric section and a first connecting section over the second dielectric section and connected to the first top electrode; the second dielectric film includes a third dielectric section over the second bottom electrode and a fourth dielectric section connected to the third dielectric section; the second top electrode layer includes a second top electrode over the third dielectric section and a second connecting section over the fourth dielectric section and connected to the second top electrode; and the second vertical interconnect structure extends from the first connecting section and penetrates through the fourth dielectric section and the second connecting section.

In accordance with some embodiments of the present disclosure, the stacked capacitor structure further includes at least one third capacitor sub-structure between the first and second capacitor sub-structure, wherein the at least one third capacitor sub-structure includes a third bottom electrode, a third dielectric film over the third bottom electrode, a third top electrode layer over the third dielectric film, and a third vertical interconnect structure extending from the third bottom electrode.

In accordance with some embodiments of the present disclosure, the first, second, and third bottom electrodes are electrically connected to each other through the first and third vertical interconnect structures.

In accordance with some embodiments of the present disclosure, the first, second, and third top electrode layers are electrically connected to each other through the second vertical interconnect structures.

In accordance with some embodiments of the present disclosure, the third dielectric film includes a fifth dielectric section over the third bottom electrode and a sixth dielectric section connected to the fifth dielectric section; the third top electrode layer includes a third top electrode over the fifth dielectric section and a third connecting section over the sixth dielectric section and connected to the third top electrode; and the second vertical interconnect structure further penetrates through the sixth dielectric section and the third connecting section.

In accordance with some embodiments of the present disclosure, each of the first, second, and third capacitor sub-structures further includes a dielectric layer; and an etch stop layer over the dielectric layer to define each of the first, second, and third bottom electrodes into a lower portion inserted in the dielectric layer and an upper portion extending away from the lower portion and penetrating through the etch stop layer, wherein a height ratio value of the lower portion to the upper portion of each of the first, second, and third bottom electrodes ranges from 3/7 to 7/3.

In accordance with some embodiments of the present disclosure, a stacked capacitor structure includes a first capacitor sub-structure over a substrate, wherein the first capacitor sub-structure includes a first bottom electrode, a first dielectric film over the first bottom electrode, a first top electrode over the first dielectric film, and a first vertical interconnect structure extending from the first bottom electrode; a second capacitor sub-structure over the first capacitor sub-structure, wherein the second capacitor sub-structure includes a second bottom electrode electrically connected to the first bottom electrode through the first vertical interconnect structure, a second dielectric film over the second bottom electrode, and a second top electrode over the second dielectric film; and a second vertical interconnect structure extending in a center portion of each of the first and second capacitor sub-structures, wherein the second top electrode is electrically connected to the first top electrode through the second vertical interconnect structure.

In accordance with some embodiments of the present disclosure, the stacked capacitor structure further includes at least one third capacitor sub-structure between the first and second capacitor sub-structures, wherein the at least one third capacitor sub-structure includes a third bottom electrode, a third dielectric film over the third bottom electrode, a third top electrode over the third dielectric film, and a third vertical interconnect structure extending from the third bottom electrode. The first, second, and third bottom electrodes are electrically connected to each other through the first and third vertical interconnect structures, and the second vertical interconnect structure extends in the center portion of each of the first capacitor sub-structure, the second capacitor sub-structure, and the at least one third capacitor sub-structure and the first, second, and third top electrodes are electrically connected to each other through the second vertical interconnect structure.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a stacked capacitor structure, comprising:
    forming a first patterned structure over a substrate;
    forming a first bottom electrode over the first patterned structure;
    depositing a first dielectric film over the first bottom electrode;
    depositing a first top electrode layer over the first dielectric film;
    forming a first vertical interconnect structure extending from the first bottom electrode;
    forming a second patterned structure over the first top electrode layer;
    forming a second bottom electrode over the second patterned structure, wherein the second bottom electrode is electrically connected to the first bottom electrode through the first vertical interconnect structure;
    depositing a second dielectric film over the second bottom electrode;
    depositing a second top electrode layer over the second dielectric film; and
    forming a second vertical interconnect structure extending from the first top electrode layer, wherein the second top electrode layer is electrically connected to the first top electrode layer through the second vertical interconnect structure.

2. The method according to claim 1, wherein forming the first patterned structure includes:
    sequentially depositing a first dielectric layer, a first etch stop layer, and a second dielectric layer over the substrate;
    defining a first pattern on the second dielectric layer; and
    removing a portion of the second dielectric layer, a portion of the first etch stop layer, and a portion of the first dielectric layer to form a plurality of first pillars.

3. The method according to claim 2, wherein forming the first bottom electrode includes:
    depositing a first bottom electrode layer over the first patterned structure;
    filling a first dielectric filler in a first opening defined by two adjacent ones of the plurality of first pillars; and
    removing excess of the first dielectric filler and top portions of the first bottom electrode layer over the plurality of first pillars.

4. The method according to claim 3, wherein forming the first vertical interconnect structure including:
    filling a second dielectric filler in a first recess defined by the first top electrode layer;
    forming a first trench penetrating through the second dielectric filler, the first top electrode layer, and the first dielectric film to expose the first bottom electrode; and
    filling a metallic material in the first trench.

5. The method according to claim 4, wherein forming the second patterned structure includes:
    sequentially depositing a third dielectric layer, a second etch stop layer, and a fourth dielectric layer over the first top electrode layer;
    defining a second pattern on the fourth dielectric layer; and
    removing a portion of the fourth dielectric layer, a portion of the second etch stop layer, and a portion of the third dielectric layer to form a plurality of second pillars.

6. The method according to claim 5, wherein forming the second bottom electrode includes:
    depositing a second bottom electrode layer over the second patterned structure;
    filling a third dielectric filler in a second opening defined by two adjacent ones of the plurality of second pillars; and
    removing excess of the third dielectric filler and top portions of the second bottom electrode layer over the plurality of second pillars.

7. The method according to claim 6, wherein forming the second vertical interconnect structure includes:
    filling a fourth dielectric filler in a second recess defined by the second top electrode layer;
    forming a second trench penetrating through the fourth dielectric filler, the second top electrode layer, the second dielectric film, the second etch stop layer, the third dielectric layer, and the second dielectric filler to expose the first top electrode layer; and filling a metallic material in the second trench.

8. The method according to claim 7, further comprising, prior to forming the second patterned structure over the first top electrode layer:

forming a third patterned structure over the first top electrode layer;

forming a third bottom electrode over the third patterned structure;

depositing a third dielectric film over the third bottom electrode;

depositing a third top electrode layer over the third dielectric film, wherein the first top electrode layer, the second top electrode layer, and the third top electrode layer are electrically connected to each other through the second vertical interconnect structure; and forming a third vertical interconnect structure extending from the third bottom electrode, wherein the first bottom electrode, the second bottom electrode, and the third bottom electrode are electrically connected to each other through the first vertical interconnect structure and the third vertical interconnect structure.

9. The method according to claim 8, wherein forming the third patterned structure includes:

sequentially depositing a fifth dielectric layer, a third etch stop layer, and a sixth dielectric layer over the first top electrode layer;

defining a third pattern on the sixth dielectric layer; and removing a portion of the sixth dielectric layer, a portion of the third etch stop layer, and a portion of the fifth dielectric layer to form a plurality of third pillars.

10. The method according to claim 9, wherein forming the third bottom electrode includes:

depositing a third bottom electrode layer over the third patterned structure;

filling a fifth dielectric filler in a third opening defined by two adjacent ones of the plurality of third pillars; and removing excess of the fifth dielectric filler and top portions of the third bottom electrode layer over the plurality of third pillars.

11. The method according to claim 10, wherein forming the third vertical interconnect structure including:

filling a sixth dielectric filler in a third recess defined by the third top electrode layer;

forming a third trench penetrating through the sixth dielectric filler, the third top electrode layer, and the third dielectric film to expose the third bottom electrode; and filling a metallic material in the third trench.

12. A method for manufacturing a stacked capacitor structure, comprising:

forming a first patterned structure over a substrate;

forming a first bottom electrode over the first patterned structure;

depositing a first dielectric film over the first bottom electrode;

depositing a first top electrode layer over the first dielectric film;

forming a first sidewall spacer and a first vertical interconnect structure which extend from the first bottom electrode, wherein the first vertical interconnect structure is isolated from the first top electrode layer by the first sidewall spacer;

forming a second patterned structure over the first top electrode layer;

forming a second bottom electrode over the second patterned structure, wherein the second bottom electrode is electrically connected to the first bottom electrode through the first vertical interconnect structure;

depositing a second dielectric film over the second bottom electrode;

depositing a second top electrode layer over the second dielectric film; and forming a second vertical interconnect structure extending from the first top electrode layer, wherein the second top electrode layer is electrically connected to the first top electrode layer through the second vertical interconnect structure.

13. The method according to claim 12, wherein forming the first bottom electrode includes:

depositing a first bottom electrode layer over the first patterned structure including a plurality of first pillars;

filling a first dielectric filler in a first opening defined by two adjacent ones of the plurality of first pillars; and removing excess of the first dielectric filler and top portions of the first bottom electrode layer over the plurality of first pillars.

14. The method according to claim 13, wherein forming the first sidewall spacer and the first vertical interconnect structure includes:

filling a second dielectric filler in a first recess defined by the first top electrode layer;

forming a first trench penetrating through the second dielectric filler, the first top electrode layer, and the first dielectric film to expose the first bottom electrode;

depositing a spacer layer and etching away horizontal portions of the spacer layer to form the first sidewall spacer laterally covering the second dielectric filler; and filling a metallic material in the first trench.

15. The method according to claim 14, wherein forming the second bottom electrode includes:

depositing a second bottom electrode layer over the second patterned structure including a plurality of second pillars;

filling a third dielectric filler in a second opening defined by two adjacent ones of the plurality of second pillars; and removing excess of the third dielectric filler and top portions of the second bottom electrode layer over the plurality of second pillars.

16. The method according to claim 15, further comprising, prior to forming the second patterned structure over the first top electrode layer:

forming a third patterned structure over the first top electrode layer;

forming a third bottom electrode over the third patterned structure;

depositing a third dielectric film over the third bottom electrode;

depositing a third top electrode layer over the third dielectric film, wherein the first top electrode layer, the second top electrode layer, and the third top electrode layer are electrically connected to each other through the second vertical interconnect structure; and forming a second sidewall spacer and a third vertical interconnect structure which extend from the third bottom electrode, wherein the first bottom electrode, the second bottom electrode, and the third bottom electrode are electrically connected to each other through the first vertical interconnect structure and the third vertical interconnect structure and wherein the third vertical interconnect structure is isolated from the third top electrode layer by the second sidewall spacer.

17. The method according to claim 16, wherein forming the third bottom electrode includes:
    depositing a third bottom electrode layer over the third patterned structure including a plurality of third pillars;
    filling a fourth dielectric filler in a third opening defined by two adjacent ones of the plurality of third pillars; and
    removing excess of the fourth dielectric filler and top portions of the third bottom electrode layer over the plurality of third pillars.

18. The method according to claim 17, wherein forming the second sidewall spacer and the third vertical interconnect structure includes:
    filling a fifth dielectric filler in a second recess defined by the third top electrode layer;
    forming a second trench penetrating through the fifth dielectric filler, the third top electrode layer, and the third dielectric film to expose the third bottom electrode;
    depositing a spacer layer and etching away horizontal portions of the spacer layer to form the second sidewall spacer laterally covering the fifth dielectric filler; and
    filling a metallic material in the second trench.

19. A method for manufacturing a stacked capacitor structure, comprising:
    forming a first patterned structure over a substrate;
    forming a first bottom electrode over the first patterned structure;
    depositing a first dielectric film over the first bottom electrode, wherein the first dielectric film includes a first dielectric section disposed on the first bottom electrode and a second dielectric section disposed over the first patterned structure and connected to the first dielectric section;
    depositing a first top electrode layer over the first dielectric film, wherein the first top electrode layer includes a first top electrode disposed on the first dielectric section and a first connecting section disposed on the second dielectric section and connected to the first top electrode;
    forming a first vertical interconnect structure extending from the first bottom electrode;
    forming a second patterned structure over the first top electrode layer;
    forming a second bottom electrode over the second patterned structure, wherein the second bottom electrode is electrically connected to the first bottom electrode through the first vertical interconnect structure;
    depositing a second dielectric film over the second bottom electrode, wherein the second dielectric film includes a third dielectric section disposed on the second bottom electrode and a fourth dielectric section disposed over the second patterned structure and connected to the third dielectric section;
    depositing a second top electrode layer over the second dielectric film, wherein the second top electrode layer includes a second top electrode disposed on the third dielectric section and a second connecting section disposed on the fourth dielectric section and connected to the second top electrode; and
    forming a second vertical interconnect structure extending from the first top electrode layer, wherein the second top electrode layer is electrically connected to the first top electrode layer through the second vertical interconnect structure.

20. The method according to claim 19, further comprising, prior to forming the second patterned structure over the first top electrode layer:
    forming a third patterned structure over the first top electrode layer;
    forming a third bottom electrode over the third patterned structure;
    depositing a third dielectric film over the third bottom electrode, wherein the third dielectric film includes a fifth dielectric section disposed on the third bottom electrode and a sixth dielectric section disposed over the third patterned structure and connected to the fifth dielectric section;
    depositing a third top electrode layer over the third dielectric film, wherein the third top electrode layer includes a third top electrode disposed on the fifth dielectric section and a third connecting section disposed on the sixth dielectric section and connected to the third top electrode, and wherein the first top electrode layer, the second top electrode layer, and the third top electrode layer are electrically connected to each other through the second vertical interconnect structure; and
    forming a third vertical interconnect structure extending from the third bottom electrode, wherein the first bottom electrode, the second bottom electrode, and the third bottom electrode are electrically connected to each other through the first vertical interconnect structure and the third vertical interconnect structure.

* * * * *